US010797188B2

(12) United States Patent
Chu

(10) Patent No.: US 10,797,188 B2
(45) Date of Patent: Oct. 6, 2020

(54) OPTICAL SEMICONDUCTOR STRUCTURE FOR EMITTING LIGHT THROUGH APERTURE

(71) Applicant: HIPHOTON CO., LTD, Hsinchu (TW)

(72) Inventor: Chen-Fu Chu, Hsinchu (TW)

( * ) Notice: Subject to any disclaimer, the term of this patent is extended or adjusted under 35 U.S.C. 154(b) by 467 days.

(21) Appl. No.: 14/867,675

(22) Filed: Sep. 28, 2015

(65) Prior Publication Data

US 2016/0020353 A1    Jan. 21, 2016

Related U.S. Application Data

(63) Continuation-in-part of application No. 14/720,316, filed on May 22, 2015, and a continuation-in-part of
(Continued)

(51) Int. Cl.
| | |
|---|---|
| *H01L 31/0232* | (2014.01) |
| *H01L 23/00* | (2006.01) |
| *H01L 27/15* | (2006.01) |
| *H01L 31/103* | (2006.01) |
| *H01L 33/46* | (2010.01) |
| *H01L 33/60* | (2010.01) |
| *H01L 33/58* | (2010.01) |
| *H01L 33/62* | (2010.01) |

(Continued)

(52) U.S. Cl.
CPC ........ *H01L 31/02327* (2013.01); *H01L 24/97* (2013.01); *H01L 27/153* (2013.01); *H01L 31/1035* (2013.01); *H01L 25/167* (2013.01); *H01L 33/44* (2013.01); *H01L 33/46* (2013.01); *H01L 33/58* (2013.01); *H01L 33/60* (2013.01); *H01L 33/62* (2013.01); *H01L 2224/16225* (2013.01); *H01L 2924/181* (2013.01)

(58) Field of Classification Search
CPC .......... H01L 31/02327; H01L 31/1035; H01L 27/153; H01L 24/97; H01L 33/60; H01L 33/58; H01L 33/62; H01L 33/46; H01L 25/167; H01L 2224/16225; H01L 33/44; H01L 2924/181
See application file for complete search history.

(56) References Cited

U.S. PATENT DOCUMENTS

| | | | | |
|---|---|---|---|---|
| 8,890,194 B2* | 11/2014 | Gotoda | ................... | H01L 33/32 257/98 |
| 9,099,610 B2* | 8/2015 | Moon | ..................... | H01L 33/02 |

(Continued)

*Primary Examiner* — Mohammad M Hoque
(74) *Attorney, Agent, or Firm* — Jongkook Park

(57) ABSTRACT

The invention discloses a semiconductor structure, processing light signal, the semiconductor structure comprising: a first type semiconductor layer; a second type semiconductor layer; an active layer located between the first type semiconductor layer and the second type semiconductor layer; a reflector covered surfaces of the first type semiconductor layer and the second type semiconductor layer; a first pad disposed on a top surface of the reflector which is covered the first type semiconductor layer; a second pad disposed on the top surface of the reflector or second type semiconductor layer; an aperture disposed on the top surface of the first type semiconductor layer and passed through the reflector; and a light collection module disposed around the aperture or covered a top surface of the reflector.

20 Claims, 68 Drawing Sheets

Related U.S. Application Data application No. 14/738,490, filed on Jun. 12, 2015, now Pat. No. 9,831,387.

(60) Provisional application No. 62/009,250, filed on Jun. 8, 2014, provisional application No. 62/002,851, filed on May 24, 2014, provisional application No. 62/012,281, filed on Jun. 14, 2014, provisional application No. 62/013,503, filed on Jun. 17, 2014, provisional application No. 62/077,329, filed on Nov. 10, 2014, provisional application No. 62/198,371, filed on Jul. 29, 2015.

(51) Int. Cl.
*H01L 33/44* (2010.01)
*H01L 25/16* (2006.01)

(56) References Cited

U.S. PATENT DOCUMENTS

| | | | |
|---|---|---|---|
| 9,136,425 B2* | 9/2015 | Tajima | H01L 33/0025 |
| 9,136,432 B2* | 9/2015 | Yun | H01L 33/14 |
| 9,530,937 B2* | 12/2016 | Jeong | H01L 33/405 |
| 2003/0031221 A1* | 2/2003 | Wang | H01S 5/18366 |
| | | | 372/45.01 |
| 2007/0023769 A1* | 2/2007 | Nishimoto | F21K 9/00 |
| | | | 257/88 |
| 2008/0308832 A1* | 12/2008 | Hsieh | H01L 33/44 |
| | | | 257/98 |
| 2010/0065861 A1* | 3/2010 | Nagai | H01L 25/0753 |
| | | | 257/88 |
| 2011/0220932 A1* | 9/2011 | Katsuno | H01L 33/382 |
| | | | 257/98 |
| 2011/0260192 A1* | 10/2011 | Kwak | H01L 33/56 |
| | | | 257/98 |
| 2011/0297972 A1* | 12/2011 | Seo | H01L 25/0753 |
| | | | 257/88 |
| 2012/0007121 A1* | 1/2012 | Lee | H01L 33/382 |
| | | | 257/98 |
| 2012/0012869 A1* | 1/2012 | Song | G02B 6/0073 |
| | | | 257/91 |
| 2012/0119243 A1* | 5/2012 | Kim | H01L 33/38 |
| | | | 257/98 |
| 2012/0199861 A1* | 8/2012 | Tsuji | H01L 33/405 |
| | | | 257/98 |
| 2013/0069095 A1* | 3/2013 | Hodota | H01L 33/42 |
| | | | 257/98 |
| 2013/0277700 A1* | 10/2013 | Matsumura | H01L 33/50 |
| | | | 257/98 |
| 2014/0061702 A1* | 3/2014 | Yamamoto | H01L 33/405 |
| | | | 257/98 |
| 2014/0252390 A1* | 9/2014 | Yoon | H01L 33/60 |
| | | | 257/98 |
| 2014/0291714 A1* | 10/2014 | Jeon | H01L 33/46 |
| | | | 257/98 |
| 2014/0300267 A1* | 10/2014 | Oh | H01L 33/60 |
| | | | 313/46 |
| 2014/0367722 A1* | 12/2014 | Im | H01L 33/0079 |
| | | | 257/98 |
| 2016/0005941 A1* | 1/2016 | Tsai | H01L 33/62 |
| | | | 257/98 |

\* cited by examiner

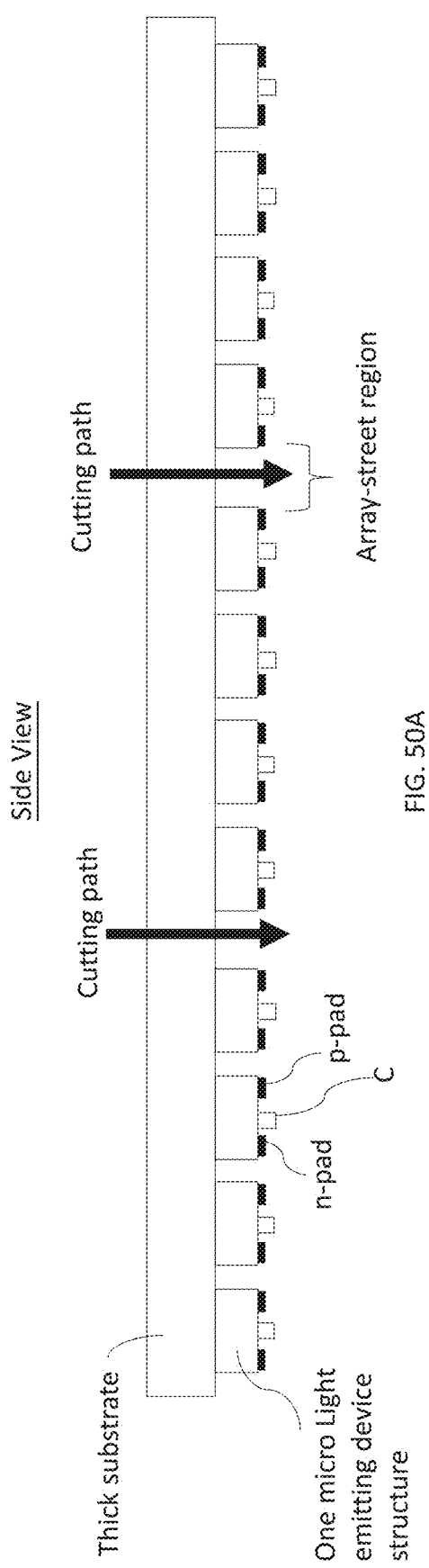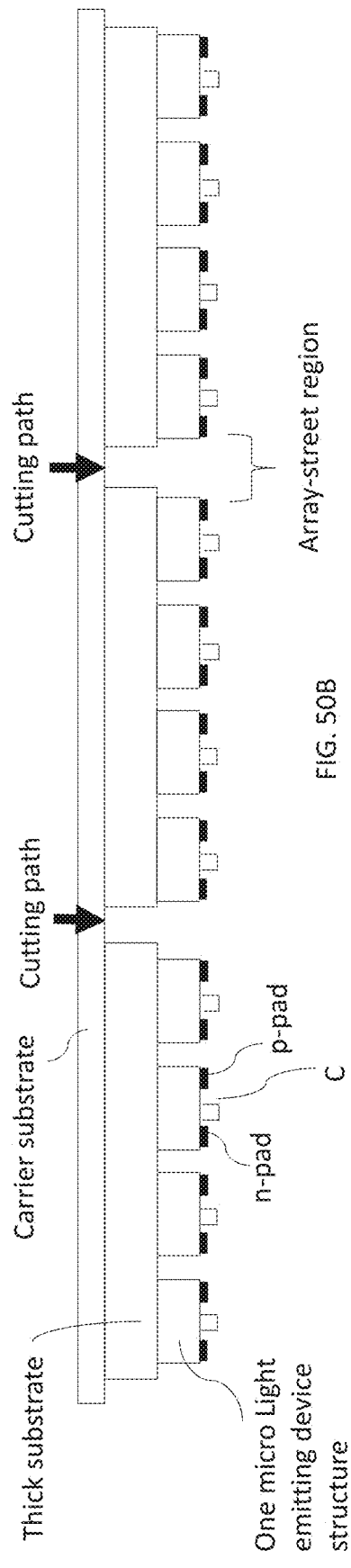
FIG. 50A
FIG. 50B

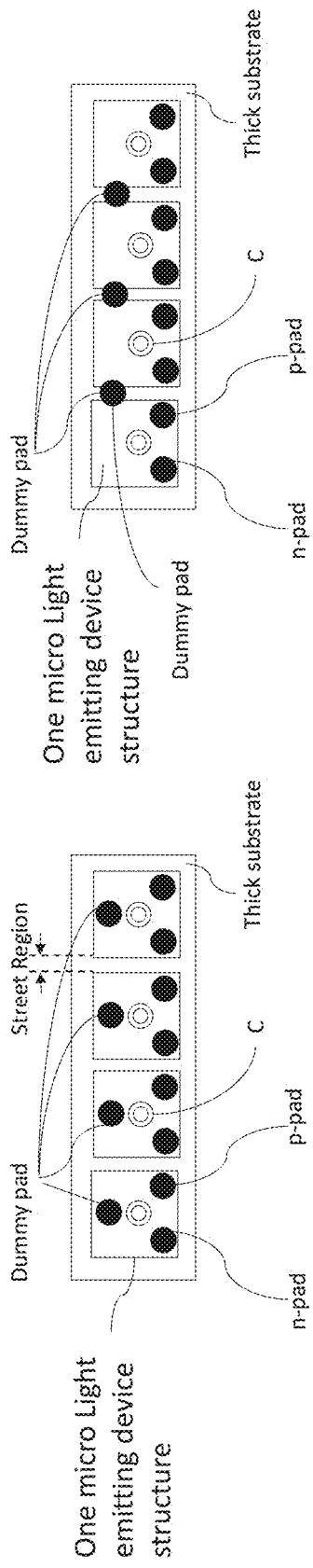
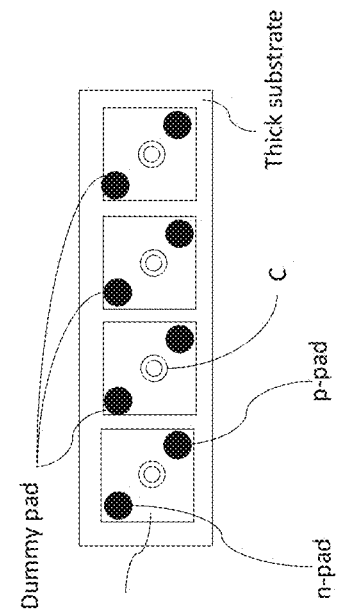
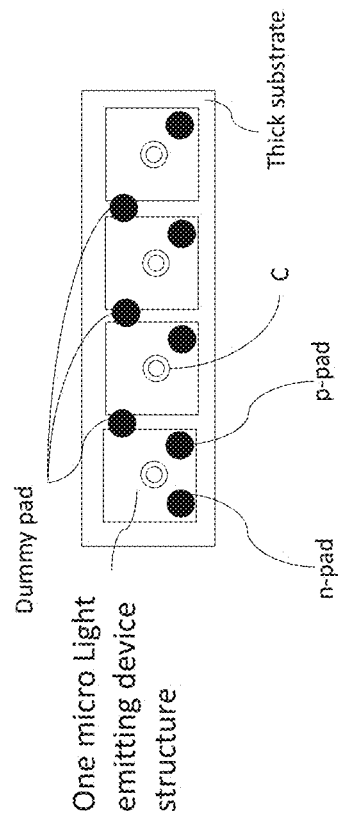
FIG. 51A
FIG. 51B
FIG. 51C
FIG. 51D

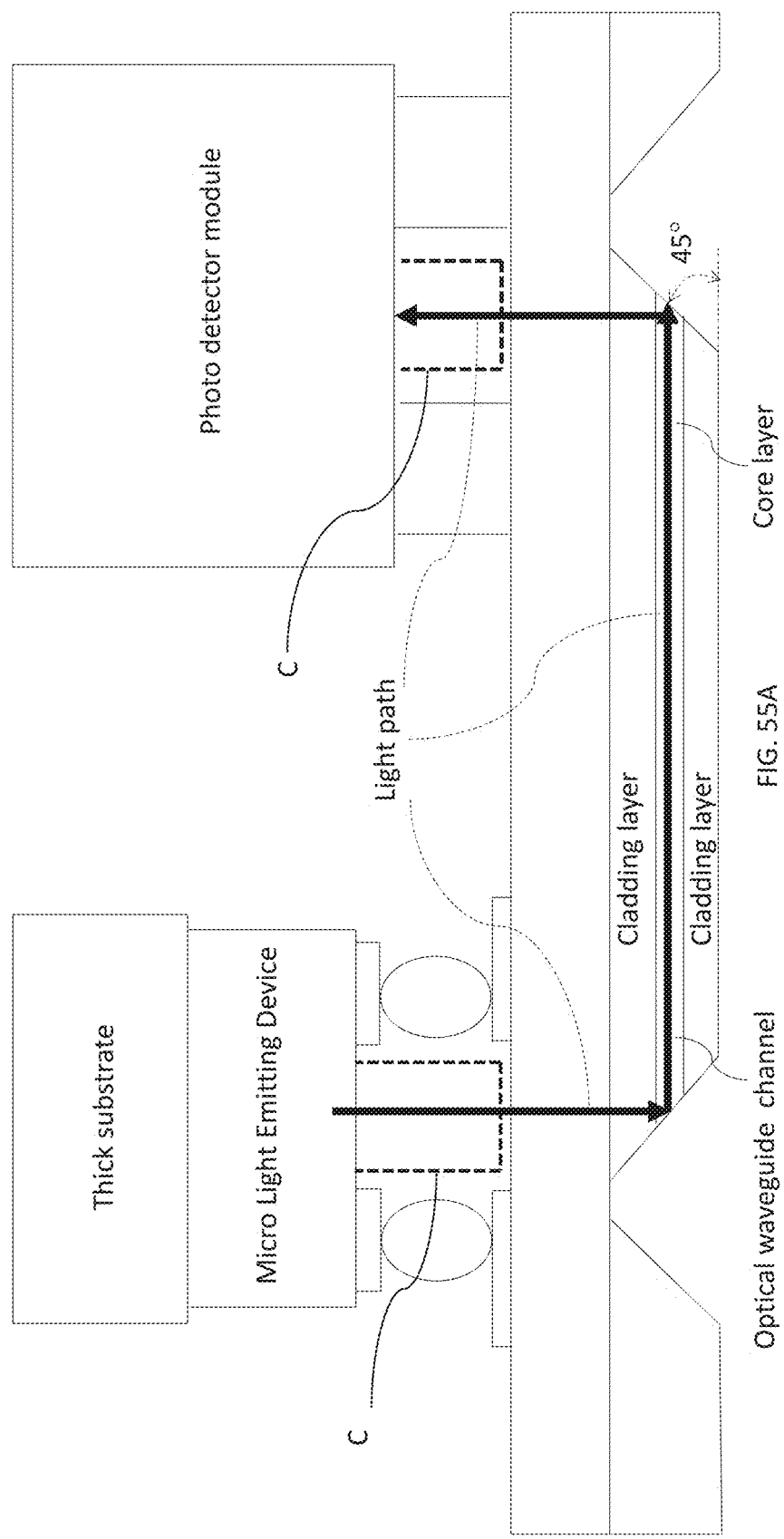

OPTICAL SEMICONDUCTOR STRUCTURE FOR EMITTING LIGHT THROUGH APERTURE

This application is a Continuation-in-Part of co-pending application Ser. No. 14/720,316, filed on 22 May 2015, for which priority is claimed under 35 U.S.C. § 120, which claims benefit of U.S. provisional applications No. 62/009,251 filed on Jun. 8, 2014, No. 62/009,250 filed on Jun. 8, 2014 and 62/002,851 filed on May 24, 2014, under 35 U.S.C. § 119(e); and this application is a Continuation-in-Part of co-pending application Ser. No. 14/738,490, filed on 12 Jun. 2015, for which priority is claimed under 35 U.S.C. § 120, which claims benefit of U.S. provisional applications No. 62/012,281 filed on Jun. 14, 2014, No. 62/013,503 filed on Jun. 17, 2014 and No. 62/077,329 filed on Nov. 10, 2014 under 35 U.S.C. § 119(e); and this application claims priority of U.S. Provisional Application No. 62/198,371 filed on 29 Jul. 2015 under 35 U.S.C. § 119(e), the entire contents of which are hereby incorporated by reference.

BACKGROUND OF THE INVENTION

Field of the Invention

This invention relates the field of a semiconductor structure, and more particularly to a structure processes light.

Related Art

Optical interconnect is a way of communication by optical cables. Compared to traditional cables, optical fibers are capable of a much higher bandwidth, from 10 Gbit/s up to 100 Gbit/s. The technology is currently being introduced as a way to link computers to mobile devices, as well as on motherboards and devices within computers. The well-known technologies of providing light source in optical interconnection devices are fabricated by laser or vertical cavity surface emitting laser (VCSEL). Recently, for short distance optical interconnection data transitive, the VCSEL light source is considerate to be replaced by Light emitting device such as light emitting diode (LED), Resonant cavity LED or simplified lasers for cost reduction purpose. In addition, a less light loss of the optical signal transitive module is also considerate to form a simplified waveguide channel for short distance data communication. The low cost high speed short distance data communication or the short distance high optical quality transitive module can be applied many consumable electronic devices such as USB drive, high quality image connector, hard disc drive connection, and electronic devices interconnection.

SUMMARY OF THE INVENTION

The invention discloses a semiconductor structure, processing light signal, the semiconductor structure comprising: a first type semiconductor layer; a second type semiconductor layer; an active layer located between the first type semiconductor layer and the second type semiconductor layer; a reflector covered surfaces of the first type semiconductor layer and the second type semiconductor layer; a first pad disposed on a top surface of the reflector which is covered the first type semiconductor layer; a second pad disposed on the top surface of the reflector or second type semiconductor layer; and a reflector layer having an aperture allowing light pass through and disposed on the top surface of the first type semiconductor layer and passed through the reflector; and a light collection module around the aperture area is on a top surface of the reflector; wherein, the first type semiconductor layer and the second type semiconductor layer form a PN junction in the active layer; the first pad couples to the first type semiconductor layer; the second pad couples to the second type semiconductor layer; and the light collection module is used to guide light signal in a direction.

BRIEF DESCRIPTION OF THE DRAWINGS

FIG. 1A is a scheme diagram of cross section structure of middle of FIG. 1.

FIG. 2A is a scheme diagram of cross section structure of middle of FIG. 2.

FIG. 3A is a scheme diagram of cross section structure of middle of FIG. 3.

FIG. 4A is a scheme diagram of cross section structure of middle of FIG. 4.

FIG. 50A is a side view example of multiple 1×4 semiconductor structures modules underneath a thick substrate.

FIG. 50B is another side view example of multiple 1×4 semiconductor structures modules underneath a thick substrate.

FIG. 51A is one embodiment of a backside view of the 1×4 semiconductor structures module.

FIG. 51B is the dummy pad on top site in the street region and optional cover neighbor two micro light emitting device.

FIG. 51C is the backside view of a common cathode type semiconductor structure.

FIG. 51D is another one backside view of a common cathode type semiconductor structure.

FIG. 55A illustrates another additional light collection module could be option formed underneath of the photo detector module.

DETAILED DESCRIPTION OF THE INVENTION

Figure 1:
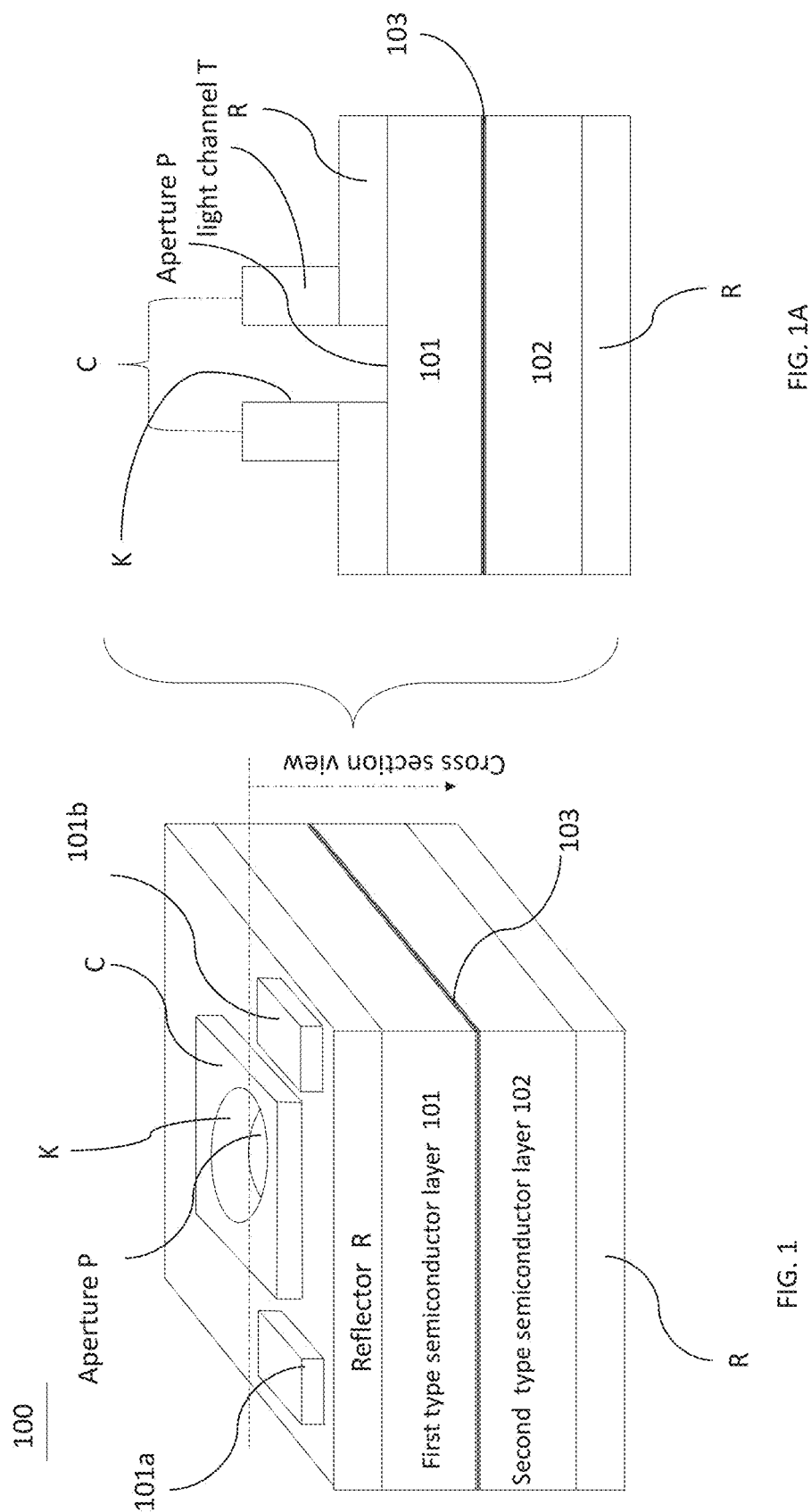
FIG. 1 is a schematic view showing a semiconductor structure according to an embodiment of the invention.

Please refer to FIGS. 1 and 1A. FIG. 1 is a schematic view showing a semiconductor structure according to an embodiment of the invention; and FIG. 1A is a scheme diagram of cross section structure of middle of FIG. 1. A semiconductor structure 100 is used to process light signal, the semiconductor structure 100 comprising: a first type semiconductor layer 101; a second type semiconductor layer 102; an active layer 103 located between the first type semiconductor layer 101 and the second type semiconductor layer 102; a reflectors R covered surfaces of the first type semiconductor layer 101 and the second type semiconductor layer 102.

Moreover, a first pad 101a disposed on a top surface of the reflector R which is covered the first type semiconductor layer 101; a second pad 102a disposed on the top surface of the reflector R. The second pad 102a optional disposed on the second type semiconductor layer 102. The second pad 102a optional disposed on both the top surface of the reflector R and the second type semiconductor 102; and an aperture P disposed on the top surface of the first type semiconductor layer and passed through the reflector R; and a light collection module C around the aperture P is covered a top surface of reflector R. Wherein, the first type semiconductor layer 101 and the second type semiconductor layer 102 form a PN junction in the active layer 103; the first pad 101a couples to the first type semiconductor layer 101; the second pad 102a couples to the second type semiconductor layer 102; and the light collection module C is used to guide light in a direction.

In this embodiment, the light collection module C has an aperture P. The light collection module C disposed around the aperture P and covered on top surface of the reflector R. Light collection module C guided light which is reflected from the reflectors R or the active layer 103.

Pads 101a and 101b are used to fix the semiconductor structure 100. When the semiconductor structure 100 couples to a backend circuit, pad 101a and pad 101b will avoid to make the semiconductor structure 100 moving.

In this embodiment, a top reflector could be formed on top of the first type semiconductor layer 101 and open a small portion region as aperture P. A bottom reflector could be formed on the second type semiconductor layer 102. A light collection module C could be formed around the aperture P to collect and guide the output light. Wherein, the height of pad 101a or pad 101b is as same as the height of light collection module C. In another aspect, the height of pad 101a or 101b could be almost same height compared to the height of light collection module C.

Figure 2:
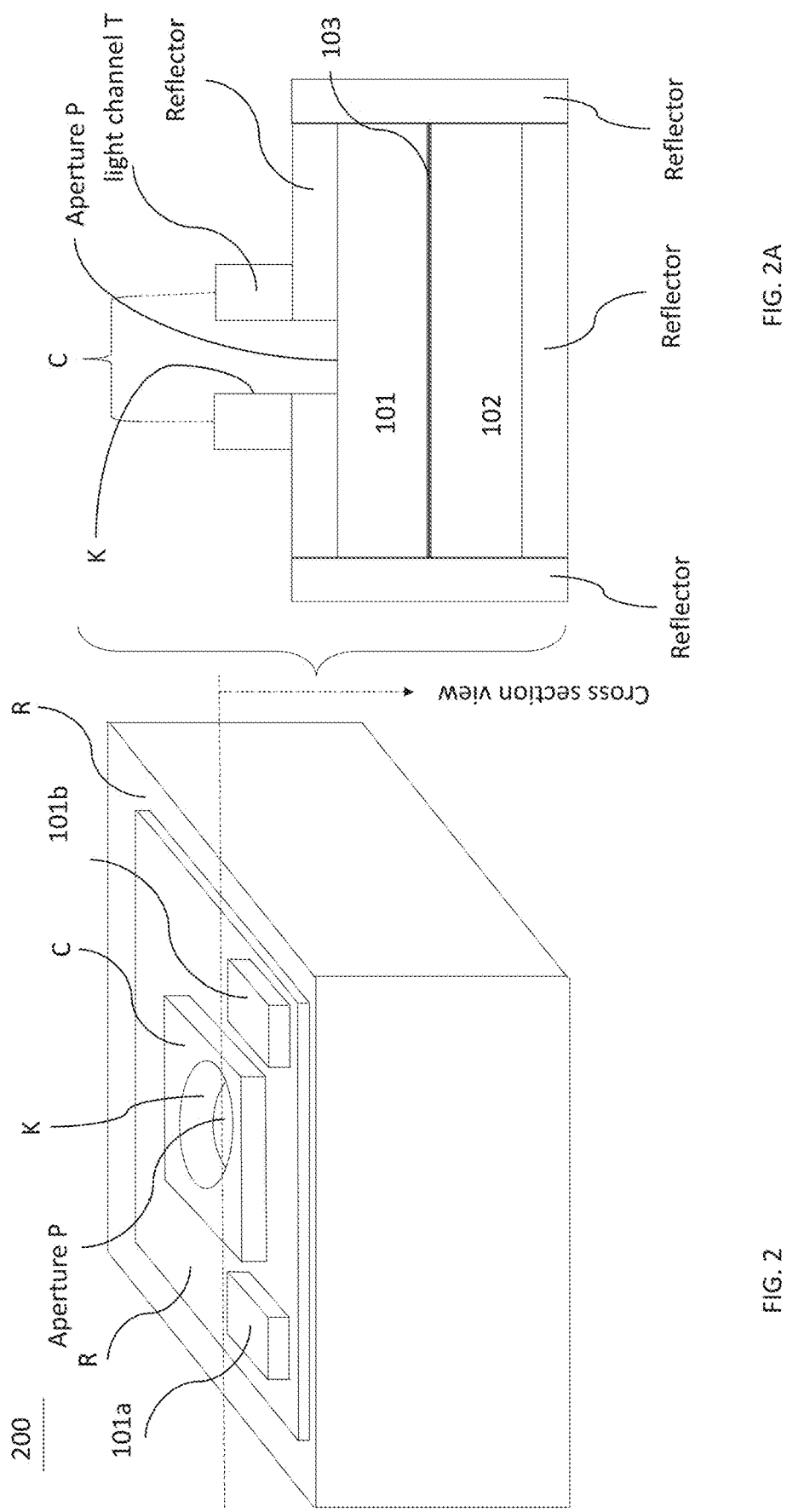
FIG. 2 is a schematic view showing a semiconductor structure according to an embodiment of the invention.

Please refer to FIGS. 2 and 2A. FIG. 2 is a schematic view showing a semiconductor structure 200 according to an embodiment of the invention; and FIG. 2A is a scheme diagram of cross section structure of middle of FIG. 2. It should be noted that, the difference between the semiconductor structures 200 and 100 resides in that reflector R further covers all the surface of first type semiconductor layer 101 and second type semiconductor layer 102.

In this embodiment, a top reflector could be formed on top of the first type semiconductor layer 101 and open a small portion region as aperture P. A bottom reflector could be formed on the second type semiconductor layer 102. A light collection module C could be formed around the aperture P to collect and guide the output light. A reflection layer could be formed around the whole edges of the micro light emitting device.

In FIG. 1 and FIG. 2, the light collection module C could be a light channel, an angle-selective multiple dielectric layers, a micro lens. The reflection layers could be metal layers, or a DBR layers, or a resonant cavity structure, or combination layers of isolation layer and metal reflection layer. It should be noted that, the difference between the semiconductor structures 200 and 100 resides in that reflector R further covers all the surface of first semiconductor layer 101 and second semiconductor layer 102.

Figure 3:
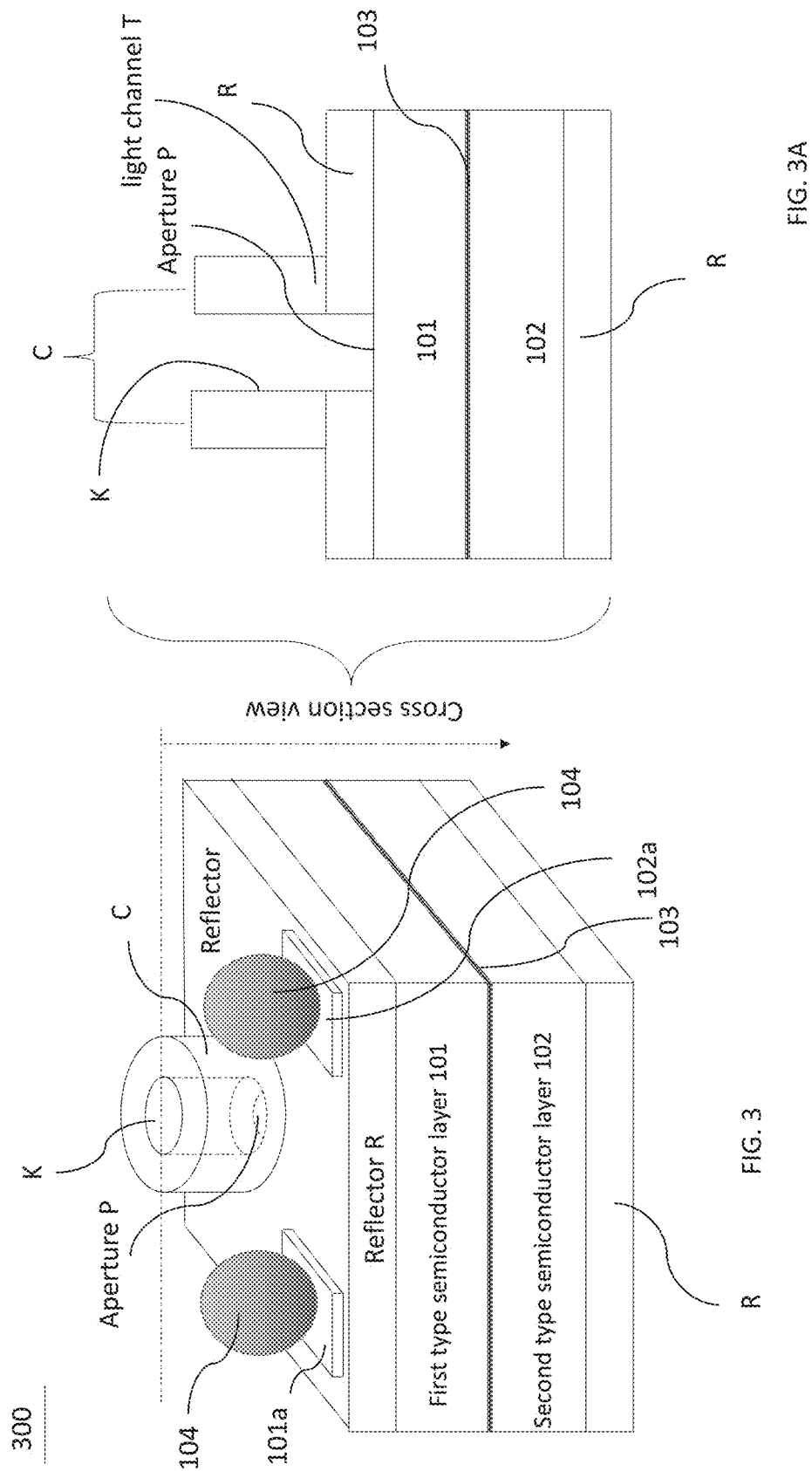
FIG. 3 is a schematic view showing a semiconductor structure according to an embodiment of the invention.

Please refer to FIGS. 3 and 3A. FIG. 3 is a schematic view showing a semiconductor structure 300 according to an embodiment of the invention; and FIG. 3A is a scheme diagram of cross section structure of middle of FIG. 3. It should be note that, the difference between the semiconductor structures 300 and 100 resides in that semiconductor structure 300 further comprises bumps 104. Wherein, bumps 104 disposed on pad 101a and pad 101b. When the semiconductor structure 300 couples to a backend circuit, bumps 104 will avoid to make the semiconductor structure 100 moving. Wherein, the height of bumps 104 is as same as the height of light collection module C. In another aspect, the height of bumps 104 could be almost same height compared to the height of light collection module C.

Figure 4:
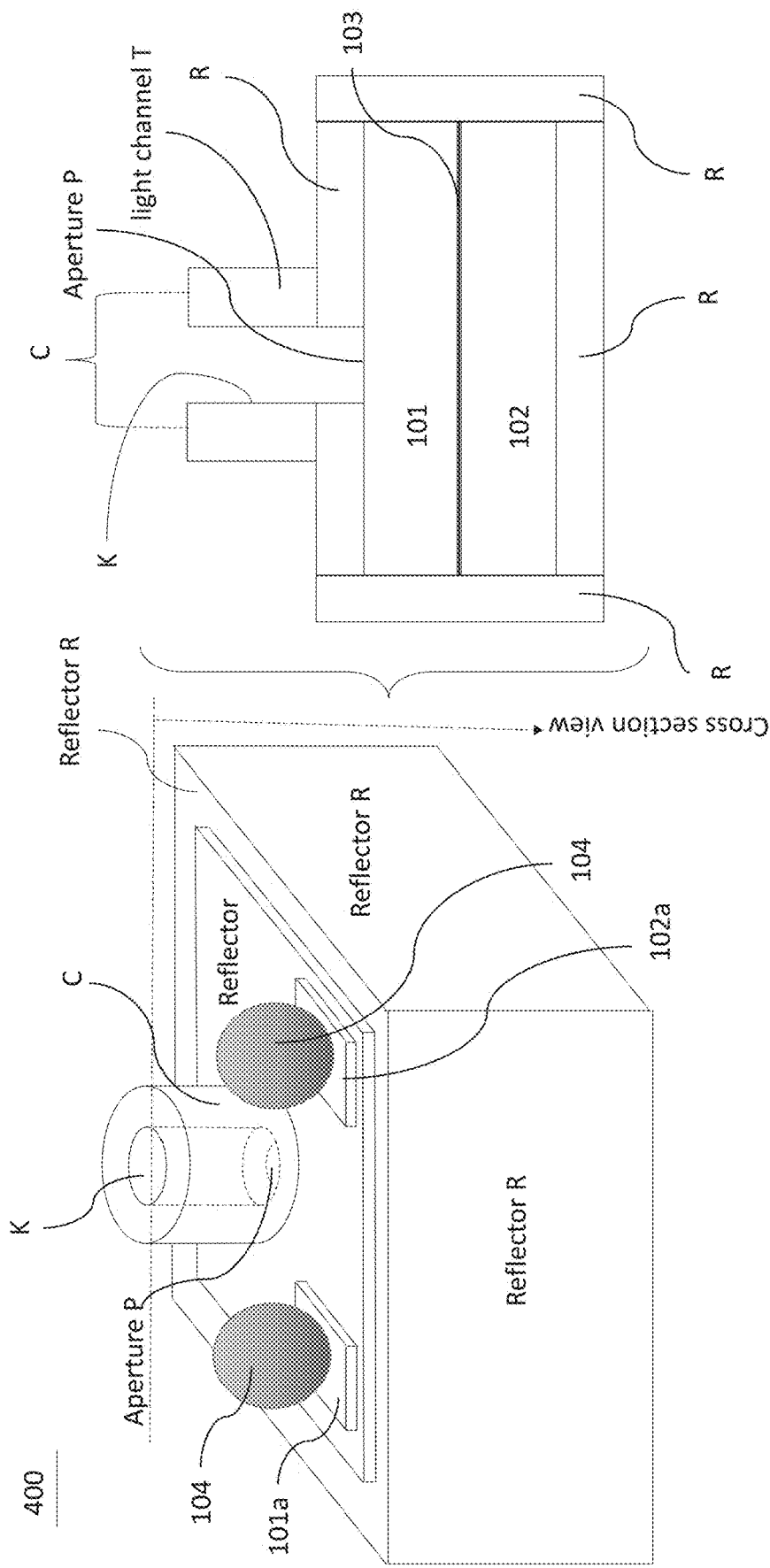
FIG. 4 is a schematic view showing a semiconductor structure according to an embodiment of the invention.

Please refer to FIGS. 4 and 4A. FIG. 4 is a schematic view showing a semiconductor structure 400 according to an embodiment of the invention; and FIG. 4A is a scheme diagram of cross section structure of middle of FIG. 4. It should be noted that, the difference between the semiconductor structures 400 and 300 resides in that reflector R further covers all the surface of first semiconductor layer 101 and second semiconductor layer 102.

As mentioned hereinabove, referring to FIG. 1 to FIG. 4, and referring to FIG. 1A to FIG. 4A, the light collection module C further comprises: a light channel T which has an inner wall K. Wherein, the inner wall K coated a reflective material to reflect or guide light in a direction.

It should be noted that, the height of the light channel T could be higher than that of the pads, and bumps. The higher height of the light channel T is purposed to connect with other light channel. The light could get focus and conveys inside the light channel T. The light channel T as a dams could guide the light from the light emitting device to a target position for any required purpose. For example in display application, the other light channel T' composes a wavelength converter in the light channel T'. After connecting the light channel T and the light channel T', the light from an aperture of a micro light emitting device could be converted from a first wavelength to a second wavelength. For another example, the light channel T' could be another longer distance light channel for a light to transitive. After connecting the light channel T and the light channel T', the light from an aperture of a micro light emitting device could be transitive through the light channel T and light channel T' to any target position.

Figure 5:
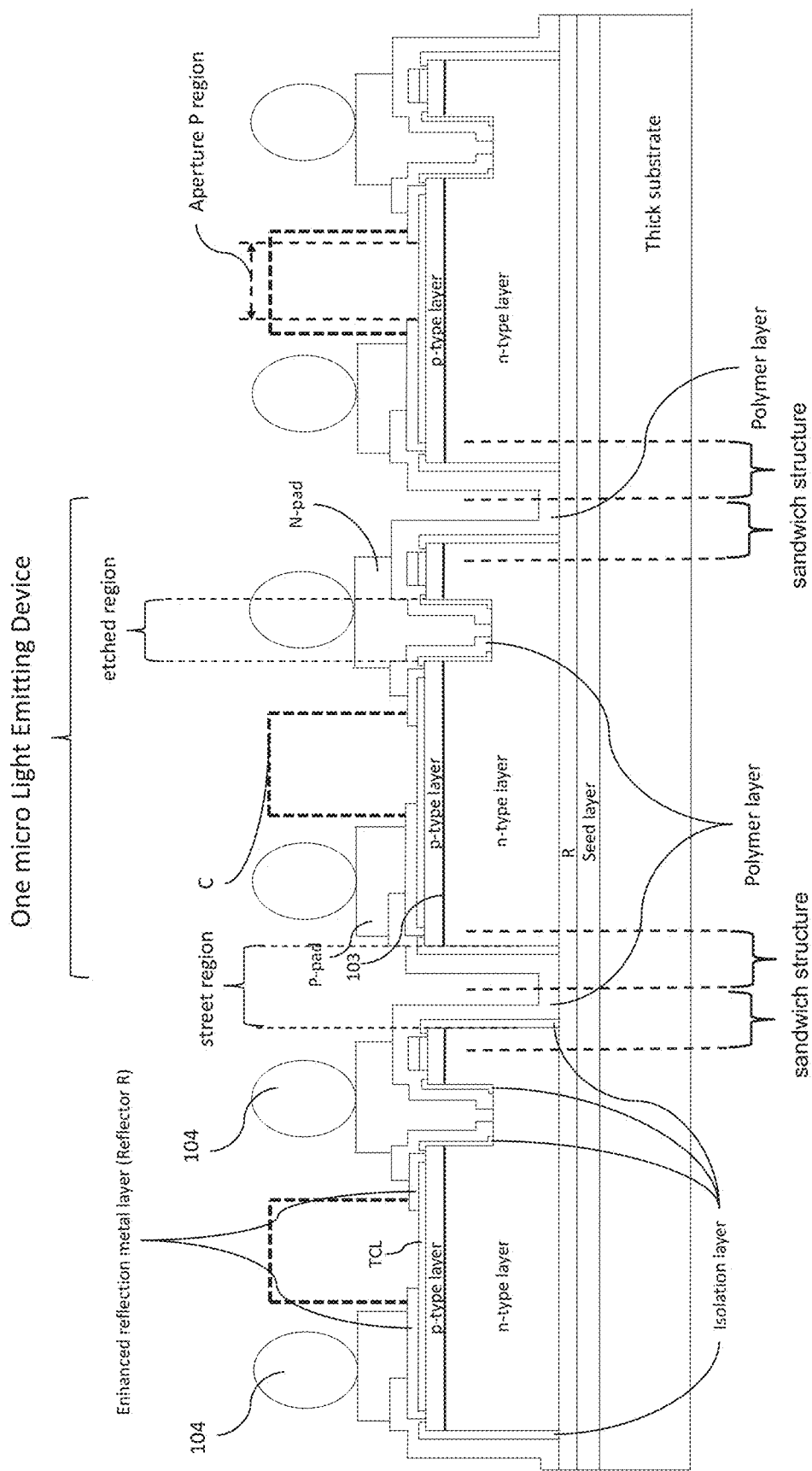
FIG. 5 is the scheme cross section structure of a horizontal current type multiple semiconductor structures on a thick substrate.

Please refer to FIG. 5, FIG. 5 shows the scheme cross section structure of a horizontal current type of multiple semiconductor structures according to an embodiment of the invention.

In this embodiment, first type semiconductor layer 101 is satisfied by a p-type layer; second type semiconductor layer 102 is satisfied by an n-type layer (or initial growth epi layer); the pad 101a is satisfied by a p-pad; the pad 102a is satisfied by an n-pad; and the reflector R is satisfied by an enhanced reflection metal layer. The reflector R and a seed layer formed on top of the thick substrate. A direct bandgap light emitting device epitaxy structure consists an initial growth epi layer (n-type layer), an active layer 103, and a p-type layer. The n-type layer disposed on the reflector R.

For the micro light emitting device, a transparent contact layer (TCL) is disposed on a portion of p-type layer, an enhanced reflection metal layer is formed on top of a portion of the TCL, and an isolation layer covers on the edge of each micro light emitting device in the street region. A portion of the p-type layer, the active layer 103 and n-type layer in one micro light emitting device region is removed to expose the n-type layer in the etched region. The isolation layer also covers the edge of the etched region and a portion of the p-type layer. A polymer layer covered a portion of the enhanced reflection metal layer, the TCL, p-type layer, and the isolation layer. The polymer also covers the isolation layer and the entire street region to form the polymer layer and the semiconductor layers sandwich to the isolation layer structure. The polymer layer also option covers the sidewall isolation layer in etched region and exposed the etched n-type layer. In the street region, the polymer and the micro light emitting device sandwich to the isolation layer to strengthen the micro light emitting device array structure. An aperture P region on a portion of the top TCL is formed to emit the output light. A light collection module C formed around the aperture P region to collect the output light. The micro light emitting device structure also consists a p-pad on a portion of top enhanced reflection metal layer. An n-pad is on the exposed n-type layer of the etched region to form an n-type contact. The n-pad is also on a portion of top the polymer layer. Bumps 104 (bonding material) disposed on the p-pads and n-pads to each one micro light emitting device.

Figure 6:
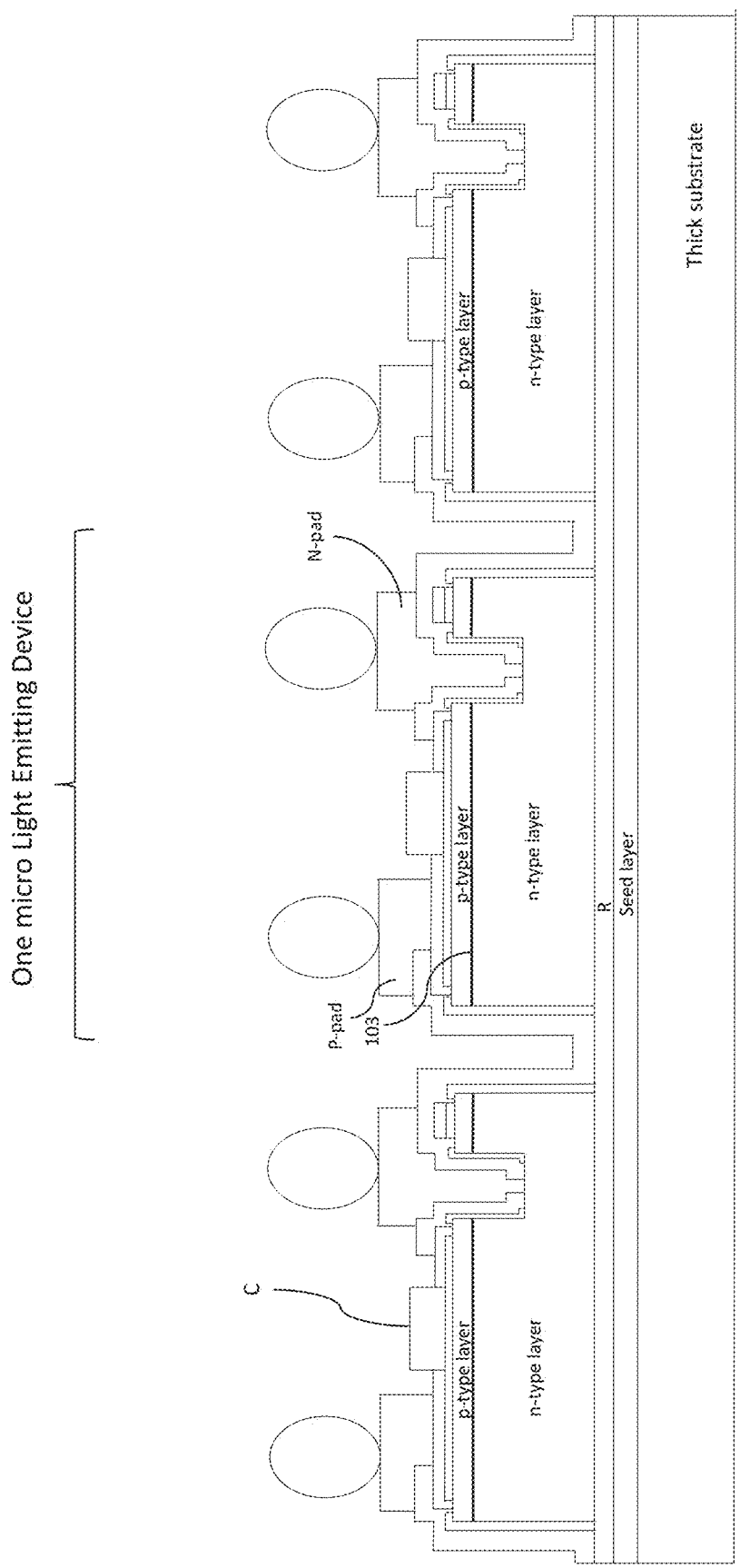
FIG. 6 is a scheme diagram about a light collection module according to an embodiment of FIG. 5.

In one embodiment, FIG. 6 is a scheme diagram about a light collection module C according to an embodiment of FIG. 5. The light collection module C is satisfied by a micro lens. The micro lens disposed on top of the aperture region to refract output light of the aperture. The output light could be focus on a target point to collimate the light to a 45 degree reflector in an optical interconnection substrate (not shown in here). The 45 degree reflector could reflect the focus light into an optical waveguide channel. In another aspect, the light collection module C could be an angle-selective filters to reduce the divergence angle of the light emitted from the aperture P. In another aspect, the light collection module C could be a distributed Bragg reflector (DBR) structure or a resonant cavity structure to select the optical wavelength and light angle.

Figure 7:
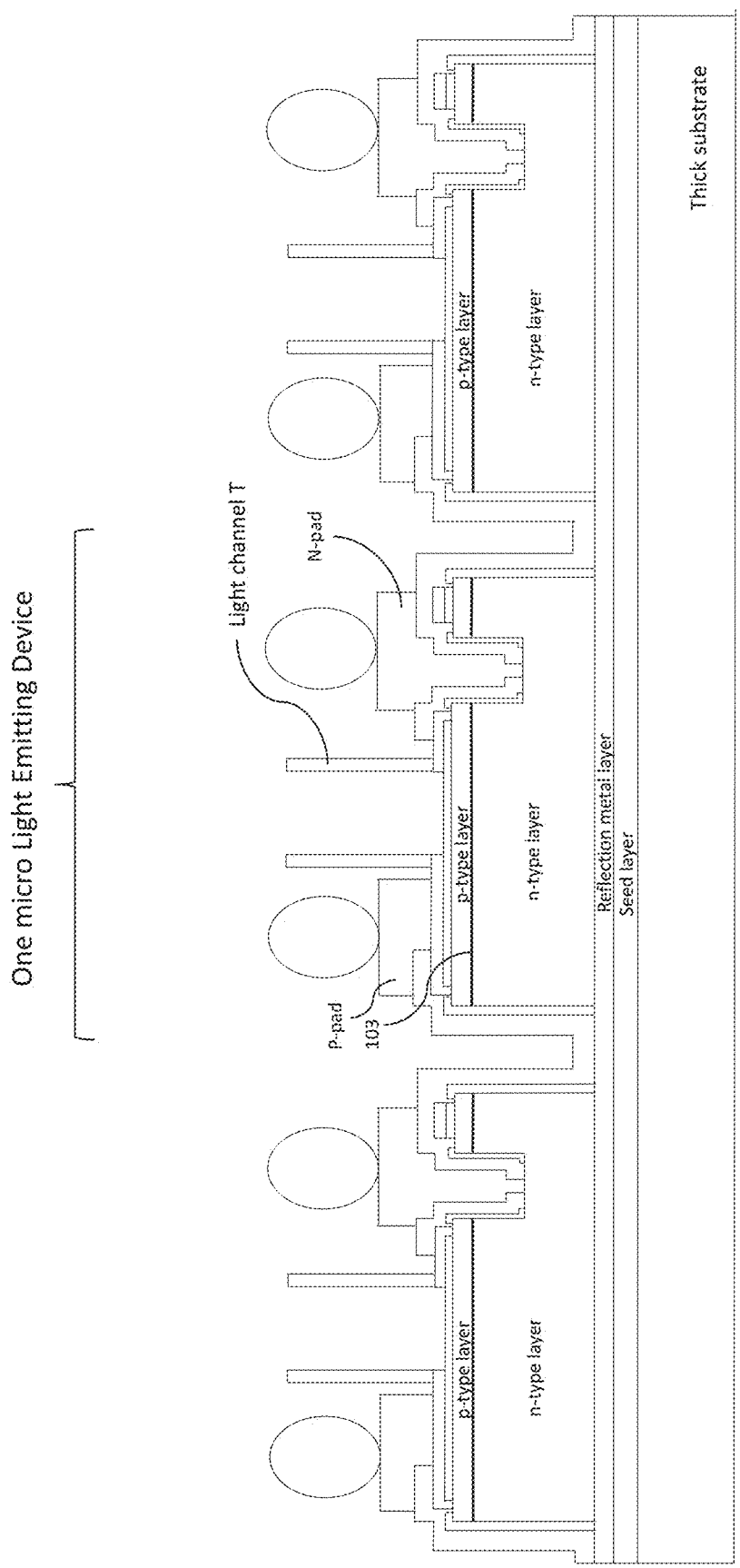
FIG. 7 is a light channel as the light collection module of FIG. 5.

In another one embodiment, FIG. 7 is a scheme diagram about a light collection module according to an embodiment of FIG. 5. The light collection module C is satisfied by a light channel T. The light channel T could be formed on top of the enhanced reflection metal layer around the aperture P region. Please note that the light channel T could be also around the aperture P region selected to form on the TCL. In addition, the light channel T could be also around the aperture P region formed on a portion of the enhanced reflection metal layer and a portion of the TCL. Moreover, the light channel T has an inner wall. In this embodiment, the inner wall coated a reflective material.

Figure 8:
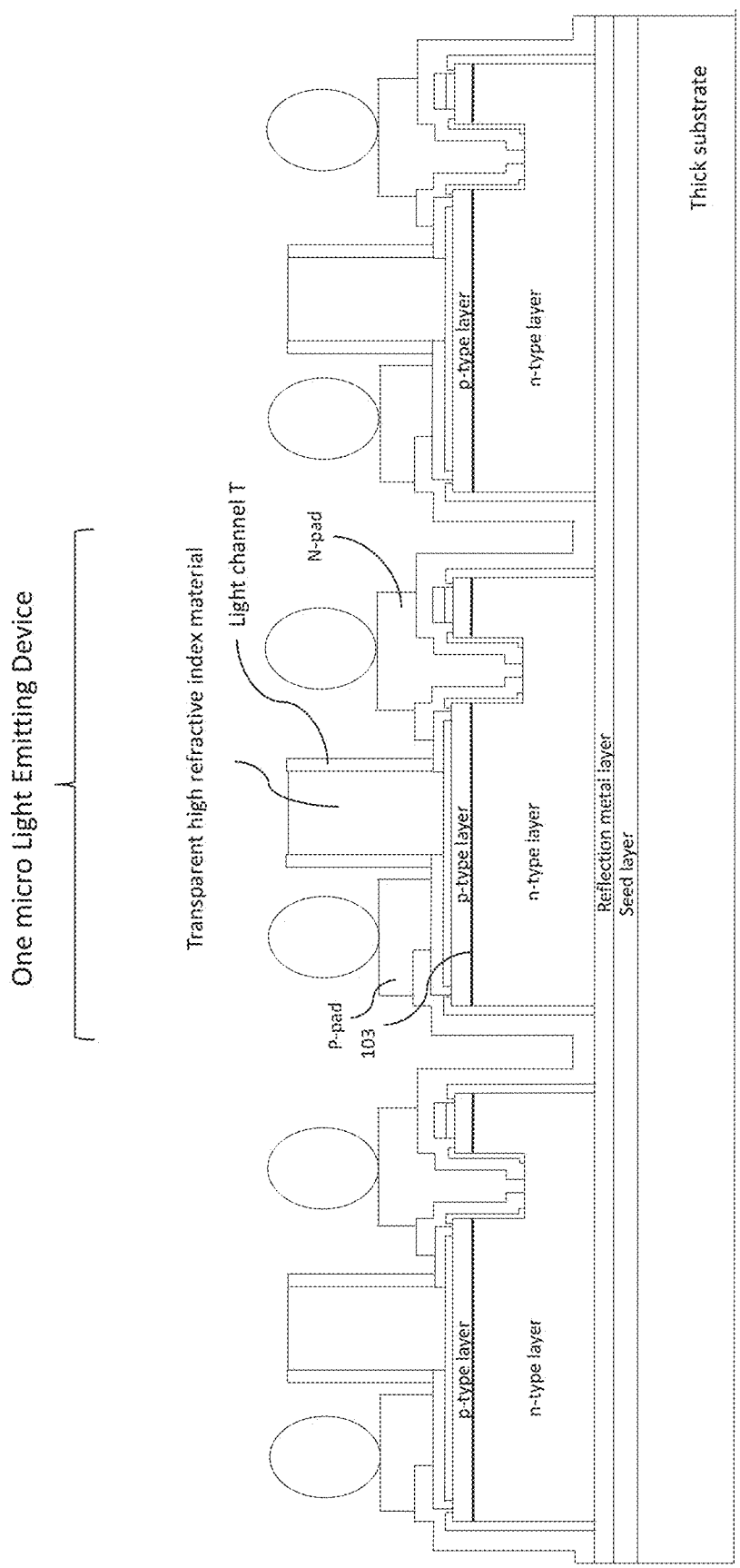
FIG. 8 is a transparent high refractive index material fills into the light channel.

In another one embodiment, a transparent high refractive index material could be option filled into the light channel T. FIG. 8 illustrates a transparent high refractive index material fills into the light channel T of FIG. 7 structure. Please note that the height of the transparent high refractive index material is the same height level of the light channel T height. In another option embodiment (not shown in here), the height of the transparent high refractive index material could be shorter than the light channel T height. The top shape of the transparent high refractive index material inside the light channel T could be upside down dome shape. In other words, surface shape of the transparent high refractive index material is controlled according to a material of the light channel T.

Figure 9:
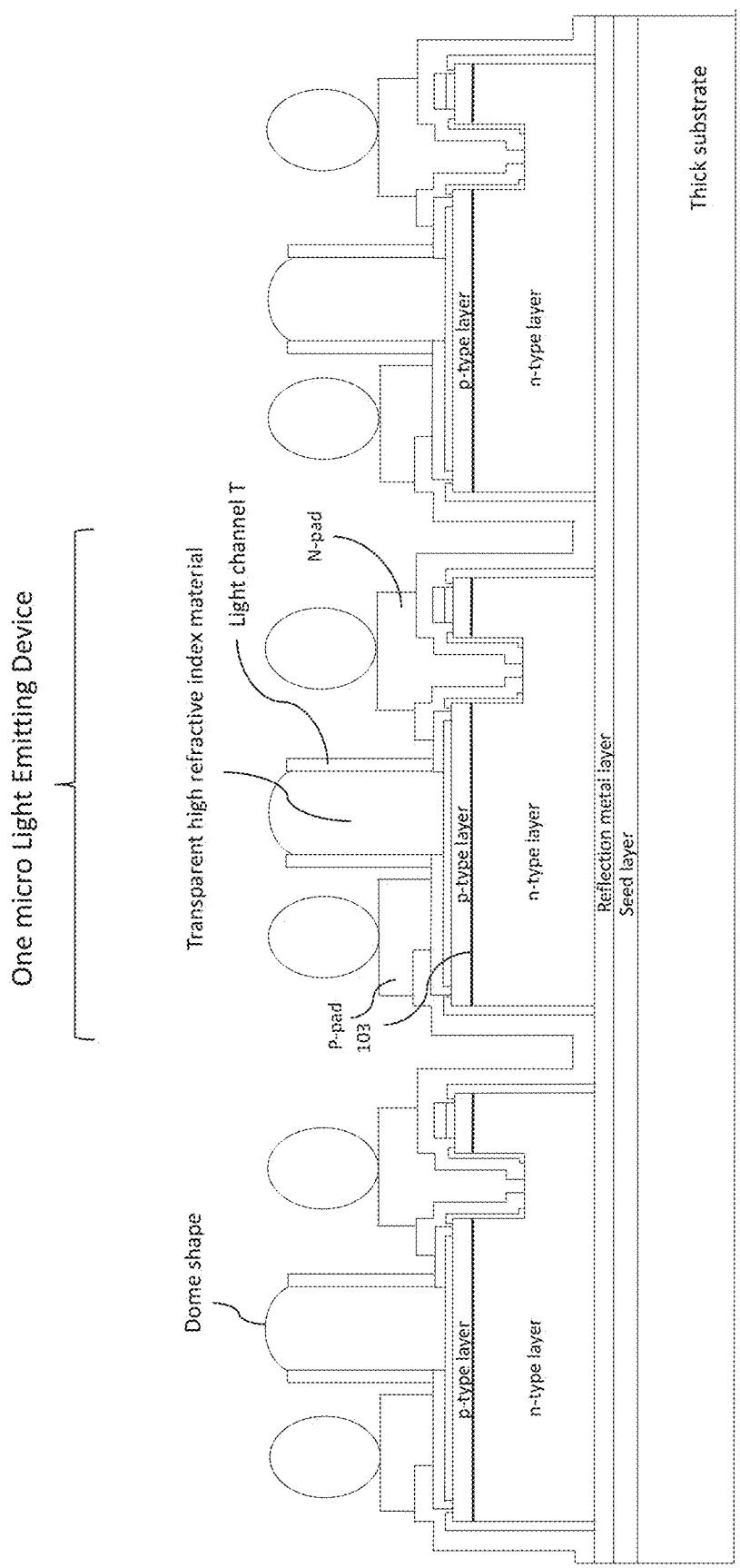
FIG. 9 is the transparent high refractive index polymer optional filled into the light channel and formed a dome shape up to the light channel.

In another one embodiment, FIG. 9 shows the transparent high refractive index material could be optional filled into the light channel T and formed a dome shape up to the light channel T due to the surface tension effect. The dome shape of the transparent high refractive index material could be as a lens on top of the light channel T to collect and focus more light.

Figure 10:
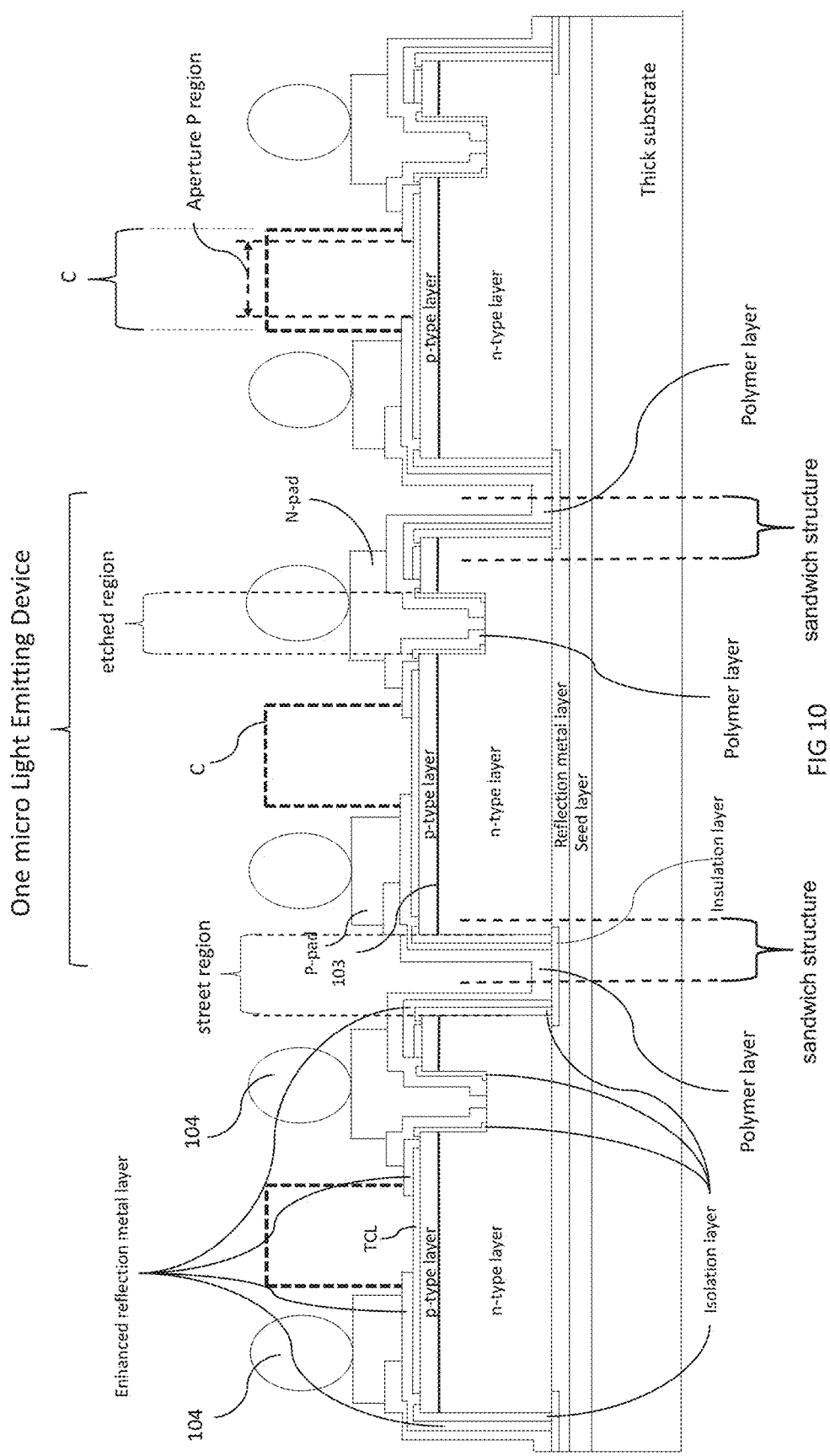
FIG. 10 is the scheme cross section structure of another one horizontal current type of multiple semiconductor structures on a thick substrate.

FIG. 10 shows the scheme cross section structure of another one horizontal current type of multiple micro light emitting device array on a thick substrate. A reflection metal layer and a seed layer formed on top of the thick substrate. A direct bandgap light emitting device epitaxy structure consists of an initial growth epi layer (n-type layer), an active layer 103, and a p-type layer. The n-type layer formed on the reflection metal layer. An insulation layer covers the street region and a portion of the n-type layer. For the micro light emitting device, a transparent contact layer (TCL) is formed on a portion of the p-type layer, an isolation layer covers on the edge of each micro light emitting device in the street region. An enhanced reflection metal layer is formed on top of a portion of the TCL layer. The enhanced reflection metal layer is also formed on a portion of the top p-type layer, and the enhanced metal reflection layer also covered on the sidewall edge isolation layer. A portion of the p-type layer, a portion of the active layer 103 and a portion of the n-type layer inside the micro light emitting device is etched to expose the n-type layer. The isolation layer also covers the edge of the etched region. A polymer layer covered a portion of the enhanced reflection metal layer, the TCL, the p-type layer, and the isolation layer. The polymer also covered the edge of the isolation layer, the edge of the enhanced reflection metal layer and the entire street region to form a polymer layer and the micro light emitting device sandwich to the isolation layer and the enhanced metal reflection layer structure. The polymer layer also option covers the sidewall isolation layer in the etched region and exposed the etched n-type layer. An aperture P region on a portion of the top TCL is formed to emit the output light. A light collection module C formed around the aperture P region to collect the output light. The micro light emitting device structure also consists a p-pad on a portion of the top enhanced reflection metal layer. An n-pad on the exposed n-type layer of the etched region to form an n-type contact. The n-pad is also on a portion of top the polymer layer. Bumps 104 formed on the p-pads, and n-pads to each one micro light emitting device. Please note the insulation layer could be optional covered on the entire reflection metal layer to isolate the micro light emitting device array.

Figure 11:
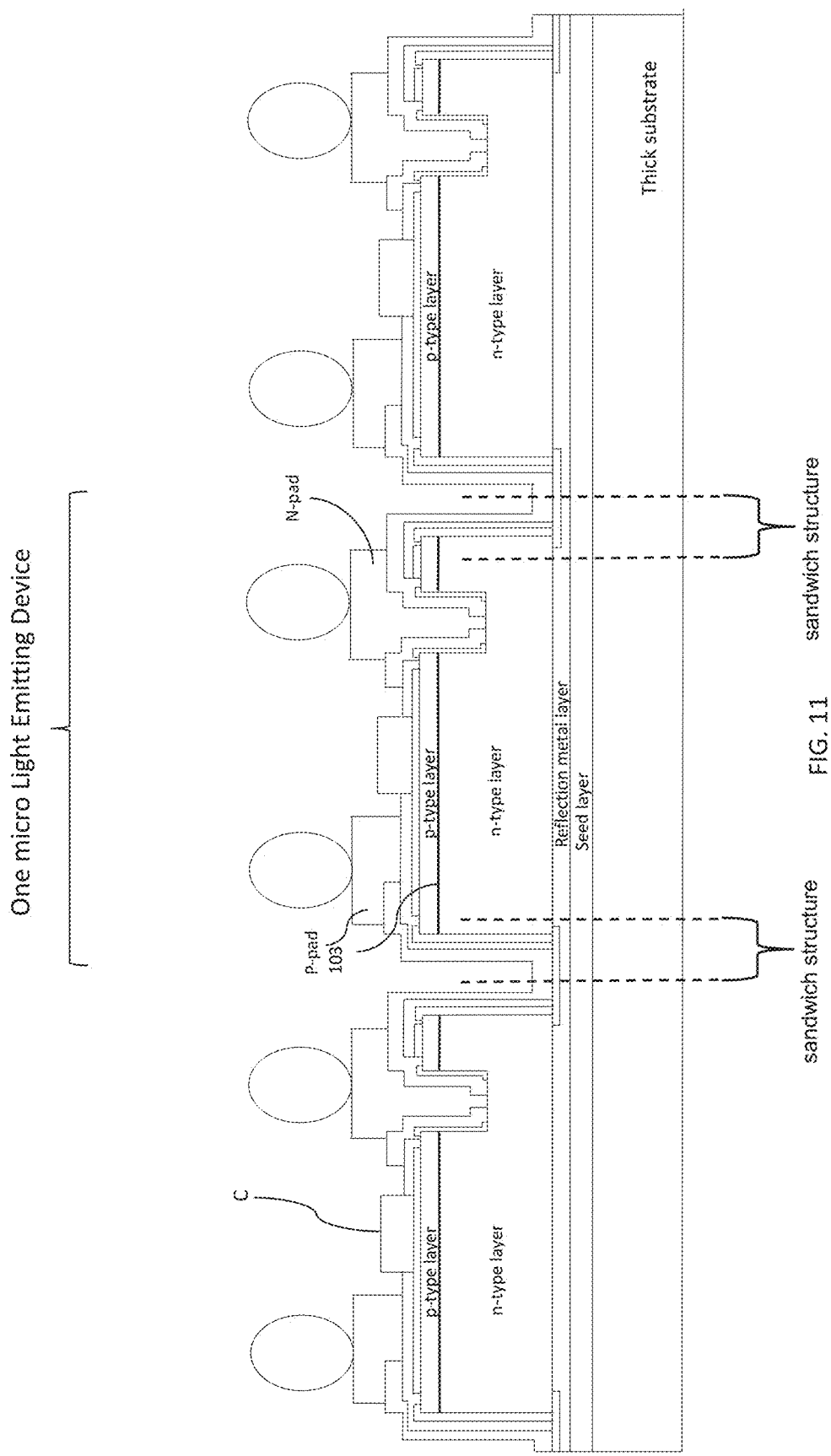
FIG. 11 is a scheme diagram about a light collection module according to an embodiment of FIG. 10.

In one embodiment, FIG. 11 is a scheme diagram about a light collection module according to an embodiment of FIG. 10. The light collection module C could be satisfied by a micro lens. The micro lens could be formed on top of the aperture P region to refract the aperture P output light. The output light could be focus on a target point to collimate the light to a 45 degree reflector in an optical interconnection substrate (not shown in here). The 45 degree reflector could reflect the focus light into an optical waveguide channel. In another aspect, the light collection module C could be an angle-selective filters to reduce the divergence angle of the light emitted from the aperture P. In another aspect, the light collection module C could be a distributed Bragg reflector (DBR) structure or a resonant cavity structure to select the optical wavelength and light angle.

Figure 12:
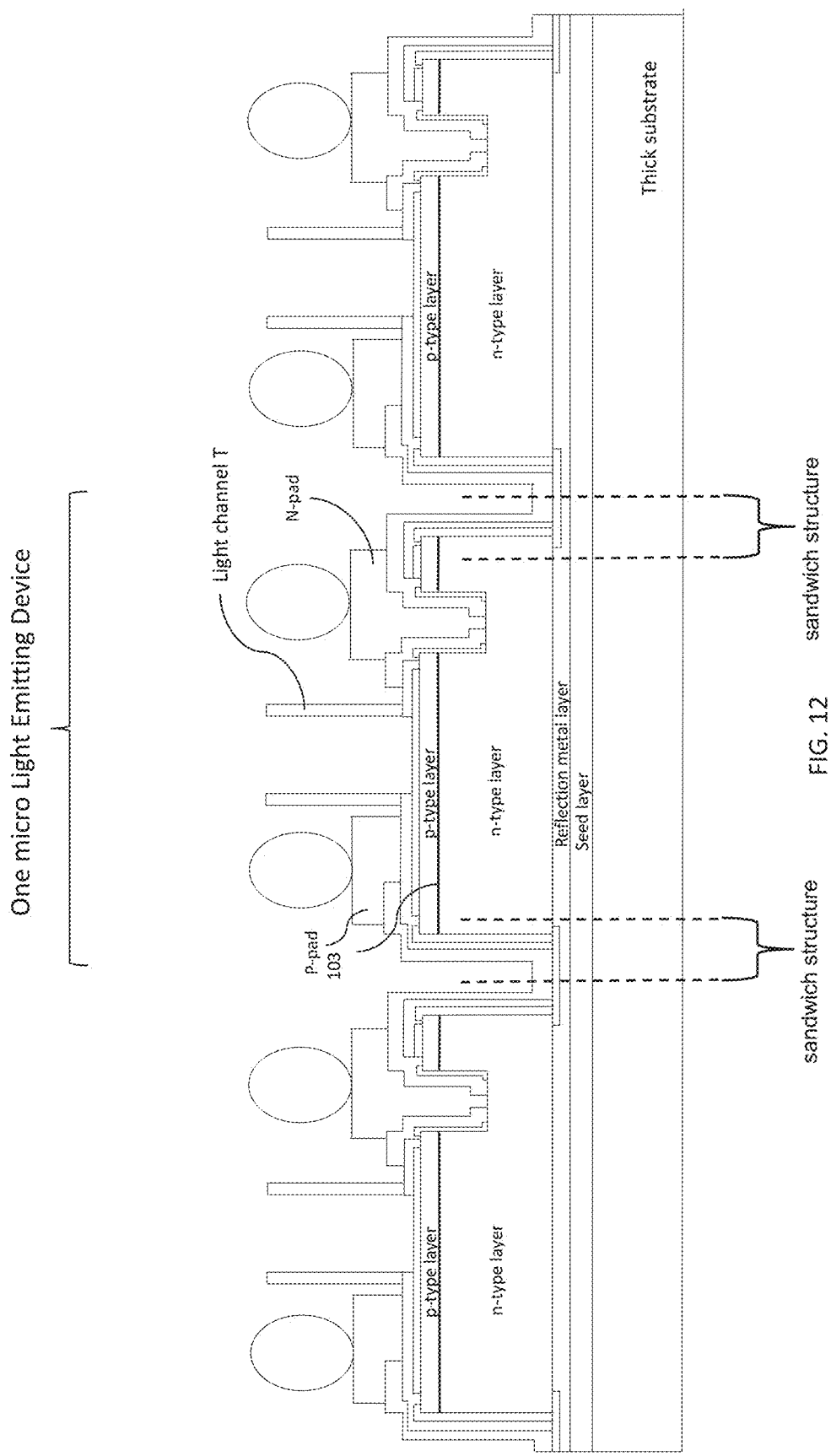
FIG. 12 is a light channel as the light collection module of FIG. 10.

In another one embodiment, FIG. 12 is a scheme diagram about a light collection module C according to an embodiment of FIG. 10. The light collection module C is satisfied by a light channel T. The light channel T could be formed on top of the enhanced reflection metal layer around the aperture P region. Please note that the light channel T could be also around the aperture region P selected to form on the TCL. In addition, the light channel T could be also around the aperture P region formed on a portion of the enhanced reflection metal layer and a portion of the TCL. Moreover, the light channel T has an inner wall. In this embodiment, the inner wall coated a reflective material.

Figure 13:
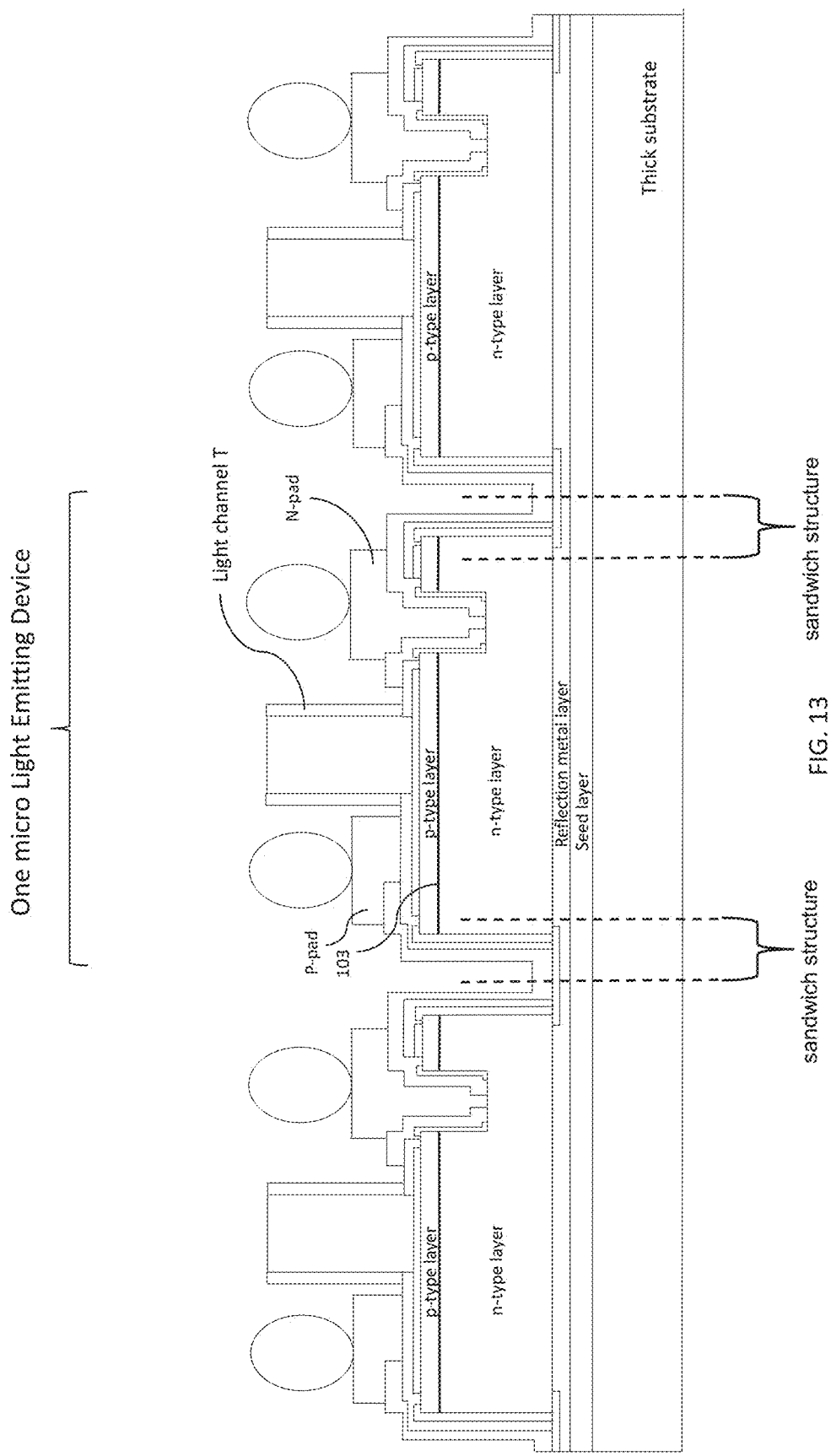
FIG. 13 is a transparent high refractive index material filled into the light channel of FIG. 12.

In another one embodiment, a transparent high refractive index material could be option filled into the light channel T. FIG. 13 is a transparent high refractive index material filled into the light channel T of FIG. 12. Please note that the height of the transparent high refractive index material is the same height level of the light channel T height. In another option embodiment (not shown in here), the height of the transparent high refractive index material could be shorter than light channel T height. The top shape of the transparent high refractive index material inside the channel could be upside down dome shape. In other words, surface shape of the transparent high refractive index material is controlled according to a material of the light channel T.

Figure 14:
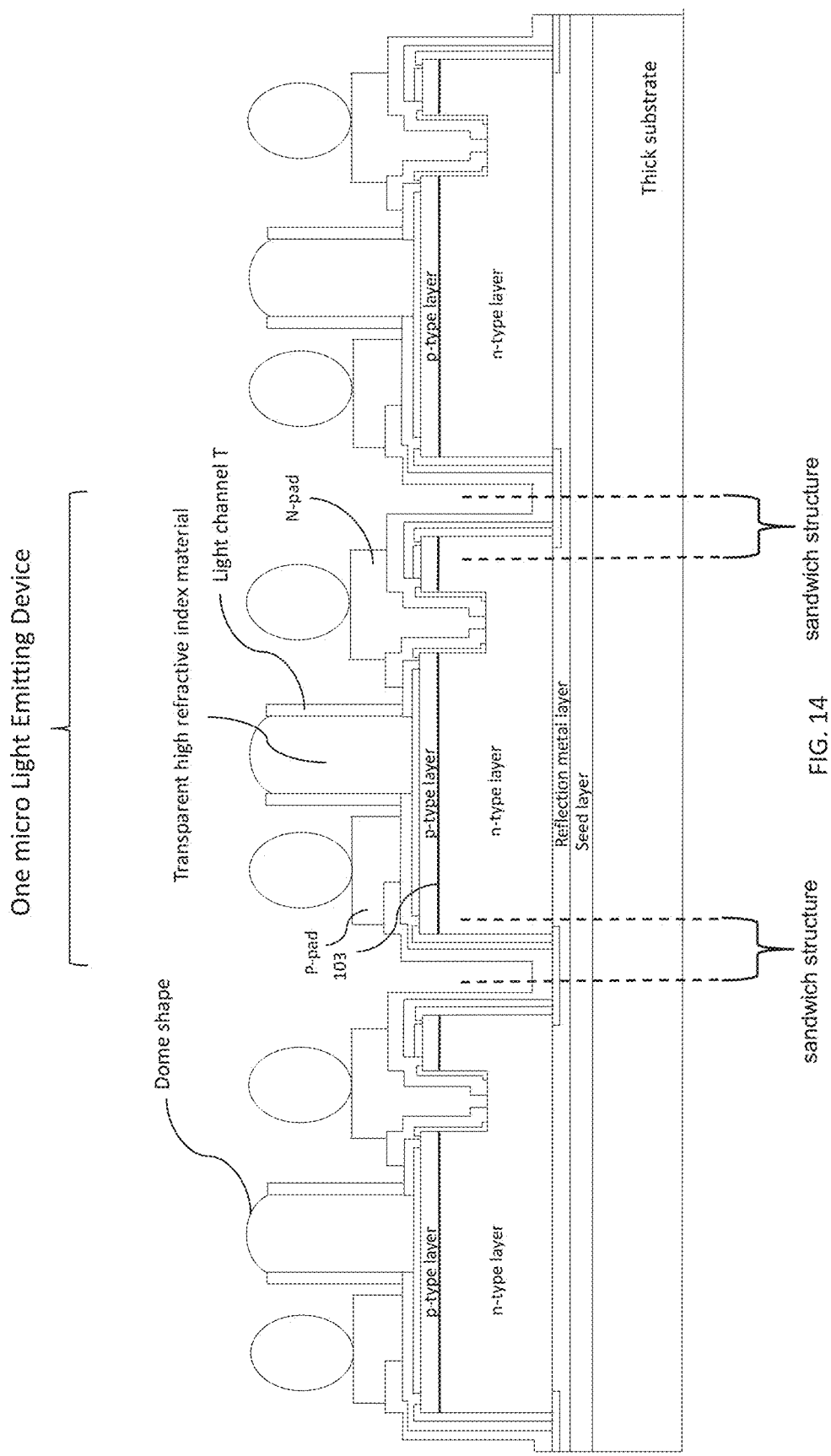
FIG. 14 is the transparent high refractive index polymer optional filled into the light channel and formed a dome shape up to the light channel.

In another one embodiment, FIG. 14 shows the transparent high refractive index material could be optional filled into the light channel T and formed a dome shape up to the light channel T due to the surface tension effect. The dome shape of the transparent high refractive index material could be as a lens on top of the light channel T to collect and focus more light.

Now referring from FIG. 5 to FIG. 14, the TCL could be selected from indium tin oxide (ITO), Gallium-doped ZnO (GZO), Indium-Gallium doped ZnO (IGZO), Al-doped zinc oxide (AZO). The thickness of the TCL could be selected from the optical length match one fourth wavelength to output the optimized optical power. The reflection metal layer could be selected from Ti, Cr, Al, Ag, Ni, Cu, Au or mixed these metals to make an alloy layer. The combination metal layers could be such as Ti/Al/Ni/Au, Ti/Al/Ni/Cu, Ti/Ag/Ni/Au, Ti/Ag/Ni/Cu, Cr/Al/Ni/Au, Cr/Ag/Ni/Au.

For high speed modulation, reduction of the capacitor effect is one of a key factor to increase the response time. In one micro light emitting device, the active layer between one p-type layer and one n-type layer is a capacitor effect area. Referring from FIG. 5 to FIG. 14, the TCL could be only formed on a specific region of the p-type layer to reduce the capacitor effect of active layer 103. A good p-type ohmic contact provides a low resistant contact to allow the current only injection into a specific region. The specific ohmic region on the p-type layer is purposed to confine the current only spreading to the specific region in the micro light emitting device and reduce the active layer 103 capacitor effect. The specific region could be only formed at the aperture P region. The specific region could be larger than that of the aperture P region. In another aspect to further reduce the capacitor effect of active layer 103, the isolation layer could be formed on the top major p-type layer beside the aperture P region, the TCL could be formed on the top isolation layer and on the p-type layer of the aperture P region. The specific region could be larger than that of the aperture P region. In addition, the specific region could be formed by the TCL. The enhanced metal reflection layer could be formed on the top p-type layer and cover around the specific region of TCL. The enhanced metal reflection layer could be p-type non-ohmic contact metal layers.

Now, referring from FIG. 5 to FIG. 14, the isolation layer and the insulation layer could be deposited by dielectric material such as $SiO_x$, $Si_xN_y$, $Al_2O_3$, $TiO_2$ using plasma enhance chemical vapor deposition, chemical vapor deposition, physical vapor deposition, atomic layer deposition. Please note that the isolation layer and the insulation layer could be multiple dielectrics having high/low refractive index such as distributed Bragg reflector (DBR) structure to provide a dielectric reflection layer on the sidewall of the micro light emitting device. The isolation layer and the insulation layer could be optional selected from polymer such as polyimide, silicone, and epoxy. The isolation layer could be option combined by multiple layer such as dielectric material and polymers.

Figure 15:
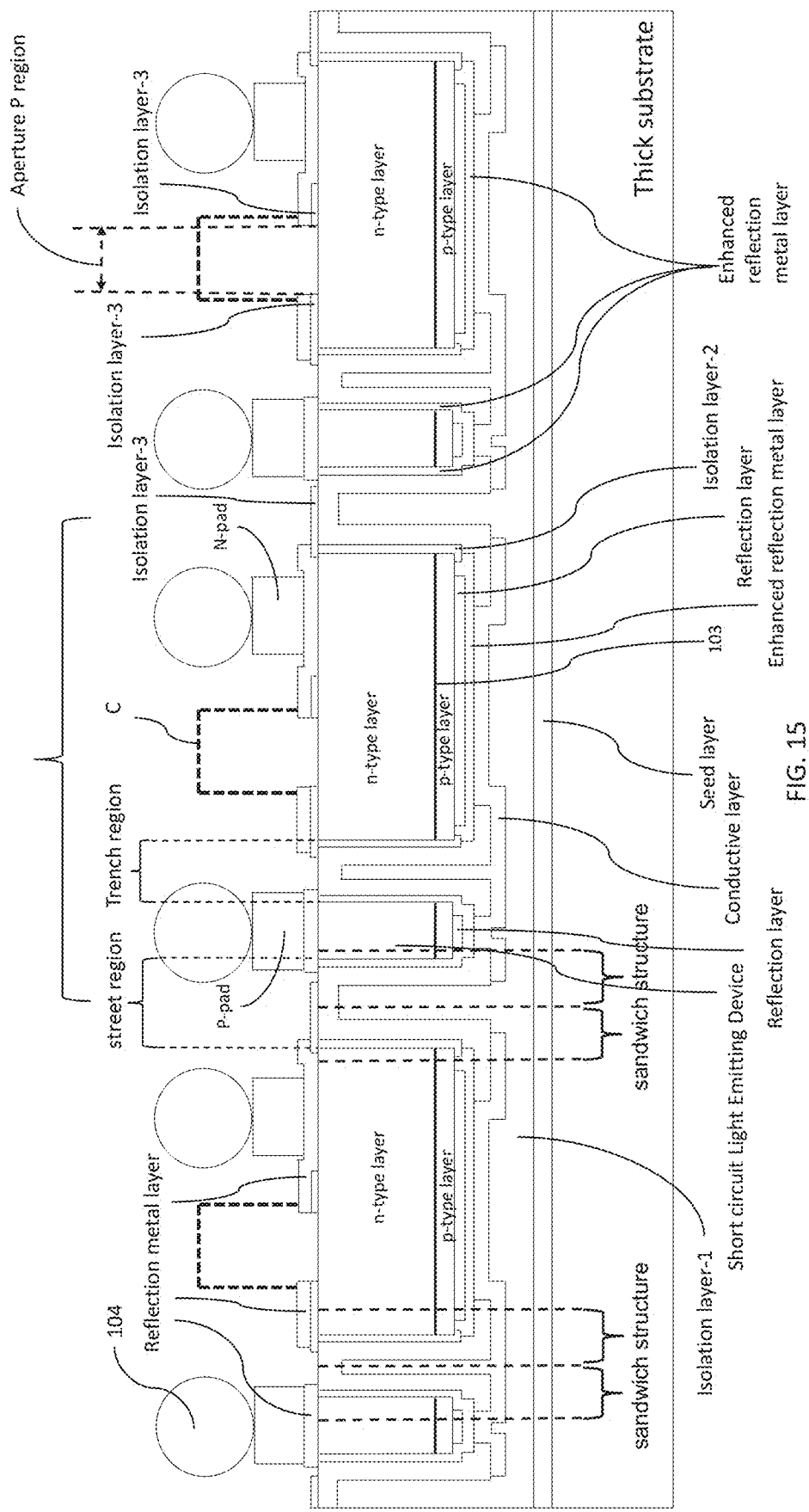
FIG. 15 is the scheme cross section structure of a vertical current type of multiple semiconductor structures on a thick substrate.

FIG. 15 shows the scheme cross section structure of a vertical current type of multiple micro light emitting device array on a thick substrate. The first semiconductor layer 101 is satisfied by an n-type layer (or initial growth epi layer); second semiconductor layer 102 is satisfied by a p-type layer. A seed layer and an isolation layer-1 formed on top of the thick substrate. A direct bandgap light emitting device epitaxy structure consists of an initial growth epi layer (n-type layer), an active layer 103, and a p-type layer. The p-type layer formed on the reflection layer R. In one micro light emitting device region, a portion of the p-type layer, a portion of the active layer 103 and a portion of the n-type layer is complete removed to separate one micro light emitting device into two light emitting device parts. For one micro light emitting device, one is the major part of the formal function light emitting device, located at the right hand side the other one is the minor part of the short circuit light emitting device, located at left hand side. The separation region could be called as trench region.

For the formal function light emitting device part, the light emitting device structure consists of a reflection layer underneath a portion of the bottom p-type layer, and an isolation layer-2 covers onto the edge sidewall of formal function light emitting device and a portion of the bottom p-type layer. An enhanced reflection metal layer covers onto the reflection layer, a portion of the p-type layer, and a portion of the bottom isolation layer-2.

For the short circuit light emitting device part, the light emitting device consists of a reflection layer underneath bottom p-type layer, an enhanced reflection metal layer covers the reflection layer and sidewall of the short circuit light emitting device including the edge p-type layer, the edge active layer 103, and the edge n-type layer. Please note that a particular case of the reflection layer R is a metal layers, the reflection metal layer could be also selected to cover the sidewall of the short circuit light emitting device. Please note that the enhanced reflection metal layer could be selected to only cover a portion of the sidewall of the short circuit light emitting device. In another aspect, the short circuit light emitting device could be formed by connecting a metal layer to a portion of the etched p-type layer, and a portion of the etched active layer 103, in one short circuit light emitting device region.

A polymer layer covered a portion of the enhanced reflection metal layer, a portion of the street region, and a portion of the trench region to form the polymer layer and the micro light emitting device sandwich to the isolation layer-2. After forming the polymer layer, please note that a portion of the enhance reflection metal layer is exposed in the formal function light emitting device part, and a portion of the enhance reflection metal layer is exposed in the short circuit light emitting device part. In one micro light emitting device region, a conductive layer covers onto a portion of polymer layer and covers onto the exposed enhanced reflection metal layer to provide a circuit connect for the short circuit light emitting device conducting to the p-type layer of the formal function light emitting device.

An isolation layer-3 is formed on a portion of the street region, a portion of the trench region, and a portion of the n-type layer. For the street region, and the trench region, the isolation layer-3 covers the edge isolation layer-2, and a portion of the street polymer layer. In the formal function light emitting device region, the isolation layer-3 covers from the edge to a portion of the top n-type layer. A reflection metal layer could be formed on a portion of the isolation layer-3, and a portion of the top n-type layer.

An n-pad is formed on the reflection metal layer of the formal function light emitting device. The n-pad could be option formed on a portion of the n-type layer of the formal function light emitting device. A p-pad is formed on the reflection metal layer of the short circuit light emitting device. The operation current could be conducted from the p-pad, the reflection metal layer of the short circuit light emitting device, the entire short circuit light emitting device structure, and the conductive layer to the formal function light emitting device including the enhanced reflection metal layer, the p-type layer, the active layer 103, the n-type layer, and the n-pad. Thus the formal function light emitting device having a type of vertical current driving could be lit up.

An aperture P region on a portion of top n-type layer is formed to emit the output light. A light collection module C formed around the aperture P region to collect and guide the output light. A bump 104 formed on the p-pads, and the n-pads to each one micro light emitting device.

Figure 16:
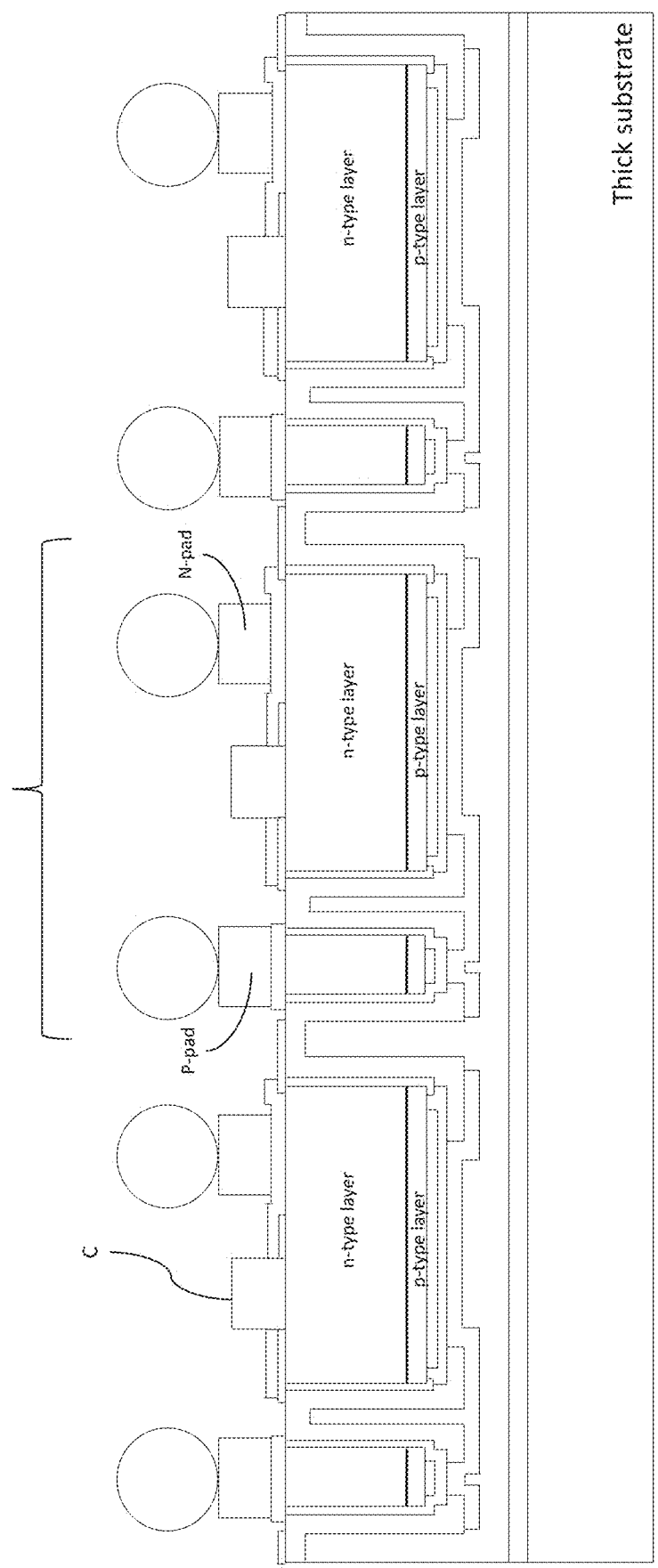
FIG. 16 is a scheme diagram about a light collection module according to an embodiment of FIG. 15.

In one embodiment, FIG. 16 is a scheme diagram about a light collection module C according to an embodiment of FIG. 15. The light collection module C could be a micro lens. The micro lens could be formed on top of the aperture P region to refract the aperture P output light. The output light could be focus on a target point to collimate the light to a 45 degree reflector in an optical interconnection substrate (not shown in here). The 45 degree reflector could reflect the focus light into an optical waveguide channel. In another aspect, the light collection module C could be an angle-selective filters to reduce the divergence angle of the light emitted from the aperture P. In another aspect, the light collection module C could be a distributed Bragg reflector (DBR) structure or a resonant cavity structure to select the optical wavelength and light angle.

Figure 17:
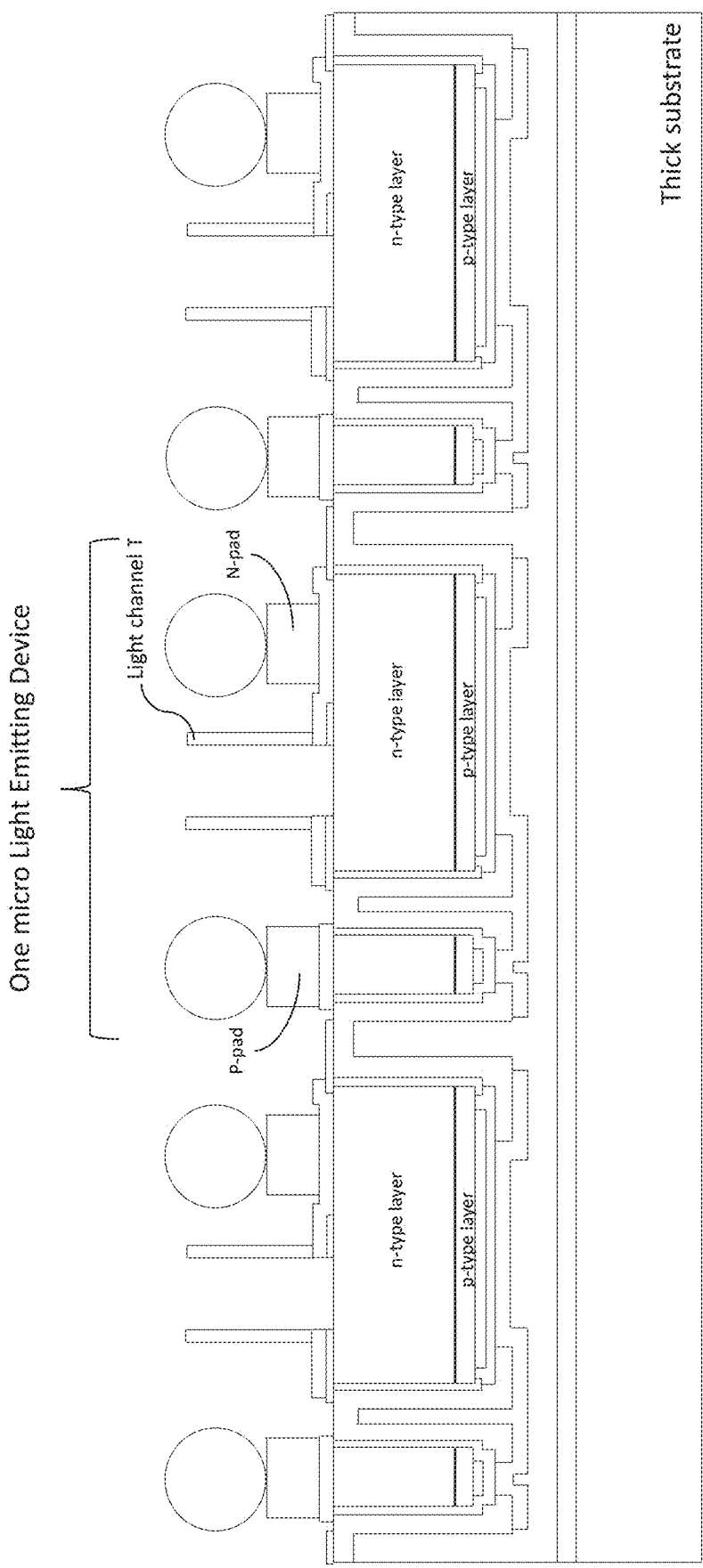
FIG. 17 is a light channel as the light collection module of FIG. 15.

In another one embodiment, FIG. 17 is a scheme diagram about a light collection module according to an embodiment of FIG. 15. The light collection module C is satisfied by a light channel T. The light channel T could be formed on top of the reflection metal layer around the aperture P region. It should be noted that the light channel T could be also around the aperture P region option to form on the n-type layer of the formal function light emitting device. In addition, the light channel T could be also around the aperture P region formed on a portion of the isolation layer-3 and a portion of the n-type layer of the formal function light emitting device. Moreover, the light channel T has an inner wall. In this embodiment, the inner wall coated a reflective material.

Figure 18:
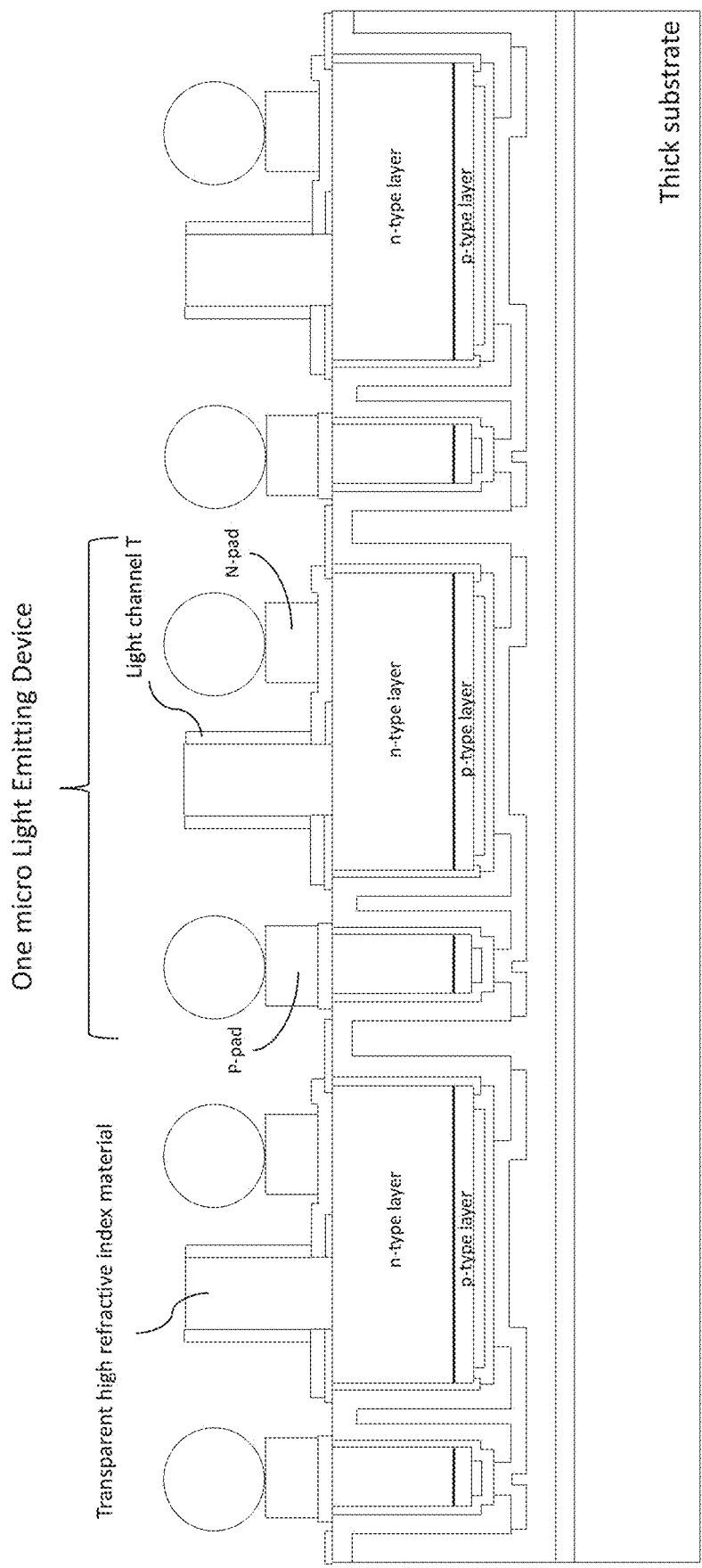
FIG. 18 is a transparent high refractive index material filled into the light channel of FIG. 17.

In another one embodiment, a transparent high refractive index material could be option filled into the light channel T. FIG. 18 illustrates a transparent high refractive index material fill into the light channel T of FIG. 15. Please note that the height of the transparent high refractive index material is the same height level of the light channel T height. In another option embodiment (not shown in here), the height of the transparent high refractive index material could be shorter than light channel T height. The top shape of the transparent high refractive index material inside the channel tube could be upside down dome shape. In other words, surface shape of the transparent high refractive index material is controlled according to a material of the light channel T.

Figure 19:
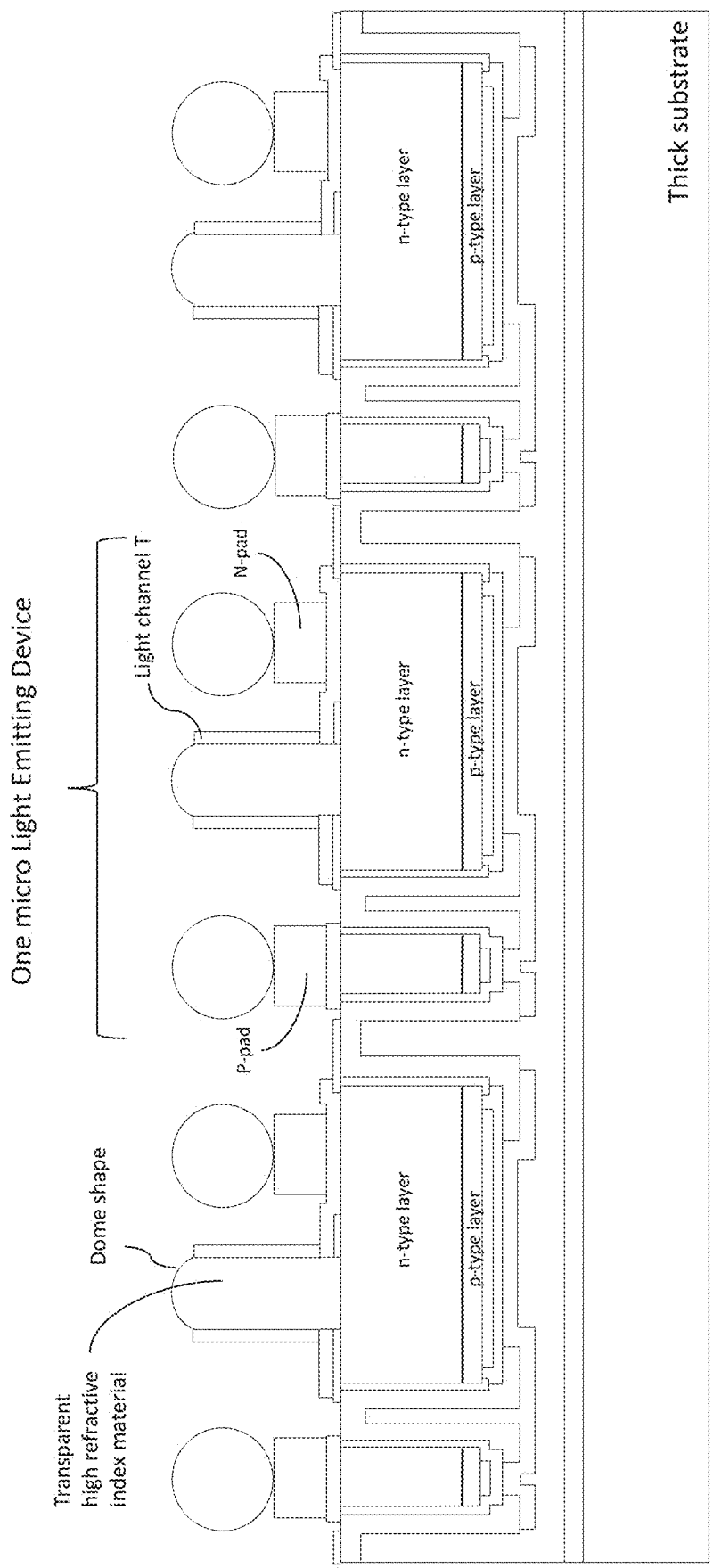
FIG. 19 is the transparent high refractive index polymer optional filled into the light channel and formed a dome shape up to the light channel.

In another one embodiment, FIG. 19 shows the transparent high refractive index material could be optional filled into the light channel T and formed a dome shape up to the light channel due to the surface tension effect. The dome shape of the transparent high refractive index material could be as a lens on top of the light channel T to collect and focus more light.

Figure 20:
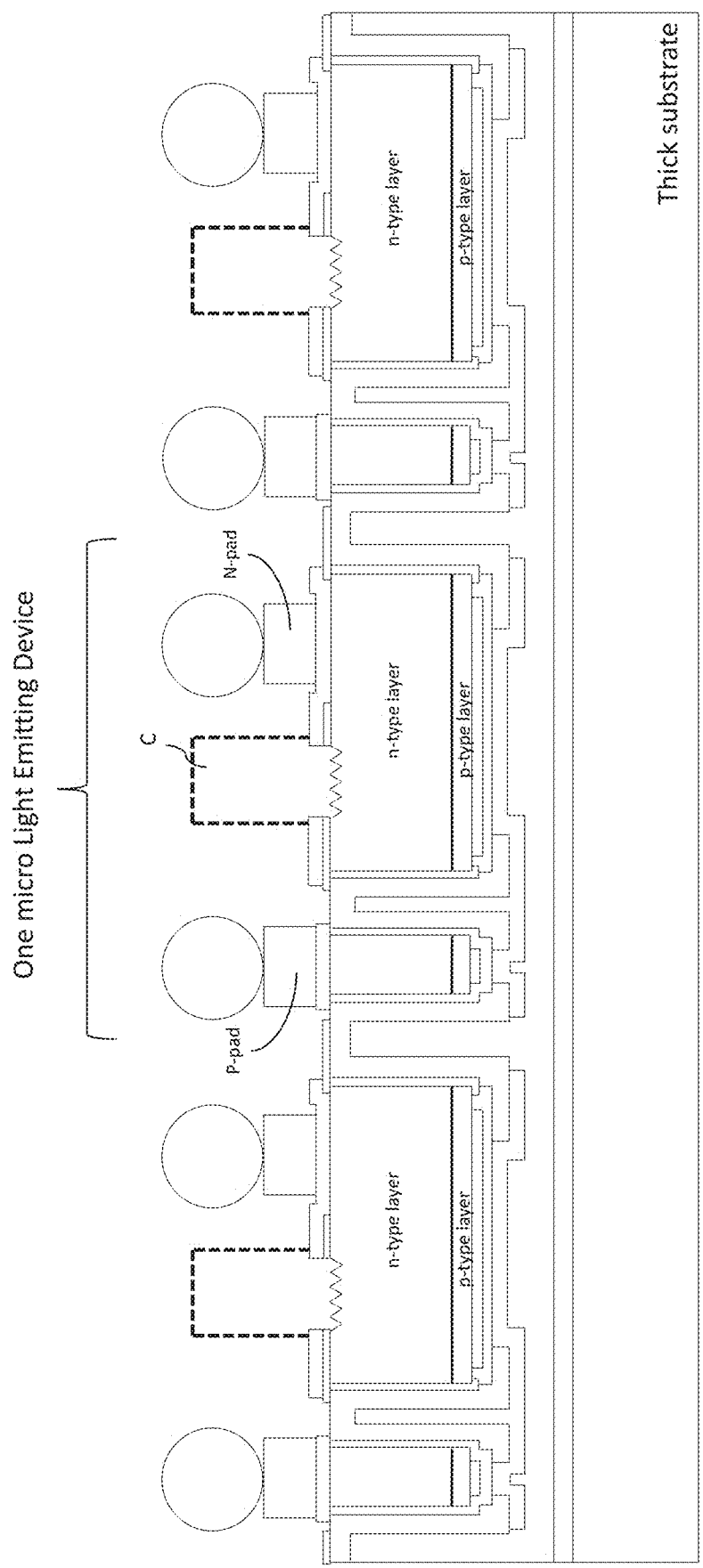
FIG. 20 is the surface roughness of the n-type layer of the formal function light emitting device in aperture region.

In another aspect for more light could be extracted from the aperture P region, a surface roughness of the n-type layer of the formal function light emitting device in the aperture P region could be option formed by chemical etching, drying etching, photon enhanced chemical etching. Now referring to FIG. 20, FIG. 20 shows the aperture P region of the n-type layer of the formal function light emitting device in the aperture P region with surface roughness/texturing. The light could be extracted more through the texturing surface to obtain higher light output power. Please note that the isolation layer-3 could be option formed on the n-type layer including the texturing n-type layer of the formal function light emitting device, or not including the texturing n-type layer of the formal function light emitting device. Please note that the surface roughness could be option formed on major portion of the n-type layer of the formal function light emitting device including the surface underneath of a portion of the reflection metal layer, and a portion of the isolation layer-3 (which is not shown in here). In some particular, the surface roughness could be formed initially on the n-type layer when the epitaxy growth substrate is a patterning sapphire substrate.

An aperture P region on a portion of the top n-type layer is formed to emit the output light. A light collection module formed around the aperture P region to collect and guide the output light. A bump 104 formed on the p-pads, and the n-pads to each one micro light emitting device.

Figure 21:
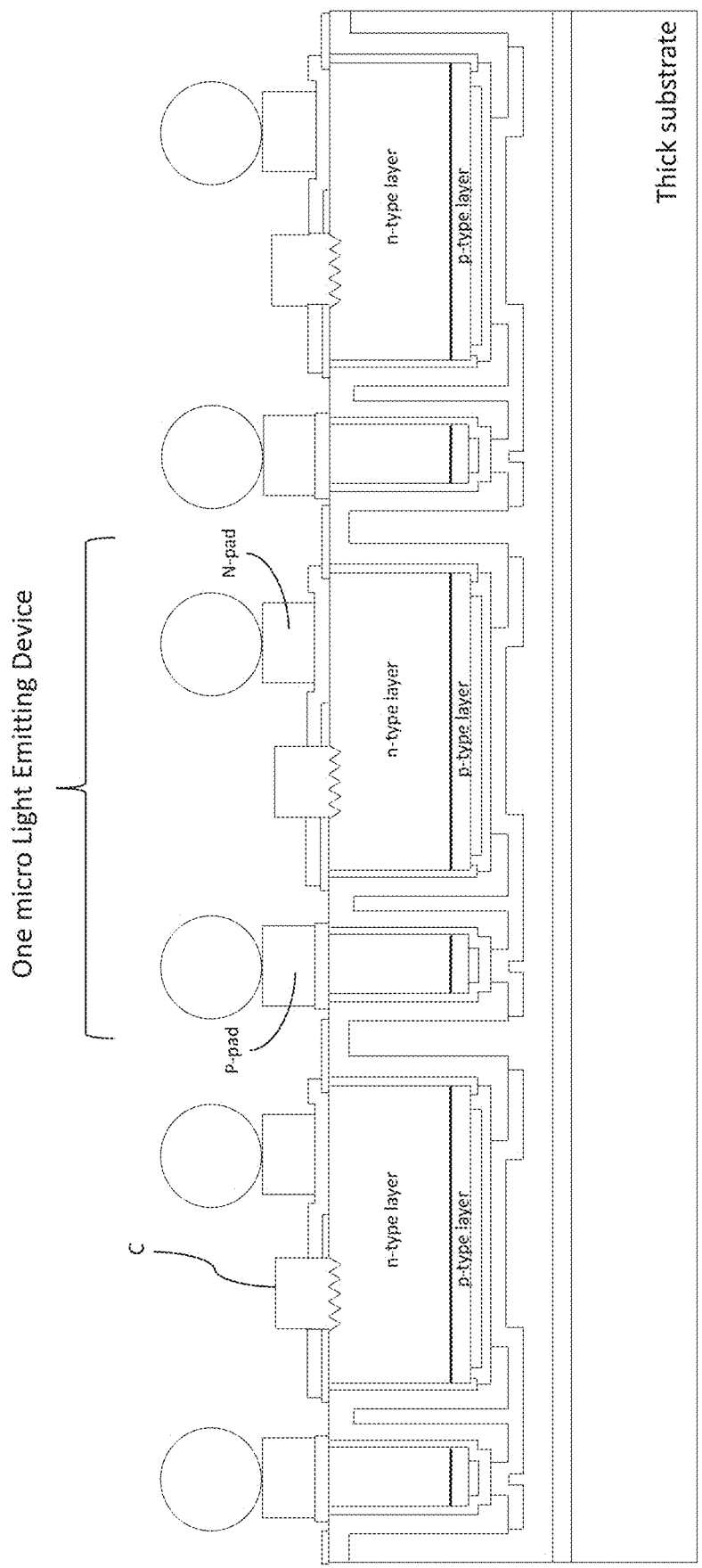
FIG. 21 is the scheme about a light collection module according to an embodiment of FIG. 20.

In one embodiment, FIG. 21 is the scheme about a light collection module according to an embodiment of FIG. 20. The light collection module C could be a micro lens. The micro lens could be formed on top of the aperture P region to refract the aperture P output light. The output light could be focus on a target point to collimate the light to a 45 degree reflector in an optical interconnection substrate (not shown in here). The 45 degree reflector could reflect the focus light into an optical waveguide channel. In another aspect, the light collection module C could be an angle-selective filters to reduce the divergence angle of the light emitted from the aperture P. In another aspect, the light collection module C could be a distributed Bragg reflector (DBR) structure or a resonant cavity structure to select the optical wavelength and light angle.

Figure 22:
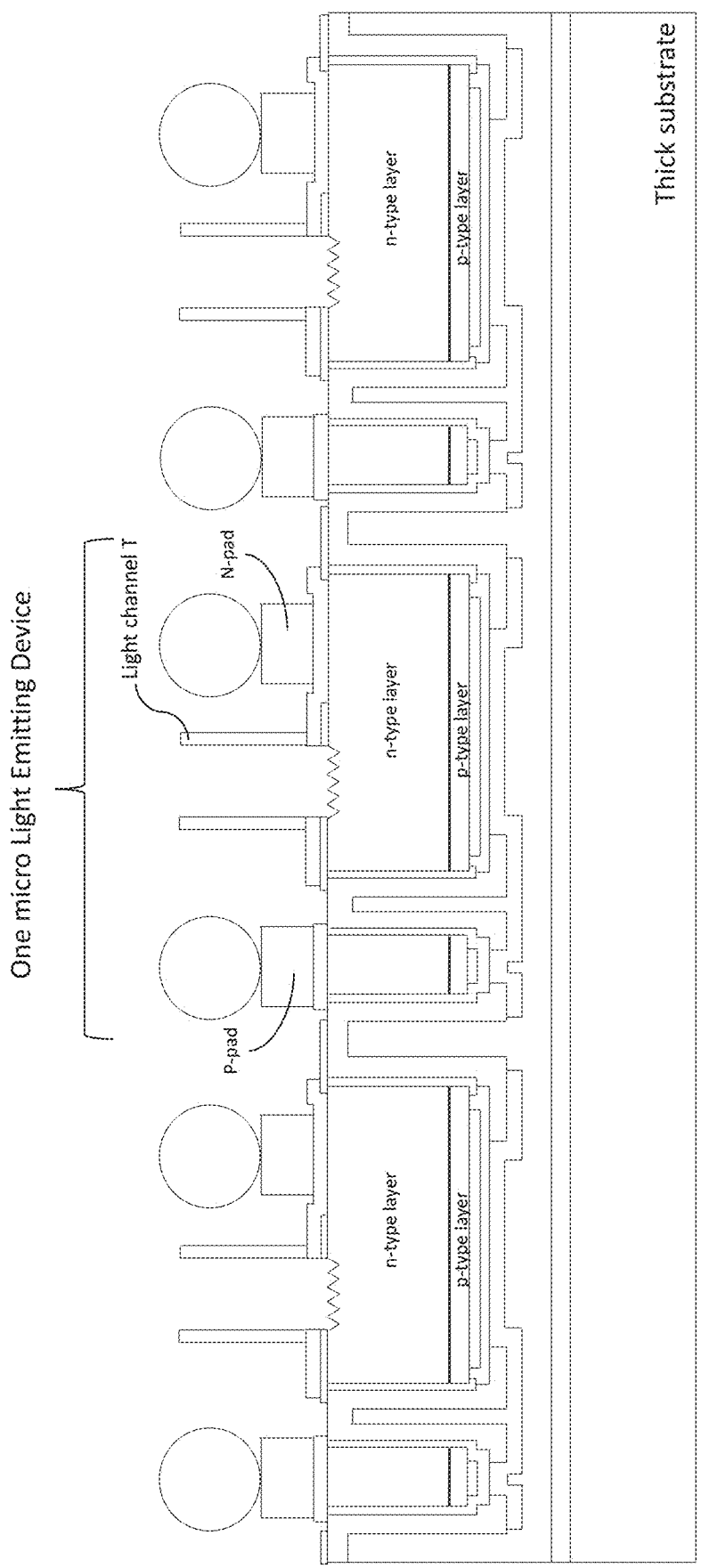
FIG. 22 is a light channel as the light collection module of FIG. 20.

In another one embodiment, FIG. 22 is the scheme about a light collection module C according to an embodiment of FIG. 20. The light collection module C is satisfied by a light channel T. The light channel T formed on top of the reflection metal layer around the aperture P region. Please note that the light channel T could be also around the aperture P region option to form on the n-type layer of the formal function light emitting device. In addition, the light channel T could be also around the aperture P region formed on a portion of the isolation layer-3 and a portion of the n-type layer of the formal function light emitting device. Moreover, the light channel T has an inner wall. In this embodiment, the inner wall coated a reflective material.

Figure 23:
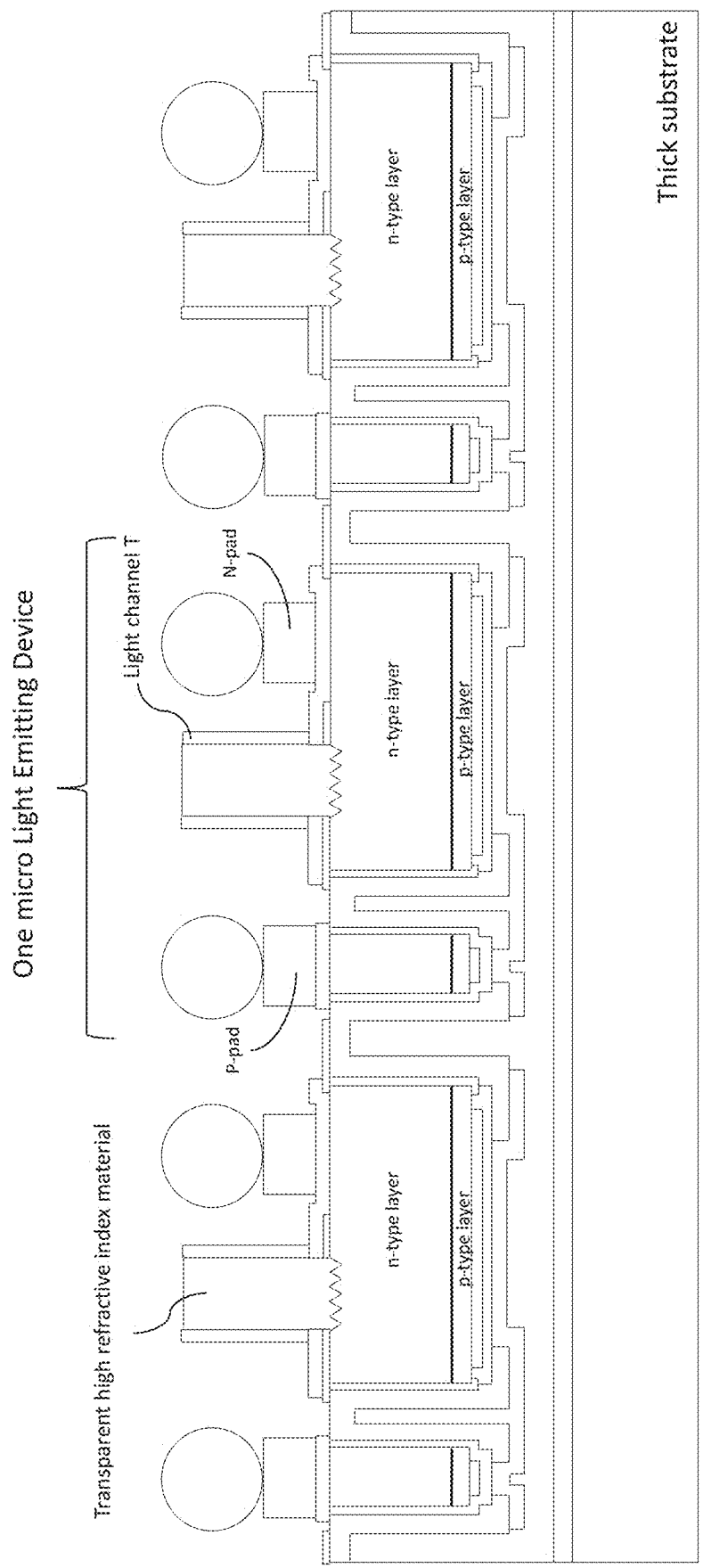
FIG. 23 is a transparent high refractive index material filled into the light channel of FIG. 22.

In another one embodiment, a transparent high refractive index material could be option filled into the light channel T. FIG. 23 illustrates a transparent high refractive index material fill into the light channel T of FIG. 22. Please note that the height of the transparent high refractive index material is the same height level of the light channel T height. In another option embodiment (not shown in here), the height of the transparent high refractive index material could be shorter than light channel T height. The top shape of the transparent high refractive index material inside the channel tube could be upside down dome shape. In other words, surface shape of the transparent high refractive index material is controlled according to a material of the light channel T.

Figure 24:
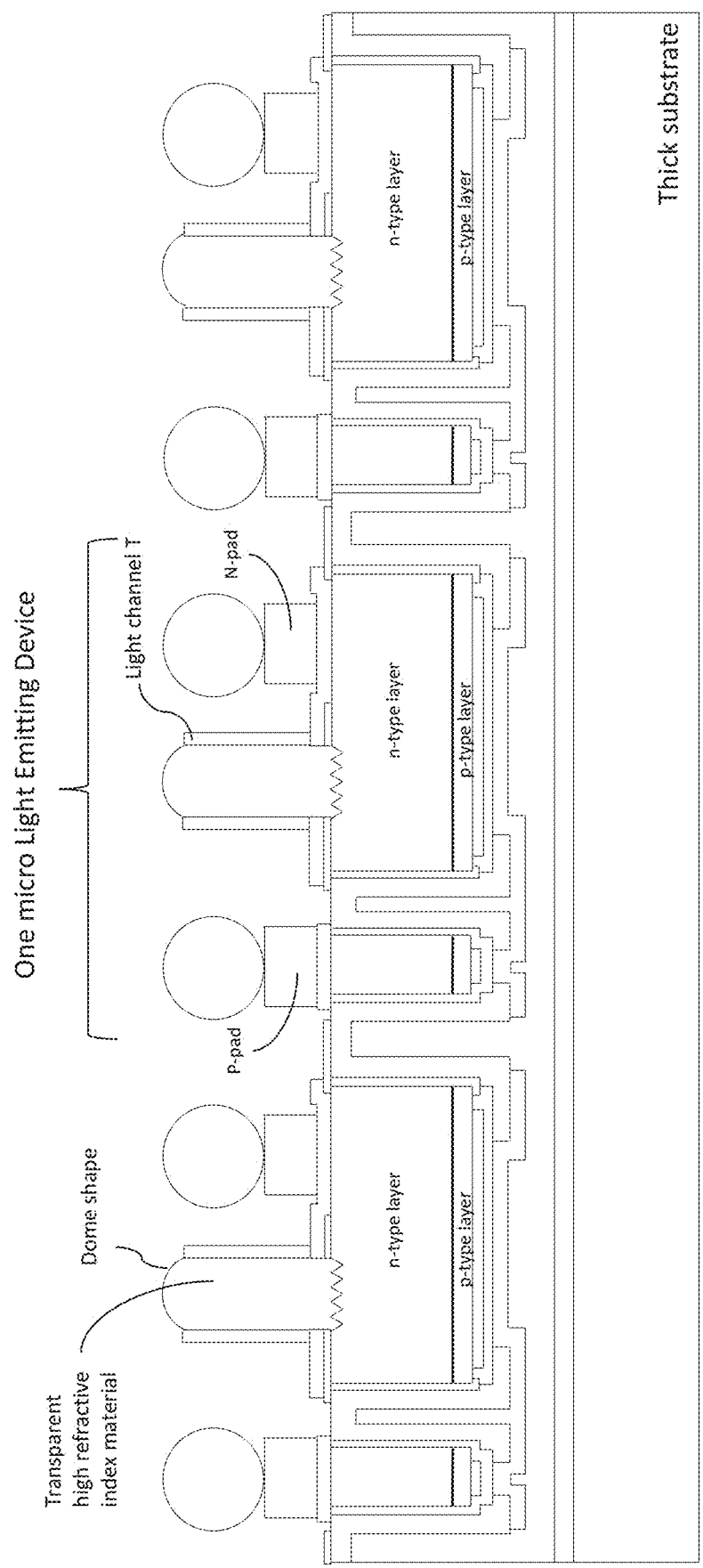
FIG. 24 is the transparent high refractive index polymer optional filled into the light channel and formed a dome shape up to the light channel.

In another one embodiment, FIG. 24 shows the transparent high refractive index transparent high refractive index material could be optional filled into the light channel T and formed a dome shape up to the light channel T due to the surface tension effect. The dome shape of the transparent high refractive index material could be as a lens on top of the light channel T to collect and focus more light.

Figure 25:
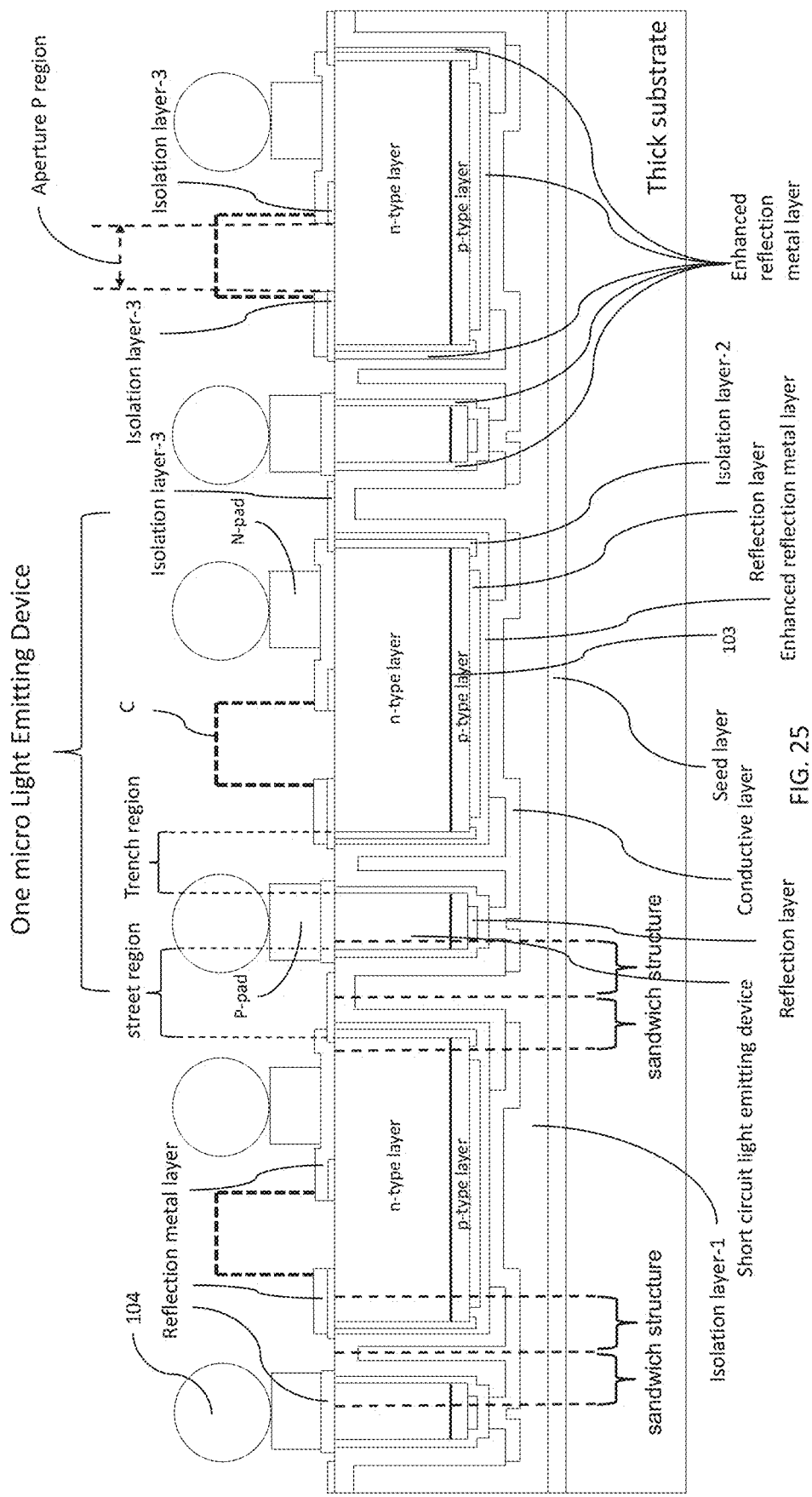
FIG. 25 is the scheme cross section structure of another one vertical current type of multiple semiconductor structures on a thick substrate.

FIG. 25 shows the scheme cross section structure of another one vertical current type of multiple micro light emitting device array on a thick substrate. A seed layer and an isolation layer-1 formed on top of the thick substrate. A direct bandgap light emitting device epitaxy structure consists of an initial growth epi layer (n-type layer), an active layer 103, and a p-type layer. The p-type layer formed on the reflection layer. In one micro light emitting device region, a portion of the p-type layer, a portion of the active layer and a portion of the n-type layer is complete removed to separate one micro light emitting device into two light emitting device parts. For one micro light emitting device, one is the major part of the formal function light emitting device, located at the right hand side, the other one is the minor part of the short circuit light emitting device, located at left hand side. The separation region could be called as trench region.

For the formal function light emitting device part, the light emitting device structure consists of a reflection layer underneath a portion of the bottom p-type layer, and an isolation layer-2 covers onto the edge sidewall of formal function light emitting device and a portion of the bottom p-type layer. An enhanced reflection metal layer covers onto the reflection layer, a portion of the p-type layer, and a portion of the bottom isolation layer-2. The enhanced reflection metal layer is also formed on a portion of the bottom p-type layer, and the enhanced metal reflection layer also covered on the sidewall edge isolation layer-2.

For the short circuit light emitting device part, the light emitting device consists of a reflection layer underneath the bottom p-type layer, an enhanced reflection metal layer covers the reflection layer and the sidewall of the short circuit light emitting device including the edge p-type layer, the edge active layer, and the edge n-type layer. Please note that a particular case of the reflection layer is a metal layers, the reflection layer could be also selected to cover the sidewall of the short circuit light emitting device. Please note that the enhanced reflection layer could be selected to only cover a portion of the sidewall of the short circuit light emitting device. In another aspect, the short circuit light emitting device could be formed by connecting a metal layer to a portion of the etched p-type layer, and a portion of the etched active layer 103, in one short circuit light emitting device region. A polymer layer covered a portion of the enhanced reflection metal layer, a portion of the street region, and a portion of the trench region to form a polymer layer and the micro light emitting device sandwich to the enhanced reflection metal layer and the isolation layer-2. After forming the polymer layer, please note that a portion of the enhance reflection metal layer is exposed in the formal function light emitting device part, and a portion of the enhance reflection metal layer is exposed in the short circuit light emitting device part. In one micro light emitting device region, a conductive layer covers onto a portion of the polymer layer and covers onto the exposed enhanced reflection metal layer, is to form a circuit to connect for the short circuit light emitting device to the p-type of the formal function light emitting device.

An isolation layer-3 is formed on a portion of the street region, a portion of the trench region, and a portion of the n-type layer. For the street region, and the trench region, the isolation layer-3 covers the edge isolation layer-2, the edge enhanced metal reflection layer, and a portion of the street polymer layer. In the formal function light emitting device region, the isolation layer-3 covers from the edge to a portion of the top n-type layer.

A reflection metal layer is formed on the sidewall enhanced metal reflection layer of the short circuit light emitting device, the n-type layer of the short circuit light emitting device, a portion of the isolation layer-3 in the street region, and a portion of the isolation layer-3 in the trench region. The reflection metal layer also formed on a portion of the n-type layer of the formal function light emitting device, and a portion of the isolation layer-3 of the formal function light emitting device.

An n-pad is formed on the reflection metal layer of the formal function light emitting device. The n-pad could be option formed on a portion of the n-type layer of the formal function light emitting device. A p-pad is formed on the reflection metal layer of the short circuit light emitting device.

An aperture P region on a portion of top n-type layer is formed to emit the output light. A light collection module formed around the aperture P region to collect and guide the output light. A bump 104 formed on the p-pads, and the n-pads to each one micro light emitting device.

Figure 26:
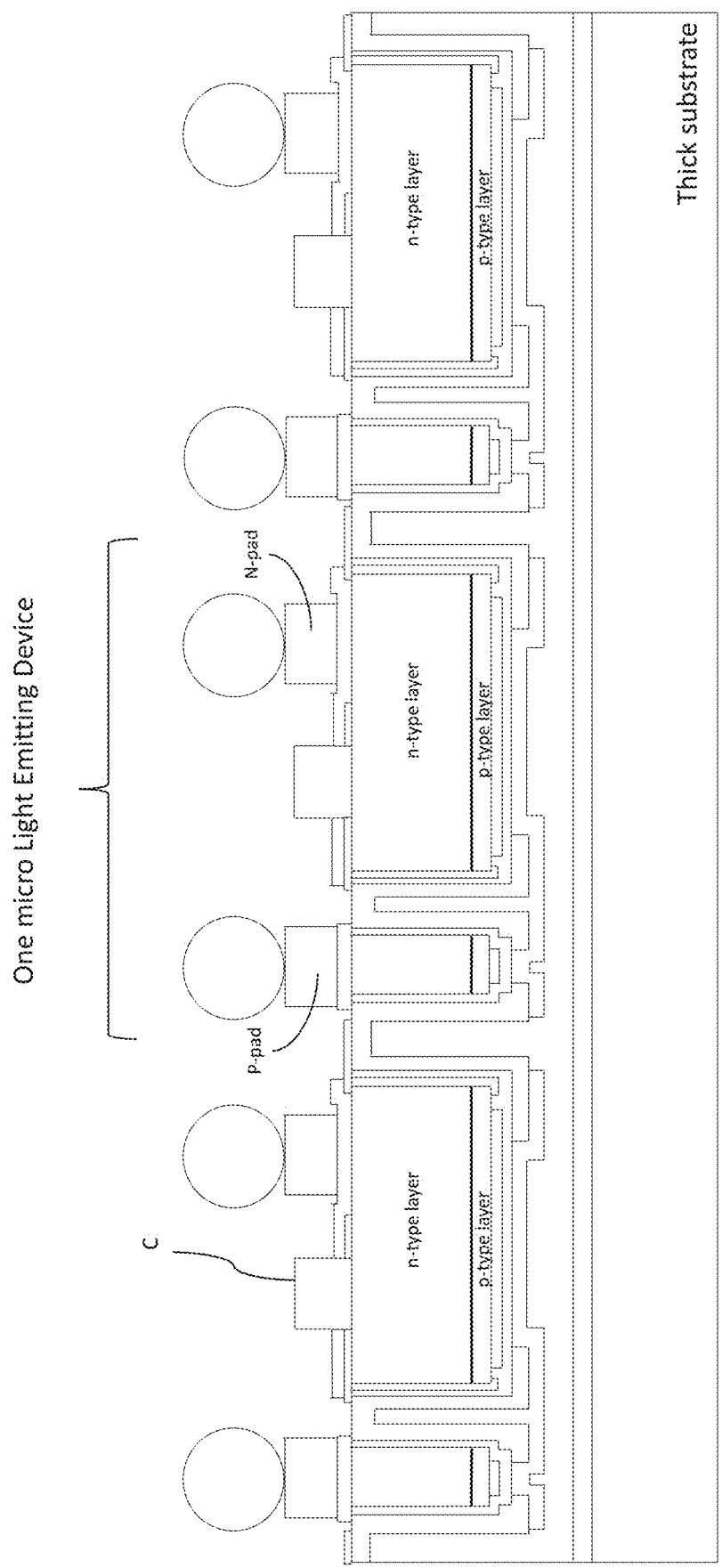
FIG. 26 is the scheme about a light collection module according to an embodiment of FIG. 25.

FIG. 26 is the scheme about a light collection module according to an embodiment of FIG. 25. The light collection module C could be a micro lens. The micro lens could be formed on top of the aperture P region to refract the aperture P output light. The output light could be focus on a target point to collimate the light to a 45 degree reflector in an optical interconnection substrate (not shown in here). The 45 degree reflector could reflect the focus light into an optical waveguide channel. In another aspect, the light collection module C could be an angle-selective filters to reduce the divergence angle of the light emitted from the aperture P. In another aspect, the light collection module C could be a distributed Bragg reflector (DBR) structure or a resonant cavity structure to select the optical wavelength and light angle.

Figure 27:
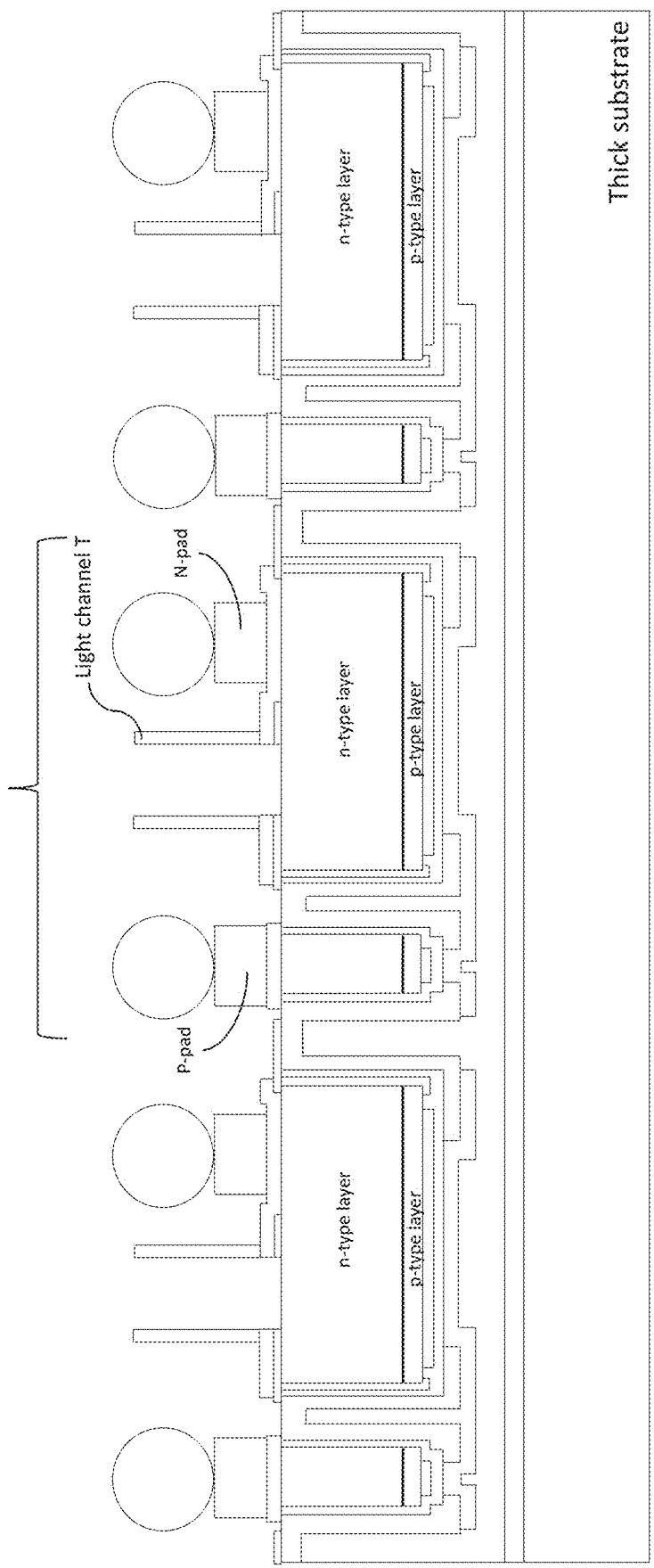
FIG. 27 is a light channel as the light collection module of FIG. 25.

In another one embodiment, FIG. 27 is the scheme about a light collection module C according to an embodiment of FIG. 25. The light collection module C is satisfied by a light channel T. The light channel T could be formed on top of the reflection metal layer around the aperture P region. Please note that the light channel T could be also around the aperture P region option to form on the n-type layer of the formal function light emitting device. In addition, the light channel T could be also around the aperture P region formed on a portion of the isolation layer-3 and a portion of the n-type layer of the formal function light emitting device. Moreover, the light channel T has an inner wall. In this embodiment, the inner wall coated a reflective material.

Figure 28:
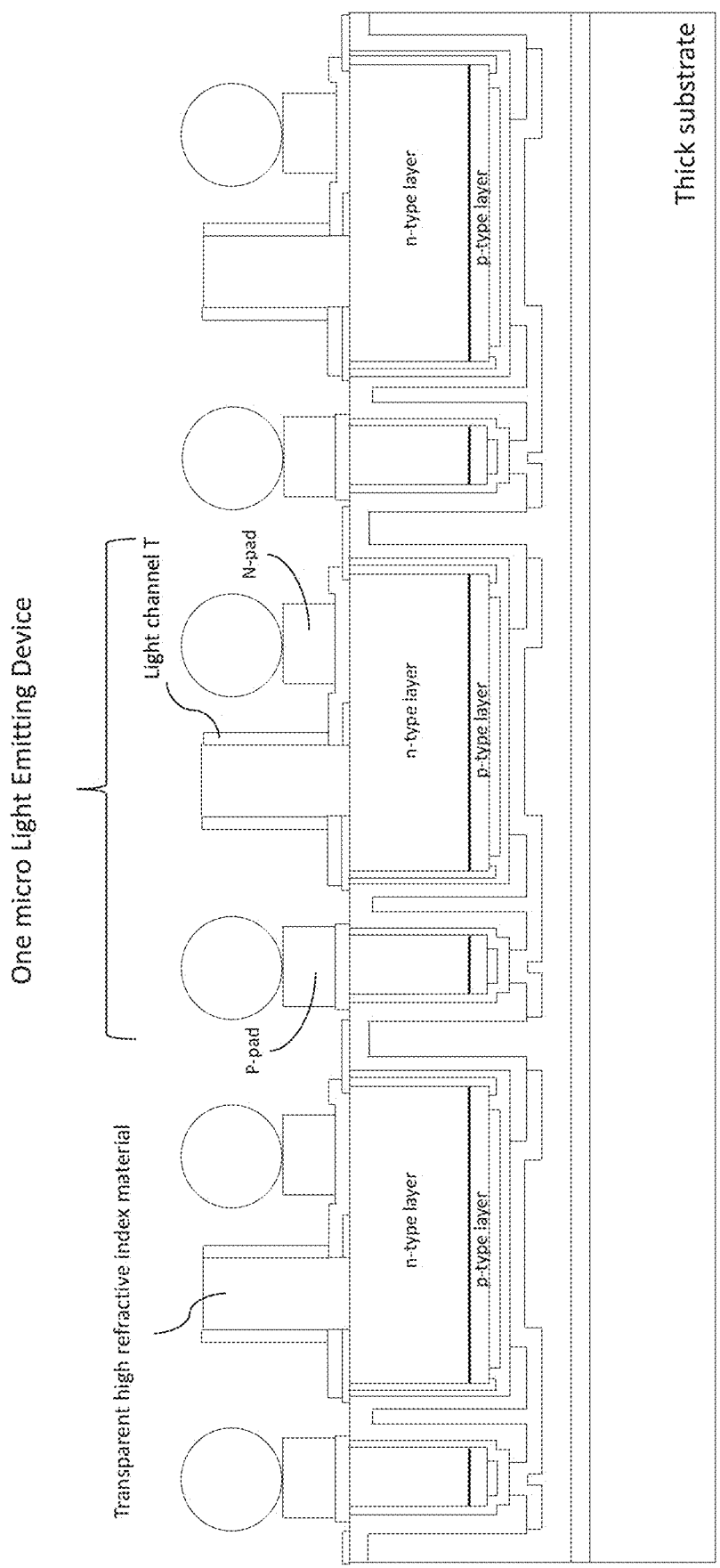
FIG. 28 is a transparent high refractive index material filled into the light channel of FIG. 27.

In another one embodiment, a transparent high refractive index material could be option filled into the light channel. FIG. 28 illustrates a transparent high refractive index material fill into the light channel of FIG. 27 structure. Please note that the height of the transparent high refractive index material is the same height level of the light channel height. In another option embodiment (not shown in here), the height of the transparent high refractive index material could be shorter than the light channel T height. The top shape of the transparent high refractive index material inside the light channel T could be upside down dome shape. In other words, surface shape of the transparent high refractive index material is controlled according to a material of the light channel T.

Figure 29:
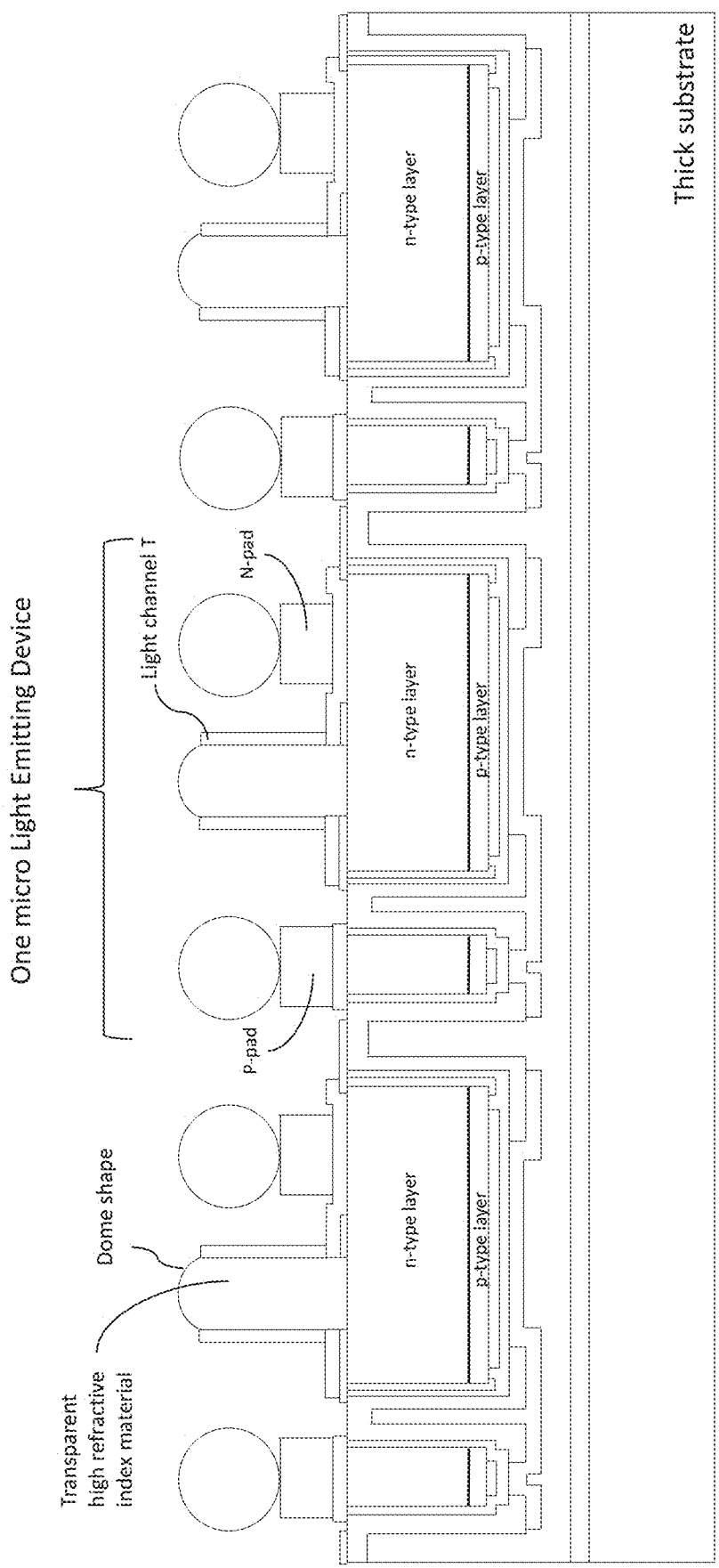
FIG. 29 is the transparent high refractive index polymer optional filled into the light channel and formed a dome shape up to the light channel.

In another one embodiment, FIG. 29 shows the transparent high refractive index material could be optional filled into the light channel T and formed a dome shape up to the light channel T due to the surface tension effect. The dome shape of the transparent high refractive index material could be as a lens on top of the light channel T to collect and focus more light.

Figure 30:
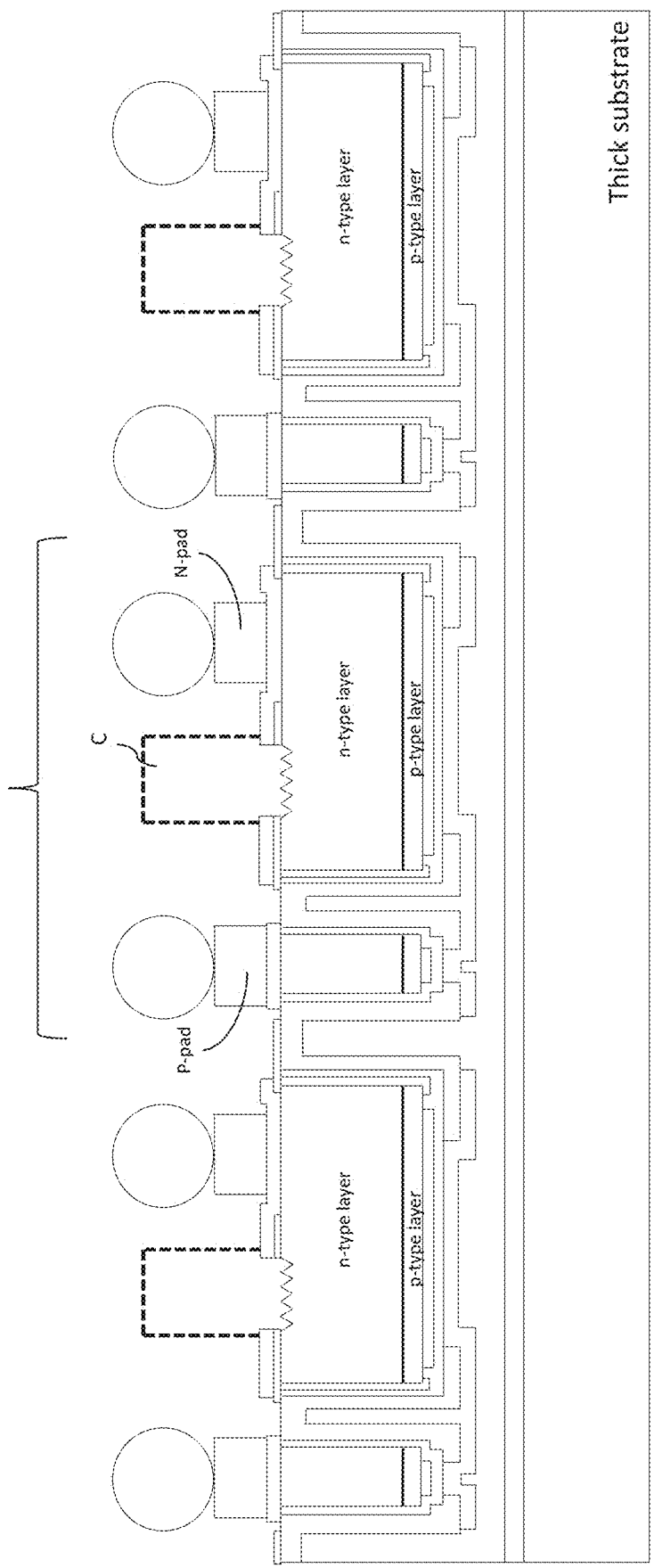
FIG. 30 is the surface roughness of the n-type layer of the formal function light emitting device in aperture region.

In another aspect for more light could be extracted from the aperture P region, a surface roughness of the n-type layer of the formal function light emitting device in the aperture P region could be option formed by chemical etching, drying etching, photon enhanced chemical etching. Now referring to FIG. 30, FIG. 30 shows the aperture P region of the n-type layer of the formal function light emitting device in the aperture P region with surface roughness/texturing. The light could be extracted more through the surface roughness/texturing to obtain higher light output power. Please note that the surface roughness could be option formed on major portion of the n-type layer of the formal function light emitting device including the surface underneath of a portion of reflection metal layer, and a portion of the isolation layer-3 (which is not shown in here). In some particular, the surface roughness could be formed initially on the n-type layer when the epitaxy growth substrate is patterning sapphire substrate.

An aperture P region on a portion of the top n-type layer is formed to emit the output light. A light collection module formed around the aperture P region to collect and guide the output light. A bump 104 formed on the p-pads, and the n-pads to each one micro light emitting device.

Figure 31:
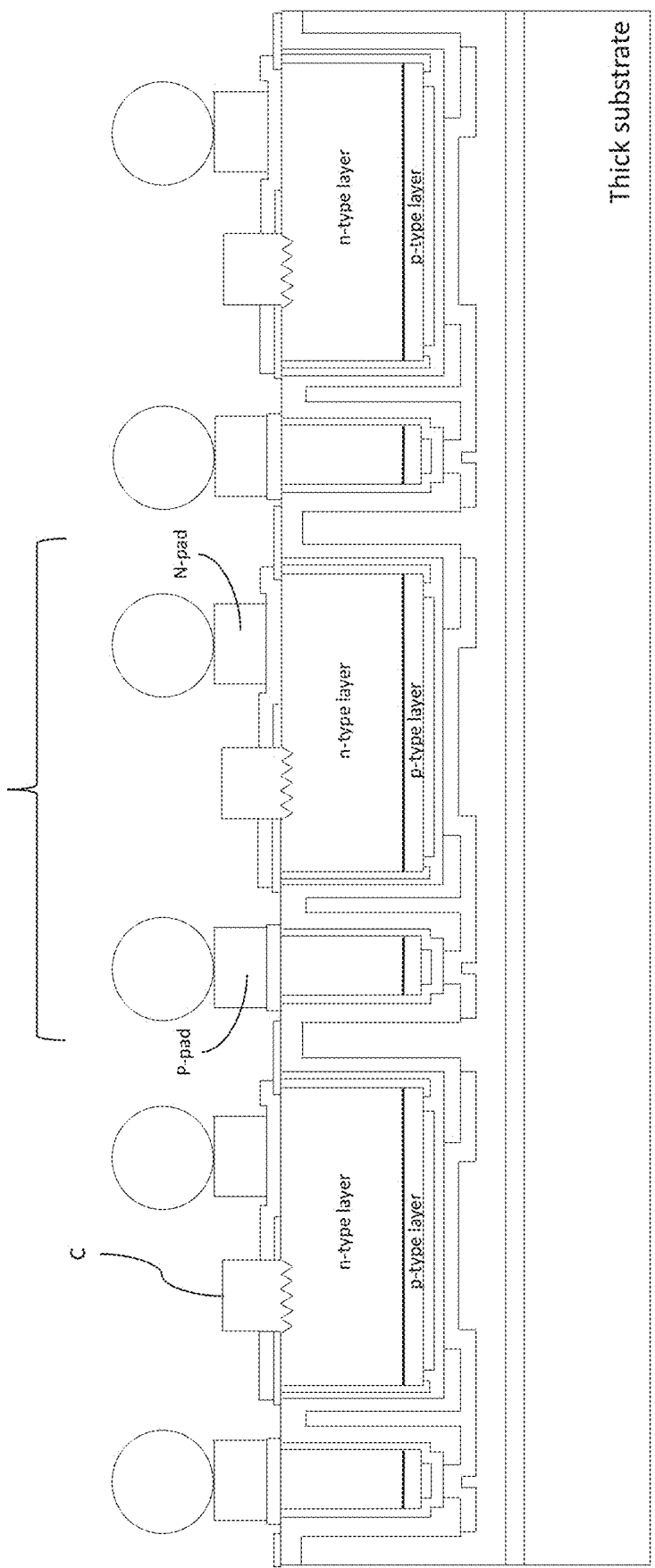
FIG. 31 is the scheme about a light collection module according to an embodiment of FIG. 30.

In one embodiment, FIG. 31 is the scheme about a light collection module according to an embodiment of FIG. 30. The light collection module C could be a micro lens. The micro lens could be formed on top of the aperture P region to refract the aperture P output light. The output light could be focus on a target point to collimate the light to a 45 degree reflector. The 45 degree reflector could reflect the focus light into an optical waveguide channel. In another aspect, the light collection module C could be an angle-selective filters to reduce the divergence angle of the light emitted from the aperture P. In another aspect, the light collection module C could be a distributed brag reflector (DBR) structure or a resonant cavity structure to select the optical wavelength and light angle.

Figure 32:
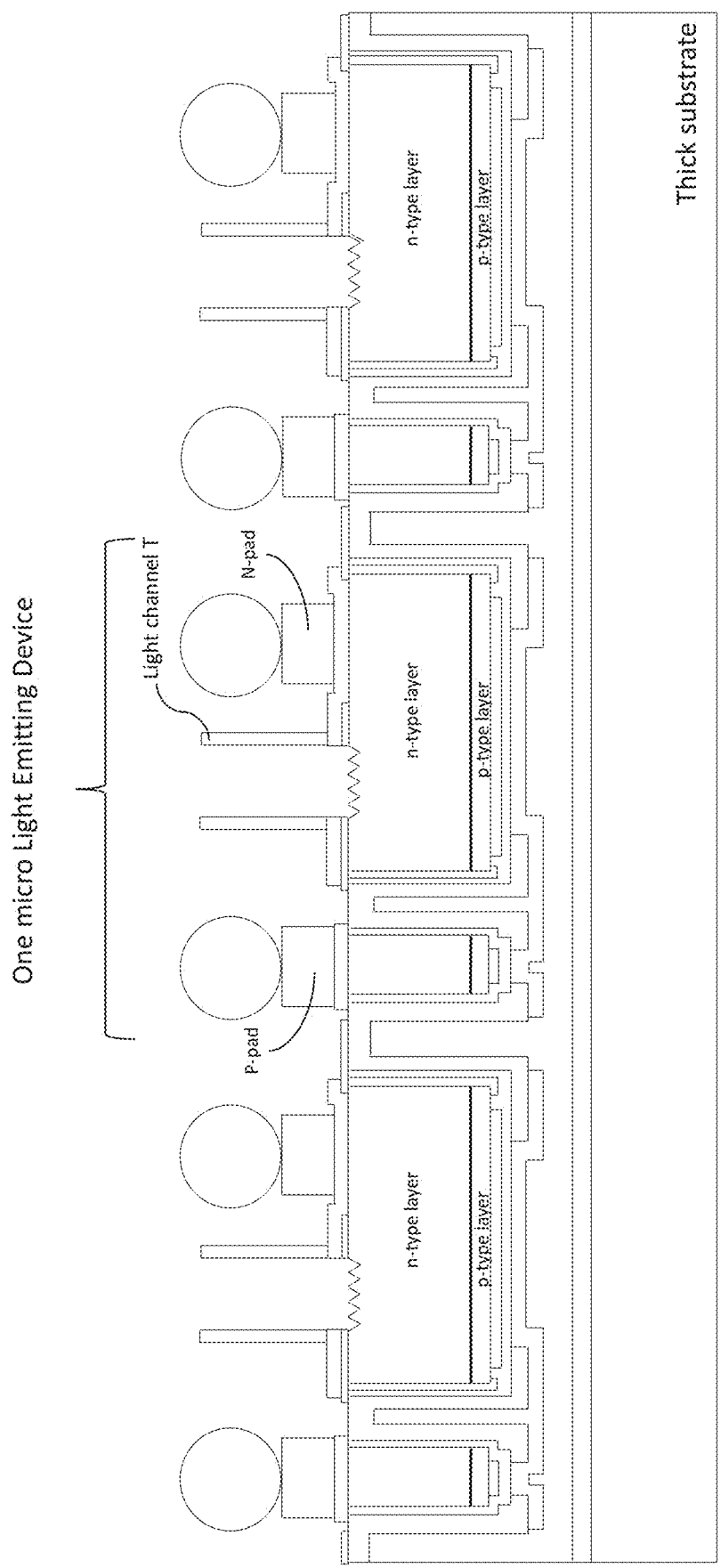
FIG. 32 is a light channel as the light collection module of FIG. 30.

FIG. 32 is a light channel T as the light collection module C of FIG. 30. The light channel T could be formed on top of the reflection metal layer around the aperture P region. Please note that the light channel T could be also around the aperture P region option to form on the n-type layer of the formal function light emitting device. In addition, the light channel T could be also around the aperture P region formed on a portion of the isolation layer-3 and a portion of the n-type layer of the formal function light emitting device. Moreover, the light channel T has an inner wall. In this embodiment, the inner wall coated a reflective material.

Figure 33:
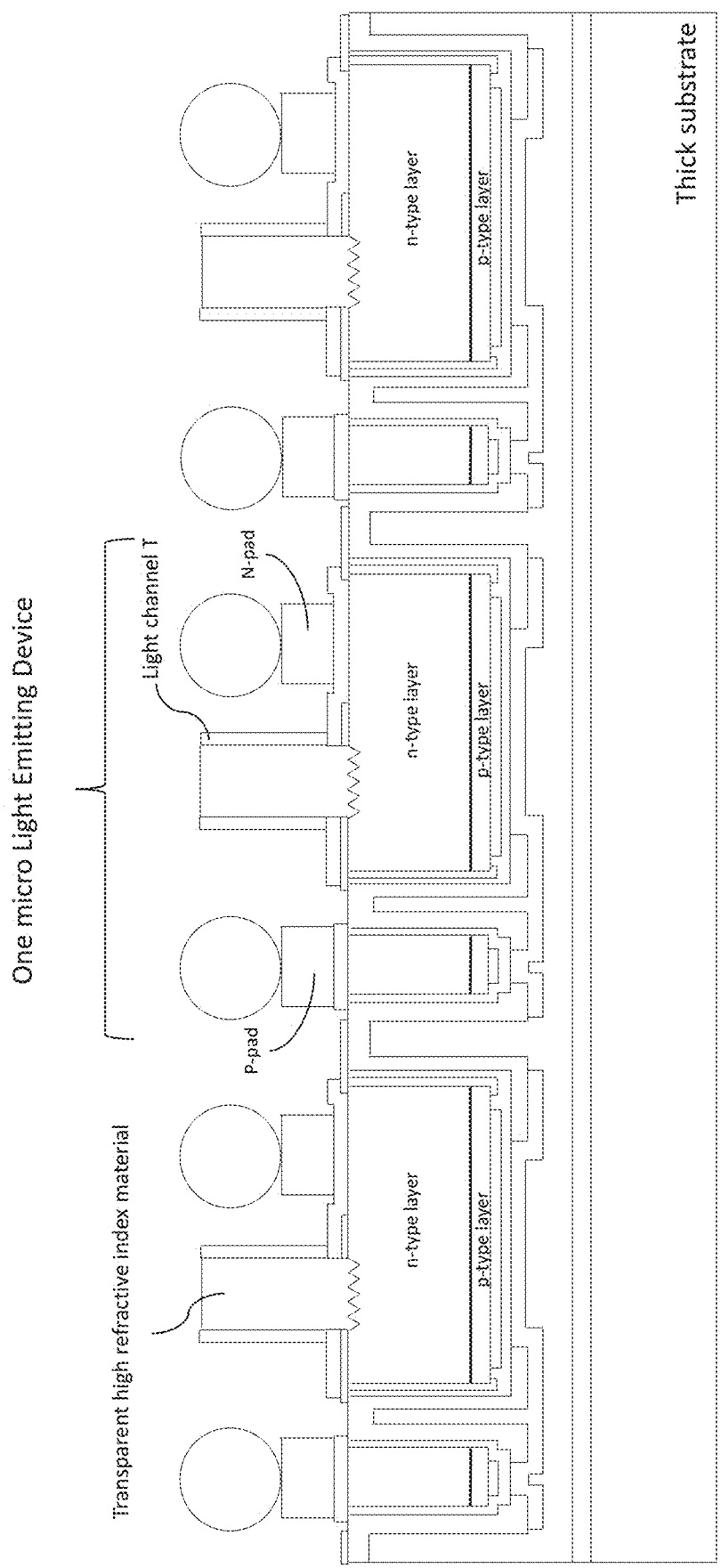
FIG. 33 is a transparent high refractive index material filled into the light channel of FIG. 32.

In another one embodiment, a transparent high refractive index material could be option filled into the light channel T. FIG. 33 is a transparent high refractive index material filled into the light channel T of FIG. 32. Please note that the height of the transparent high refractive index material is the same height level of the light channel T height. In another option embodiment (not shown in here), the height of the transparent high refractive index material could be shorter than the light channel T height. The top shape of the transparent high refractive index material inside the channel could be upside down dome shape. In other words, surface shape of the transparent high refractive index material is controlled according to a material of the light channel T.

Figure 34:
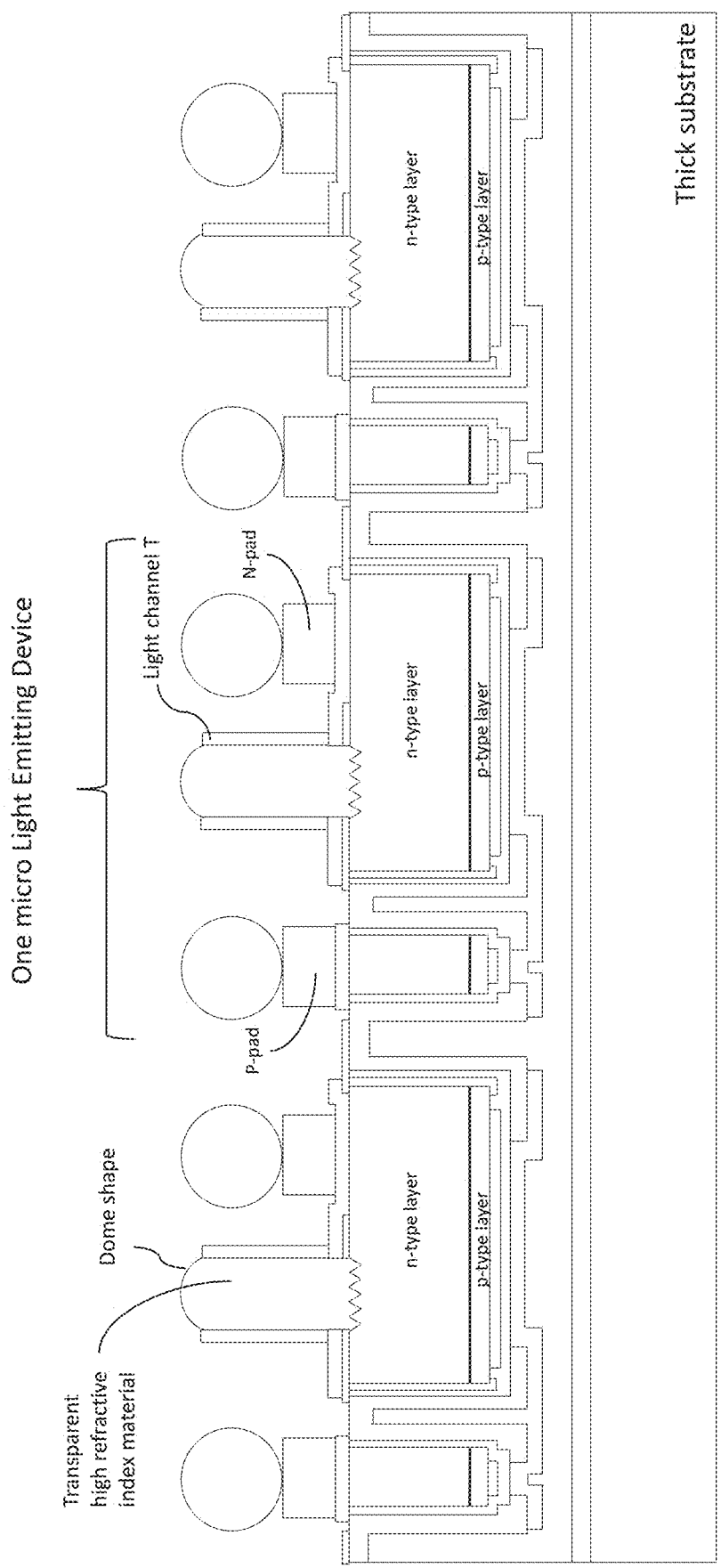
FIG. 34 is the transparent high refractive index polymer optional filled into the light channel and formed a dome shape up to the light channel.

In another one embodiment, FIG. 34 shows the transparent high refractive index material could be optional filled into the light channel T and formed a dome shape up to the light channel T due to the surface tension effect. The dome shape of the transparent high refractive index material could be as a lens on top of the light channel T to collect and focus more light.

Now, referring from FIG. 15 to FIG. 34, the isolation layer-1, the isolation layer-2, and the isolation layer-3, could be deposited by dielectric material such as $SiO_x$, $Si_xN_y$, $Al_2O_3$, $TiO_2$ using plasma enhance chemical vapor deposition, chemical vapor deposition, physical vapor deposition, atomic layer deposition. Please note that the isolation layer-2 could be multiple dielectrics having high/low refractive index such as distributed Bragg reflector (DBR) structure to provide a dielectric reflection layer on the side wall of the micro light emitting device. The isolation layer could be optional selected from polymer such as polyimide, silicone, and epoxy. The isolation layer-1, layer-2 and layer-3 could be a polymer. Moreover, the isolation layer-1, layer-2 and layer-3 could be combined by multiple layers such as dielectric material and polymers.

For high speed modulation, reduction of the capacitor effect is one of a key factor to increase the response time. In one micro light emitting device, the active layer between one p-type layer and one n-type layer is a capacitor effect area. Now, referring from FIG. 15 to FIG. 34, the reflection layer underneath of a major portion of the p-type layer could be a reflective metal layers such as, TCL, Ti, Cr, Ni, Ag, Al, Au, Cu, Ni/Ag, Ni/Ag/Ni/Au, Ti/Ag/Ni/Au, Ti/Al/Ni/Au, Cr/Al/Ni/Au, or their metal combination. In another aspect, the reflective metal layers as a p-type ohmic contact metal could be formed underneath a specific region of the p-type layer. A good p-type ohmic contact provide a low resistant contact to allow the current only injection into a specific region. The specific region underneath the p-type layer is purposed to confine the current only spreading to the specific region in the micro light emitting device and reduce the capacitor effect of the active layer. The specific region could be formed aligning to the relative aperture P region. The specific region could be larger than that of the relative aperture P region. In another aspect, after forming the metal layers in the specific region, additional reflection layer could be formed to cover the specific portion metal layers. The additional reflection layer could be a p-type non-ohmic contact reflective metal layers. In another aspect, the isolation layer-2 could be formed to the p-type layer beside the specific region to provide an insulation p-type contact. The reflection layer of reflective p-type ohmic contact metal layers could be formed to cover the isolation layer-2 and the p-type layer in the specific region. In addition, the additional reflection layer could be a DBR structure or a resonant cavity structure. In some particular case, the reflection layer could be a DBR structure and could be formed first underneath of a portion of the p-type layer. The DBR structure forming region could be aligned to the aperture P region to form a resonant cavity structure. In option, the DBR structure could be formed to the region beside the relative aperture P region. After forming the DBR structure underneath the p-type layer, additional reflective p-type ohmic contact metal layers could be formed to cover the DBR structure as a multiple reflection layer and cover the p-type layer to allow the current injection.

Figure 35:
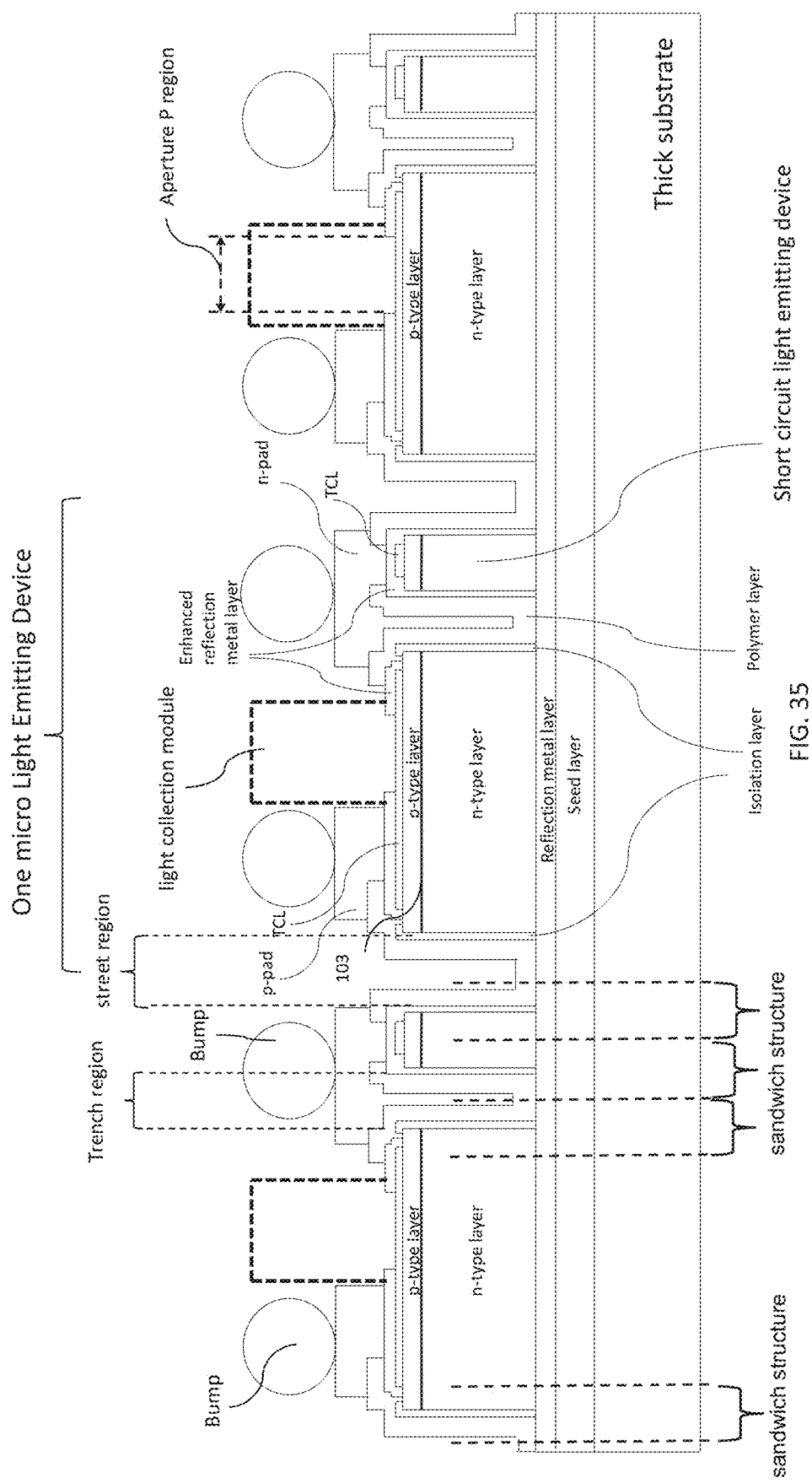
FIG. 35 is the scheme cross section structure of another one vertical current type of multiple semiconductor structures on a thick substrate.

FIG. 35 shows the scheme cross section structure of another one vertical current type of multiple micro light emitting device arrays on a thick substrate. A reflection metal layer and a seed layer formed on top of the thick substrate. A direct bandgap light emitting device epitaxy structure consists of an initial growth epi layer (n-type layer), an active layer and a p-type layer. The n-type layer formed on the reflection metal layer.

In one micro light emitting device region, a portion of the p-type layer, a portion of the active layer and a portion of the n-type layer are complete removed to separate one micro light emitting device into two light emitting device parts. For one micro light emitting device, one is the major part of the formal function light emitting device, located at the left hand side, the other one is the minor part of the short circuit light emitting device, located at right hand side. The separation region could be called as trench region.

For the formal function light emitting device part, a transparent contact layer (TCL) is formed on a portion of the p-type layer, and an isolation layer covers on the edge of each micro light emitting device in the street region and in the trench region. An enhanced reflection metal layer covers onto a portion of the TCL, a portion of the p-type layer, and the isolation layer. A polymer layer covered a portion of the enhanced reflection metal layer, the p-type layer, and the isolation layer. The polymer layer also covers the sidewall isolation layer in the trench region to form the polymer layer and the semiconductor layer sandwich to the isolation layer structure.

For the short circuit light emitting device part, the light emitting device consists of a transparent contact layer (TCL) is formed on a portion of the p-type layer, an enhanced reflection metal layer covers the TCL and the sidewall of the short circuit light emitting device including the edge p-type layer, the edge active layer, and the edge n-type layer. Please note that a particular case of the enhanced reflection layer could be selected to only cover a portion of the sidewall of the short circuit light emitting device. In another aspect, the short circuit light emitting device could be formed by connecting a metal layer to a portion of the etched p-type layer, and a portion of the etched active layer, in one short circuit light emitting device region.

A polymer layer covered the enhanced reflection metal layer, p-type layer, and the entire enhanced reflection metal layer including the sidewall of the short circuit light emitting device. The polymer also covers the entire street region to form the polymer layer and the micro light emitting device sandwich to the sidewall enhanced reflection metal layer structure. The polymer layer also covers the sidewall enhanced reflection metal layer in trench region to form the polymer layer and the semiconductor layer sandwich to the enhanced reflection metal layer structure. After forming the polymer layer, a portion of the enhance reflection metal layer is exposed in the formal function light emitting device part and a portion of the enhance reflection metal layer is exposed in the short circuit light emitting device part. A p-pad is formed on the enhanced reflection metal layer of the formal function light emitting device and n-pad is formed on top of the enhanced metal layer of the short circuit light emitting device.

The current could be driven from the p-pad, through the enhanced reflection metal layer of the formal function light emitting device, the TCL of the formal function light emitting device, the p-type layer, the active layer, the n-type layer, the reflection metal layer, the short circuit light emitting device to the n-pad. Please note that for the micro light emitting device in the micro light emitting device array module has the common cathode structure of the reflection metal layer in this embodiment. Thus, the numbers of n-pads could be reduced to be one single short circuit light emitting device and one single n-pad structure in one micro light emitting device array module of this embodiment.

An aperture P region on a portion of the top TCL is formed to emit the output light. A light collection module formed around the aperture P region to collect and guide the output light. A bump 104 formed on the p-pads, and the n-pads to each one micro light emitting device.

Figure 36:
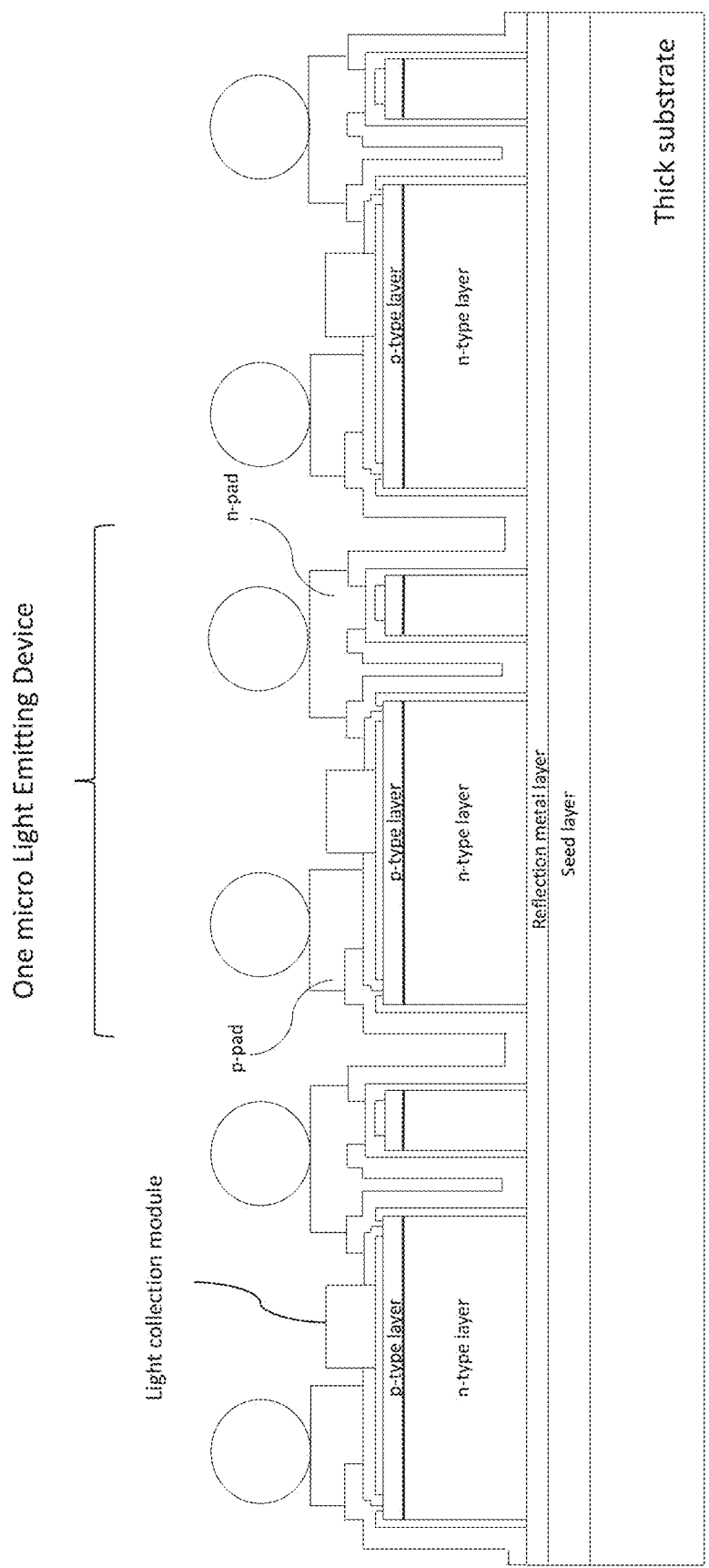
FIG. 36 is the scheme about a light collection module according to an embodiment of FIG. 35.

In one embodiment, FIG. 36 is the scheme about a light collection module C according to an embodiment of FIG. 35. The light collection module C could be a micro lens. The micro lens could be formed on top of the aperture P region to refract the aperture P output light. The output light could be focus on a target point to collimate the light to a 45 degree reflector in an optical interconnection substrate (not shown in here). The 45 degree reflector could reflect the focus light into an optical waveguide channel. In another aspect, the light collection module C could be an angle-selective filters to reduce the divergence angle of the light emitted from the aperture P. In another aspect, the light collection module C could be a distributed Bragg reflector (DBR) structure or a resonant cavity structure to select the optical wavelength and light angle.

Figure 37:
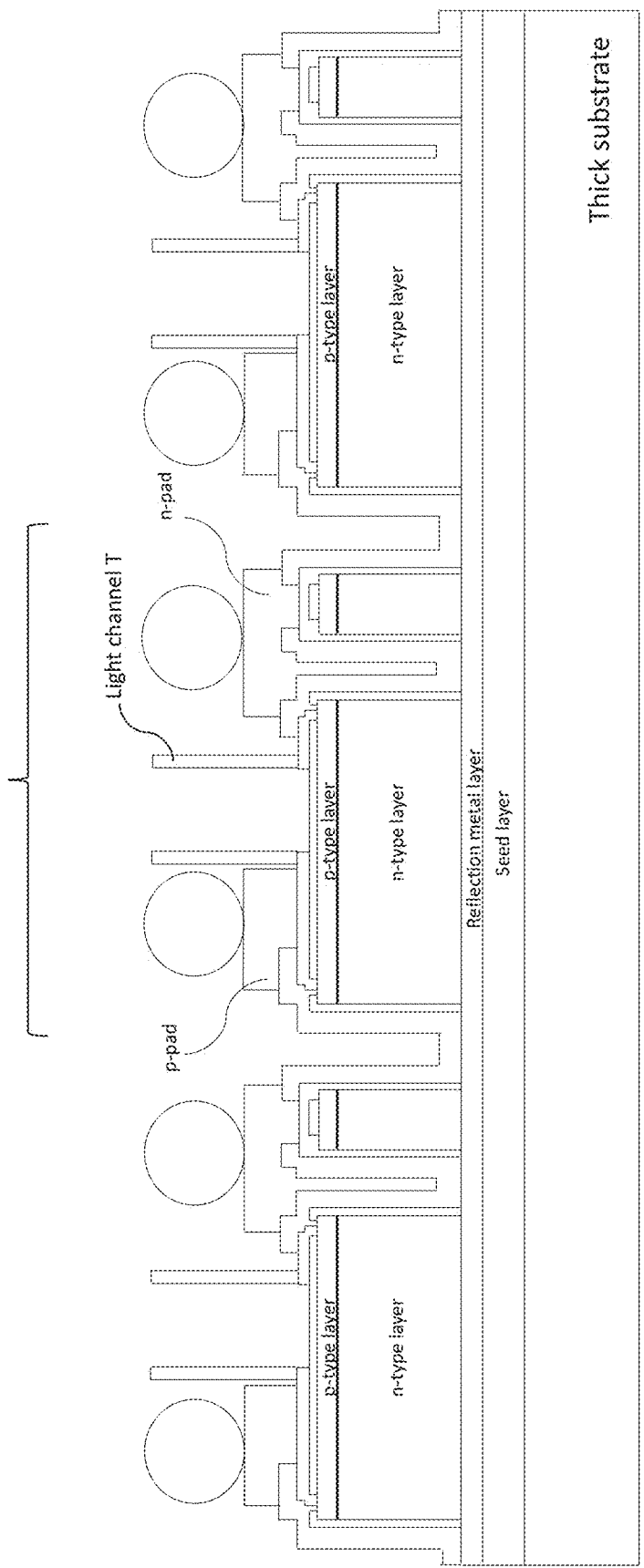
FIG. 37 is is a light channel as the light collection module of FIG. 35.

In another one embodiment, FIG. 37 is the scheme about a light collection module C according to an embodiment of FIG. 35. The light collection module C is satisfied by a light channel T. The light channel T could be formed on top of the enhanced reflection metal layer around the aperture P region. Please note that the light channel T could be also around the aperture P region selected to form on the TCL of the formal function light emitting device. In addition, the light channel T could be also around the aperture P region formed on a portion of the enhanced reflection metal layer and a portion of the TCL of the formal function light emitting device. Moreover, the light channel T has an inner wall. In this embodiment, the inner wall coated a reflective material.

Figure 38:
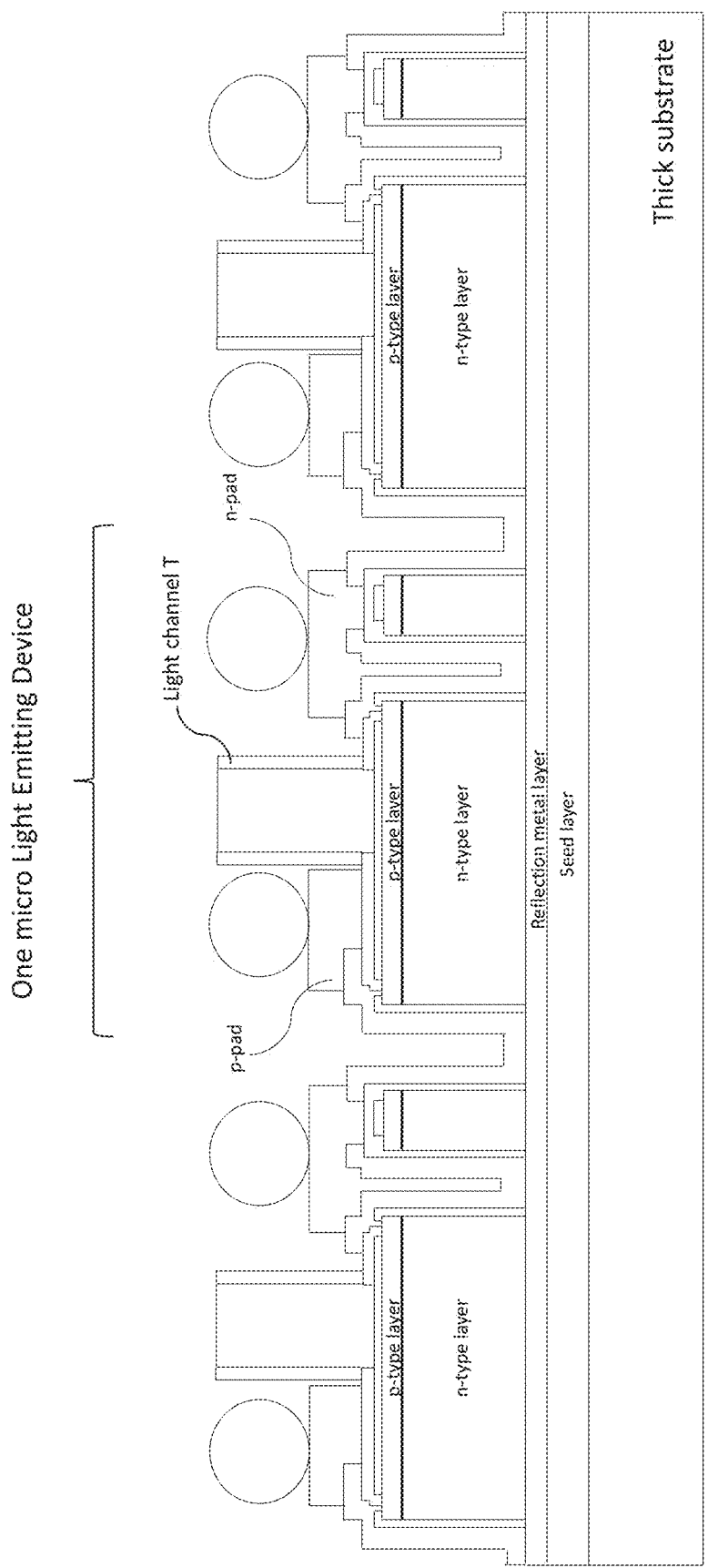
FIG. 38 is a transparent high refractive index material filled into the light channel of FIG. 37.

In another one embodiment, a transparent high refractive index material could be option filled into the light channel T. FIG. 38 is a transparent high refractive index material filled into the light channel T of FIG. 37. Please note that the height of the transparent high refractive index material is the same height level of the light channel T height. In another option embodiment (not shown in here), the height of the transparent high refractive index material could be shorter than light channel T height. The top shape of the transparent high refractive index material inside the channel tube could be upside down dome shape. In other words, surface shape of the transparent high refractive index material is controlled according to a material of the light channel T.

Figure 39:
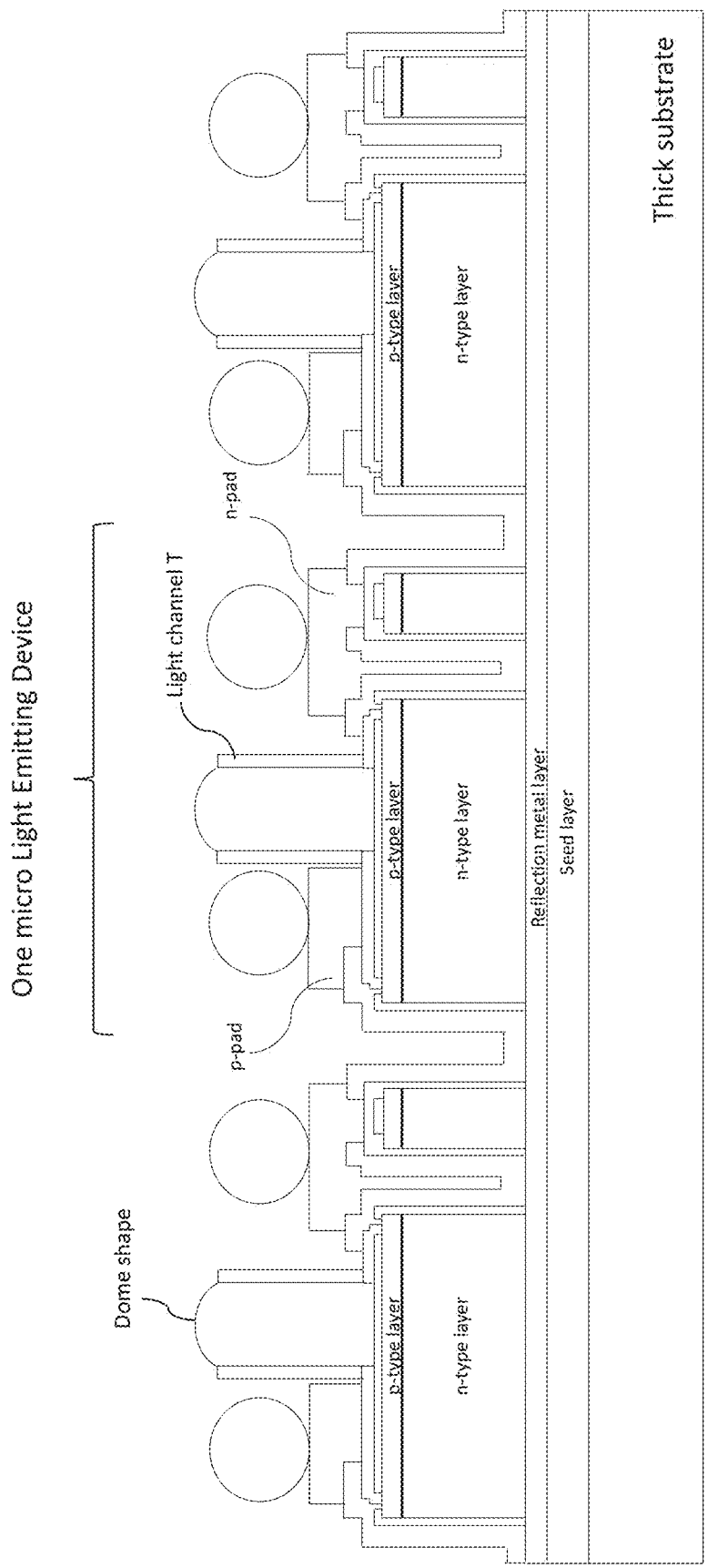
FIG. 39 is the transparent high refractive index polymer optional filled into the light channel and formed a dome shape up to the light channel.

In another one embodiment, FIG. 39 shows the transparent high refractive index material could be optional fill into the light channel T and formed a dome shape up to the light channel T due to the surface tension effect. The dome shape of the transparent high refractive index material could be as a lens on top of the light channel T to collect and focus more light.

Now, referring to FIG. 35 structure, the n-type electrode is electrical conductive connection through the reflection metal layer, and the seed layer. Thus, the numbers of n-pad in FIG. 35 could be reduced to be one single short circuit light emitting device and one single n-pad in one micro light emitting device array module.

Figure 40:
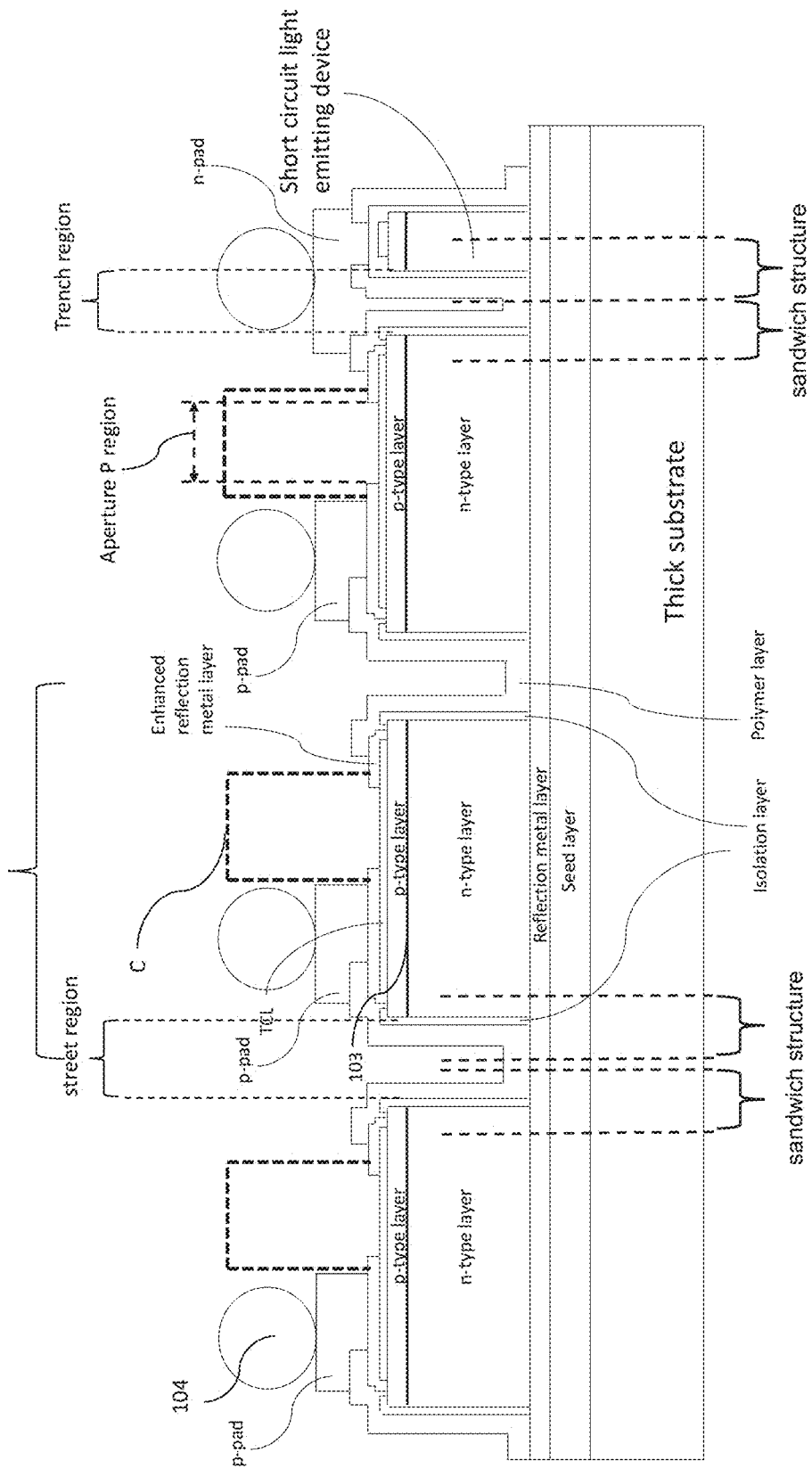
FIG. 40 is another one embodiment of the vertical current type common cathode semiconductor structures on a thick substrate.

FIG. 40 illustrates another one embodiment of the vertical current common cathode type micro light emitting device array on a thick substrate. All the short circuit light emitting device structure in FIG. 35 could be reduced to one single short circuit light emitting device on the thick substrate. Thus, each micro light emitting device emitting area of the vertical current common cathode type micro light emitting device array could be enlarged to perform more light output characteristics. Please note that the one short circuit light emitting device could be designed to locate at suitable position within one micro light emitting device array module based on the demand pads of micro light emitting device module application.

An aperture P region on a portion of the top TCL is formed to emit the output light. A light collection module formed around the aperture P region to collect and guide the output light. A bump 104 formed on the p-pads, and the n-pads to each one micro light emitting device.

Figure 41:
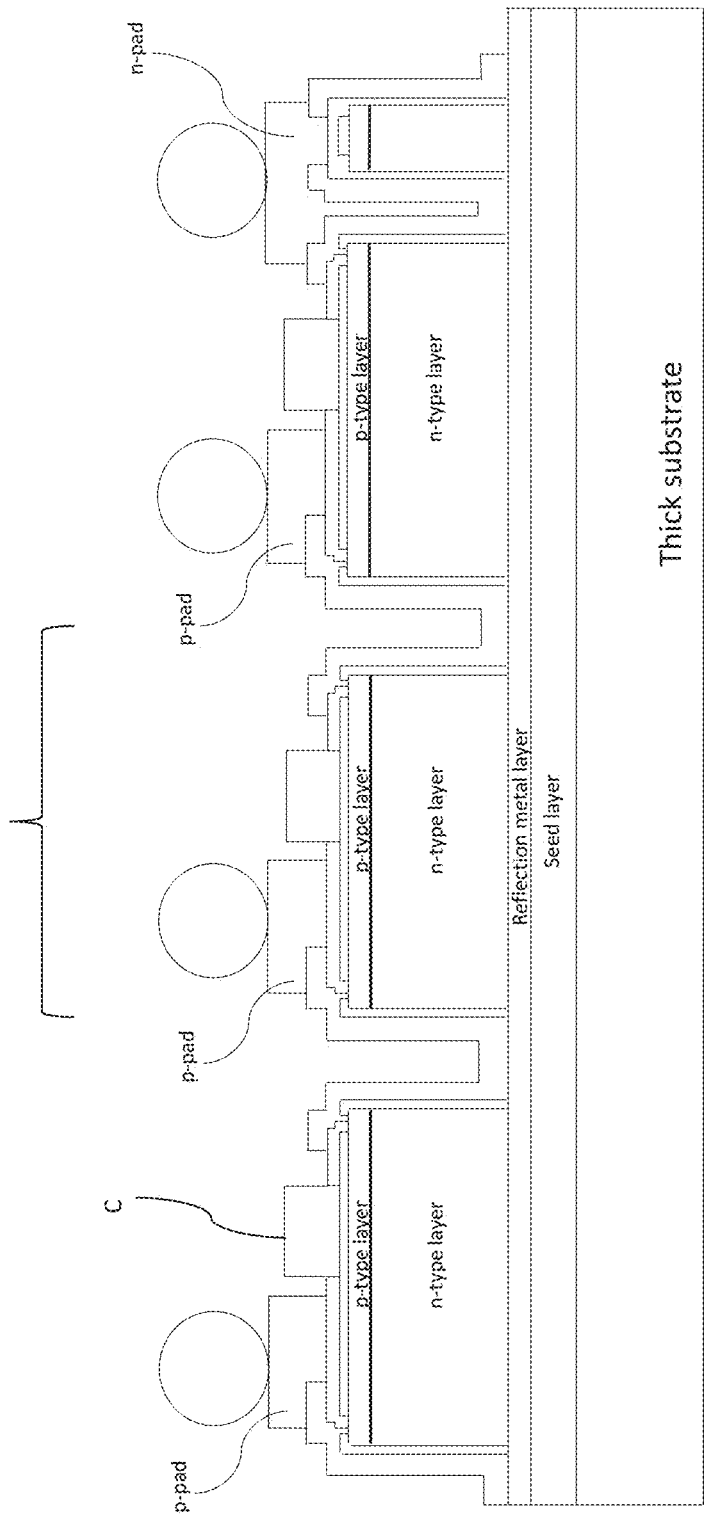
FIG. 41 is the scheme about a light collection module according to an embodiment of FIG. 40.

In one embodiment, FIG. 41 is the scheme about a light collection module according to an embodiment of FIG. 40. The light collection module C could be a micro lens. The micro lens could be formed on top of the aperture P region to refract the aperture P output light. The output light could be focus on a target point to collimate the light to a 45 degree reflector in an optical interconnection substrate (not shown in here). The 45 degree reflector could reflect the focus light into an optical waveguide channel. In another aspect, the light collection module C could be an angle-selective filters to reduce the divergence angle of the light emitted from the aperture P. In another aspect, the light collection module C could be a distributed Bragg reflector (DBR) structure or a resonant cavity structure to select the optical wavelength and light angle.

Figure 42:
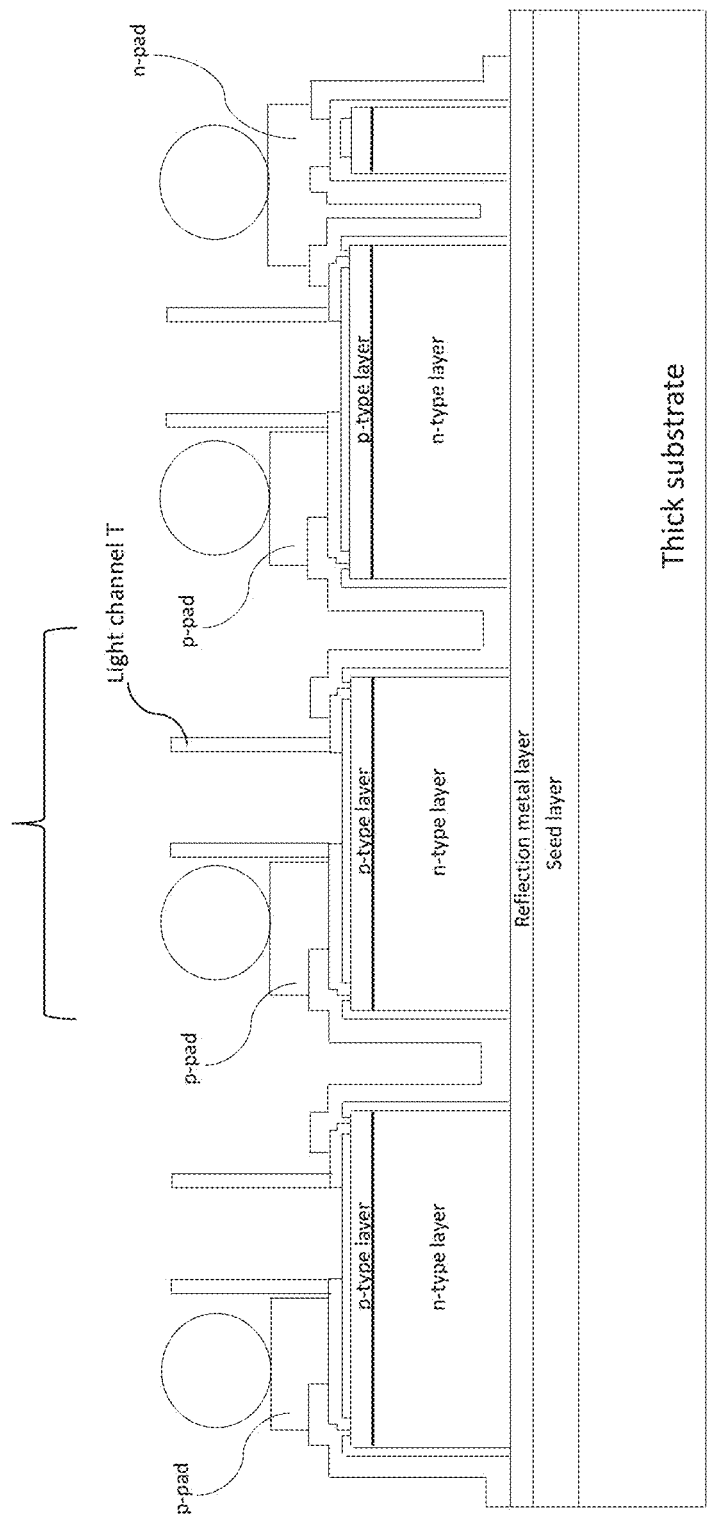
FIG. 42 is a light channel as the light collection module of FIG. 40.

In another one embodiment, FIG. 42 is the scheme about a light collection module C according to an embodiment of FIG. 40. The light collection module C is satisfied by a light channel T. The light channel T could be formed on top of the enhanced reflection metal layer around the aperture P region. Please note that the light channel T could be also around the aperture P region selected to form on the TCL of the formal function light emitting device. In addition, the light channel T could be also around the aperture P region formed on a portion of the enhanced reflection metal layer and a portion of the TCL of the formal function light emitting device. Moreover, the light channel T has an inner wall. In this embodiment, the inner wall coated a reflective material.

Figure 43:
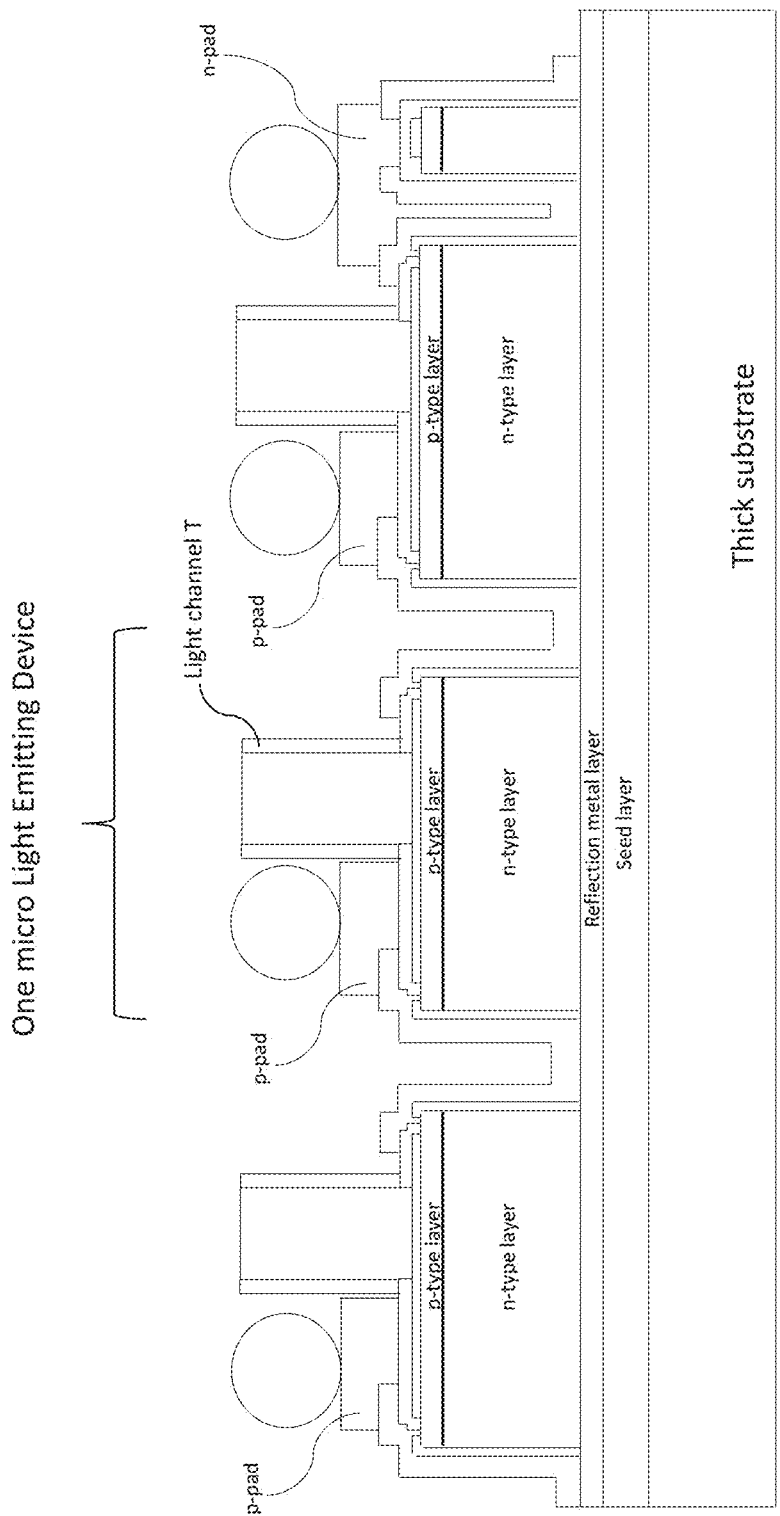
FIG. 43 is a transparent high refractive index material filled into the light channel of FIG. 42.

In another one embodiment, a transparent high refractive index material could be option filled into the light channel T. FIG. 43 illustrates a transparent high refractive index material filled into the light channel T of FIG. 42. Please note that the height of the transparent high refractive index material is the same height level of the light channel T height. In another option embodiment (not shown in here), the height of the transparent high refractive index material is shorter than the light channel T height. The top shape of the transparent high refractive index material inside the channel could be upside down dome shape. In other words, surface shape of the transparent high refractive index material is controlled according to a material of the light channel T.

Figure 44:
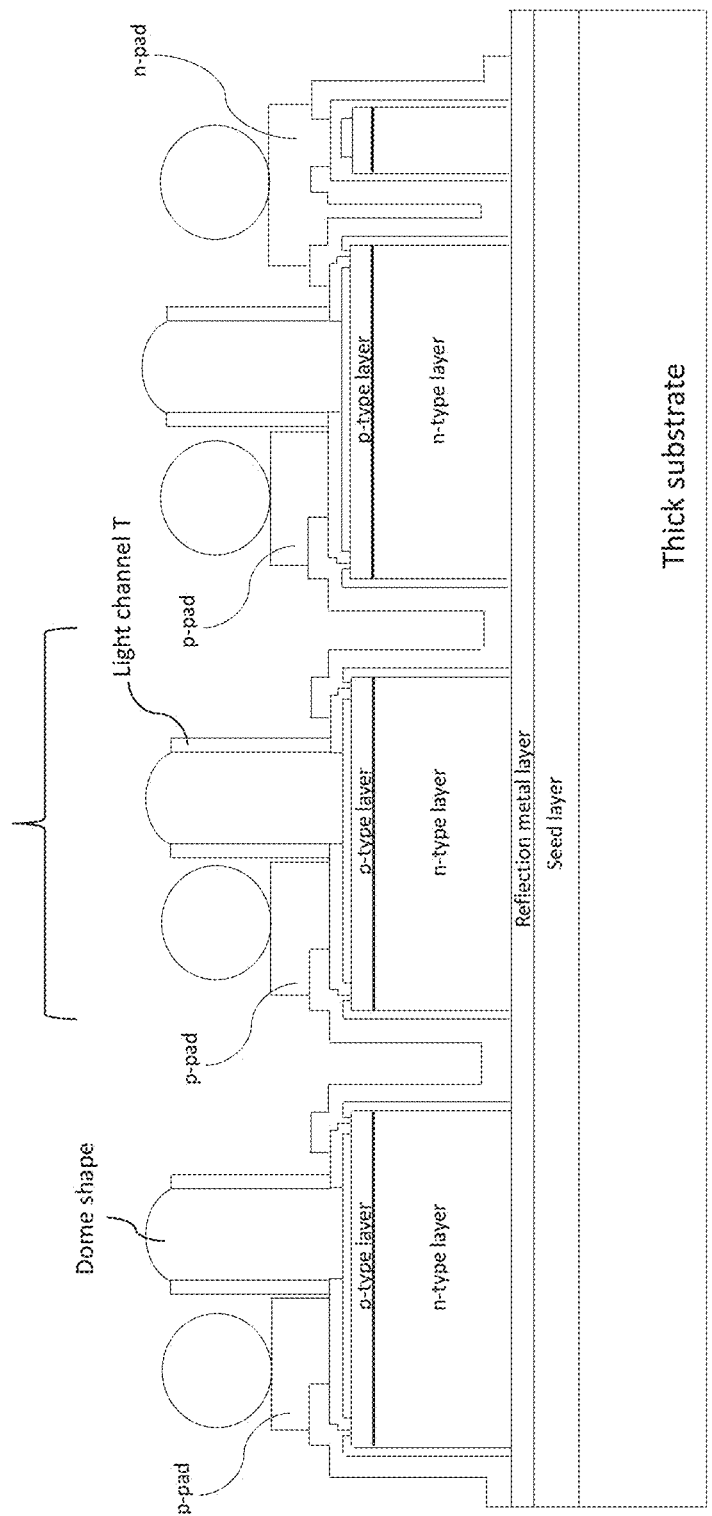
FIG. 44 is the transparent high refractive index polymer optional filled into the light channel and formed a dome shape up to the light channel.

In another one embodiment, FIG. 44 shows the transparent high refractive index material could be optional filled into the light channel T and formed a dome shape up to the light channel T due to the surface tension effect. The dome shape of the transparent high refractive index material could be as a lens on top of the light channel T to collect and focus more light.

Now, referring from FIG. 35 to FIG. 44, the TCL could be selected from indium tin oxide (ITO), Gallium-doped ZnO (GZO), Indium-Gallium doped ZnO (IGZO), Al-doped zinc oxide (AZO). The thickness of the TCL could be selected from the optical length match one fourth wavelength to output the optimized optical power. The reflection metal layer could be selected from Ti, Cr, Al, Ag, Ni, Cu, Au or mixed these metals to make an alloy layer. The combination metal layers could be such as Ti/Al/Ni/Au, Ti/Al/Ni/Cu, Ti/Ag/Ni/Au, Ti/Ag/Ni/Cu, Cr/Al/Ni/Au. Cr/Ag/Ni/Au.

The isolation layer could be deposited by dielectric material such as $SiO_x$, $Si_xN_y$, $Al_2O_3$, $TiO_2$ using plasma enhance chemical vapor deposition, chemical vapor deposition, physical vapor deposition, atomic layer deposition. Please note that the isolation layer could be multiple dielectrics having high/low refractive index such as distributed Bragg reflector (DBR) structure to provide a dielectric reflection layer on the sidewall of the micro light emitting device. The isolation layer could be optional selected from polymer such as polyimide, silicone, and epoxy. The isolation layer could be option combined by multiple layers such as dielectric material and polymers.

In other embodiments, now, referring from FIG. 35 to FIG. 44, the enhanced reflection metal layer could be optional covered on the isolation layer that is similar to FIG. 10 structure (not shown in here). Thus, the insulation layer of FIG. 10 could be selected to cover the street region, the trench region, and a portion of the n-type layer in FIG. 35 to FIG. 44. The insulation layer could be also covered the entire reflection metal layer in FIG. 35 to FIG. 39 to isolate the micro light emitting device array.

Figure 45:
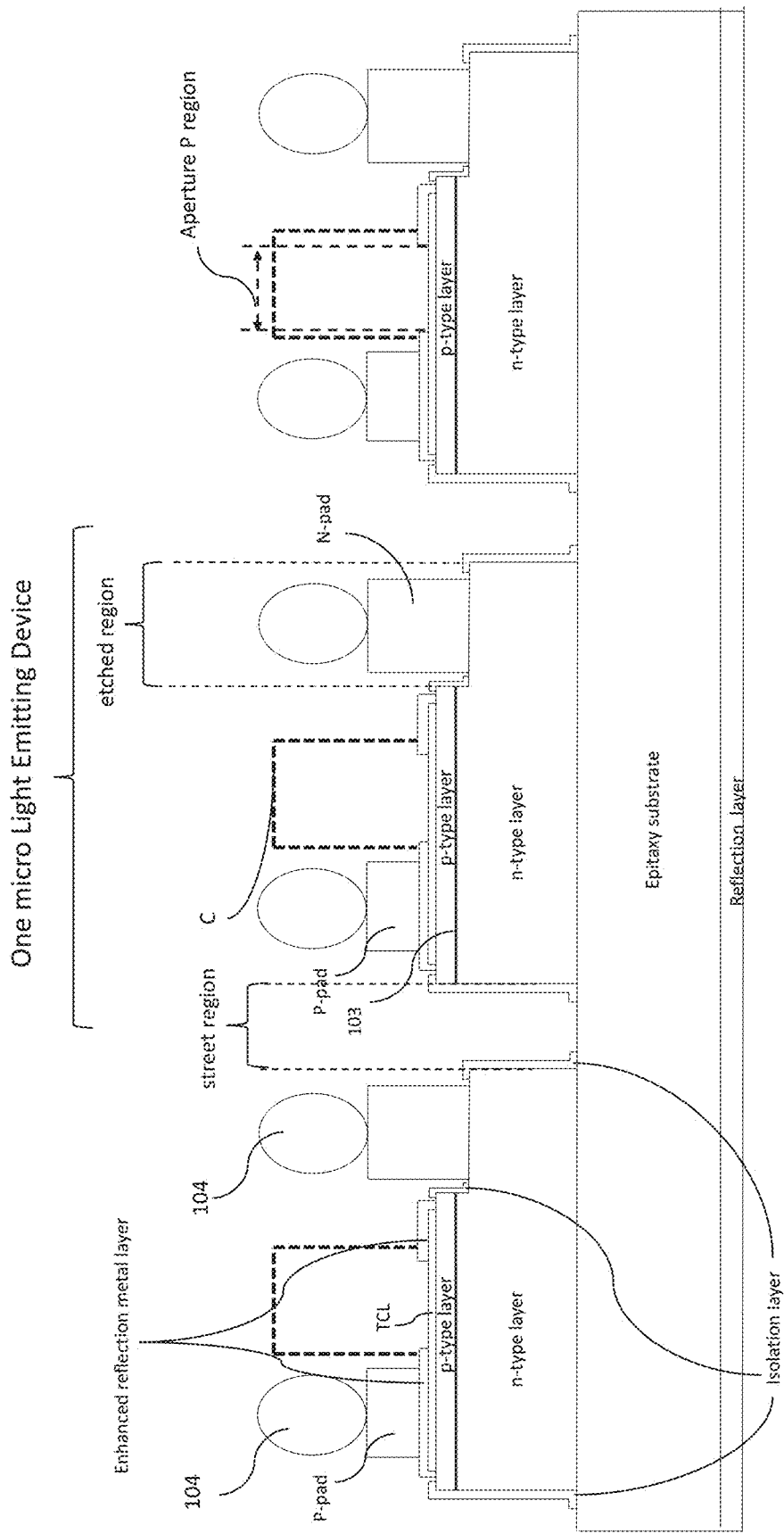
FIG. 45 is another scheme cross section structure of a horizontal current type of multiple semiconductor structures on an epitaxy substrate.

In another embodiment, FIG. 45 shows another scheme cross section structure of a horizontal current type of multiple micro light emitting device array on an epitaxy substrate. A reflection layer formed underneath of the epitaxy substrate. A direct bandgap LED epitaxy structure consists of an initial growth epi layer (n-type layer), an active layer 103, and a p-type layer. The n-type layer formed on the epitaxy substrate. For the micro light emitting device, a transparent contact layer (TCL) is formed on a portion of p-type layer, an enhanced reflection metal layer is formed on top of a portion of the TCL, and an isolation layer covers on the edge of each micro light emitting device in the street region. A portion of the p-type layer, a portion of active layer 103 and a portion of the n-type layer in one micro light emitting device region is removed to expose the n-type layer in the etched region. The isolation layer also cover edge of the etched region, a portion of the p-type layer and the expose n-type layer in the edge of the street region. The isolation layer could be also option cover to a portion of the exposed n-type layer (not shown in here). An aperture P region on a portion of the top TCL is formed to emit the output light. A light collection module C formed around the aperture P region to collect the output light. The micro light emitting device structure also consists a p-pad on a portion of top enhanced reflection metal layer. An n-pad on the exposed n-type layer of the etched region to form an n-type contact. The n-pad could be also option on a portion of top the isolation layer (not shown in here) to increase the n-pad height. A bump 104 formed on the p-pads, and the n-pads to each one micro light emitting device. The isolation layer could be optional selected from polymer such as polyimide, silicone, and epoxy. The isolation layer could be a polymer. Moreover, the isolation layer could be combined by multiple layers such as dielectric material and polymers.

Figure 46:
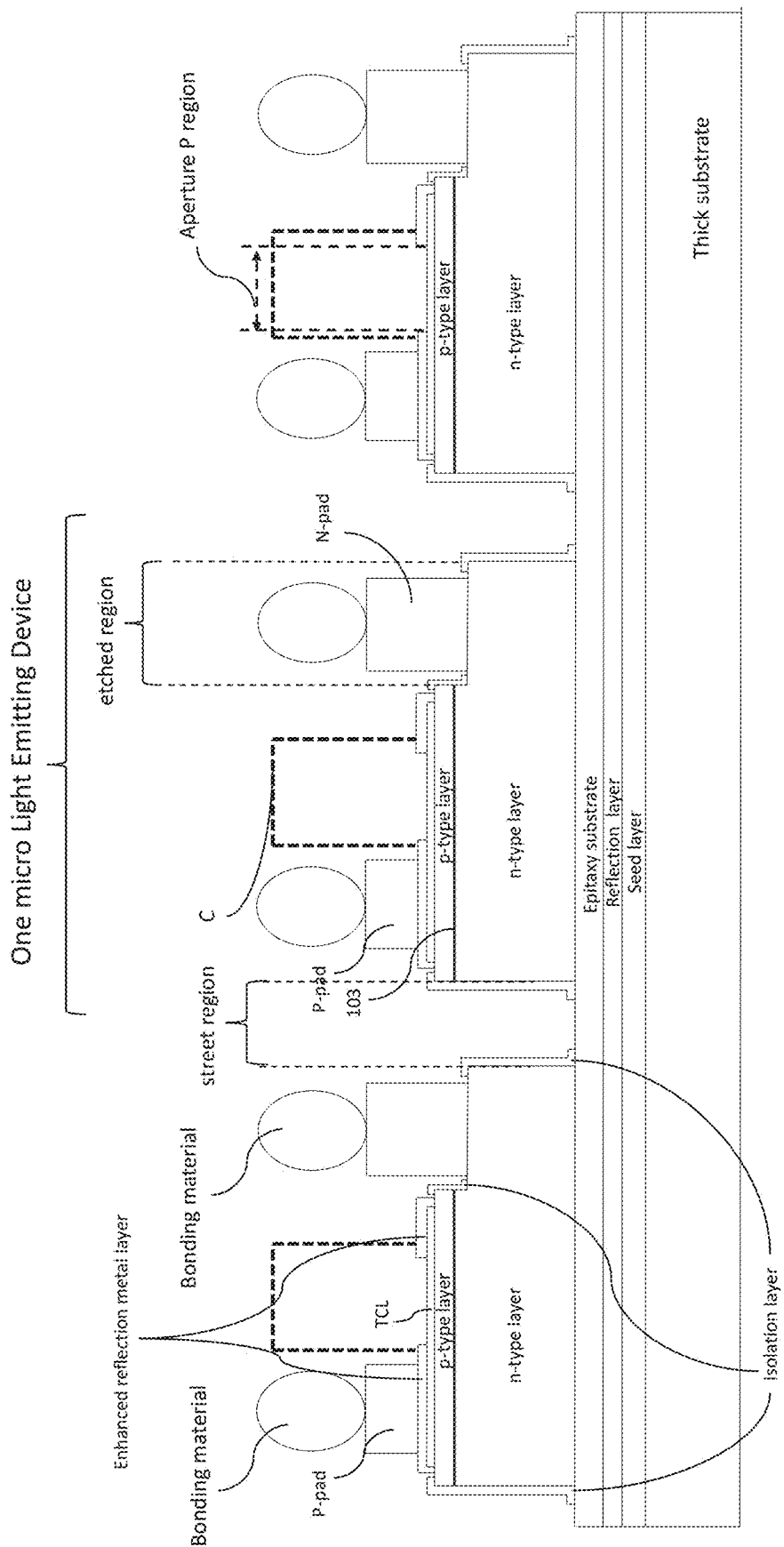
FIG. 46 is another scheme cross section structure of a horizontal current type of multiple semiconductor structures on an epitaxy substrate and a thick substrate.

In another aspect, the epitaxy substrate of FIG. 45 could be thinner, another thick substrate could be formed underneath of the epitaxy substrate to enhance the thickness of micro light emitting device array module to provide a thick carrier characteristic. FIG. 46 shows another one scheme cross section structure of a horizontal current type of multiple micro light emitting device array on an epitaxy substrate and a thick substrate. A reflection layer and a seed layer formed on top of the thick substrate. The epitaxy substrate formed on the reflection layer.

Figure 47:
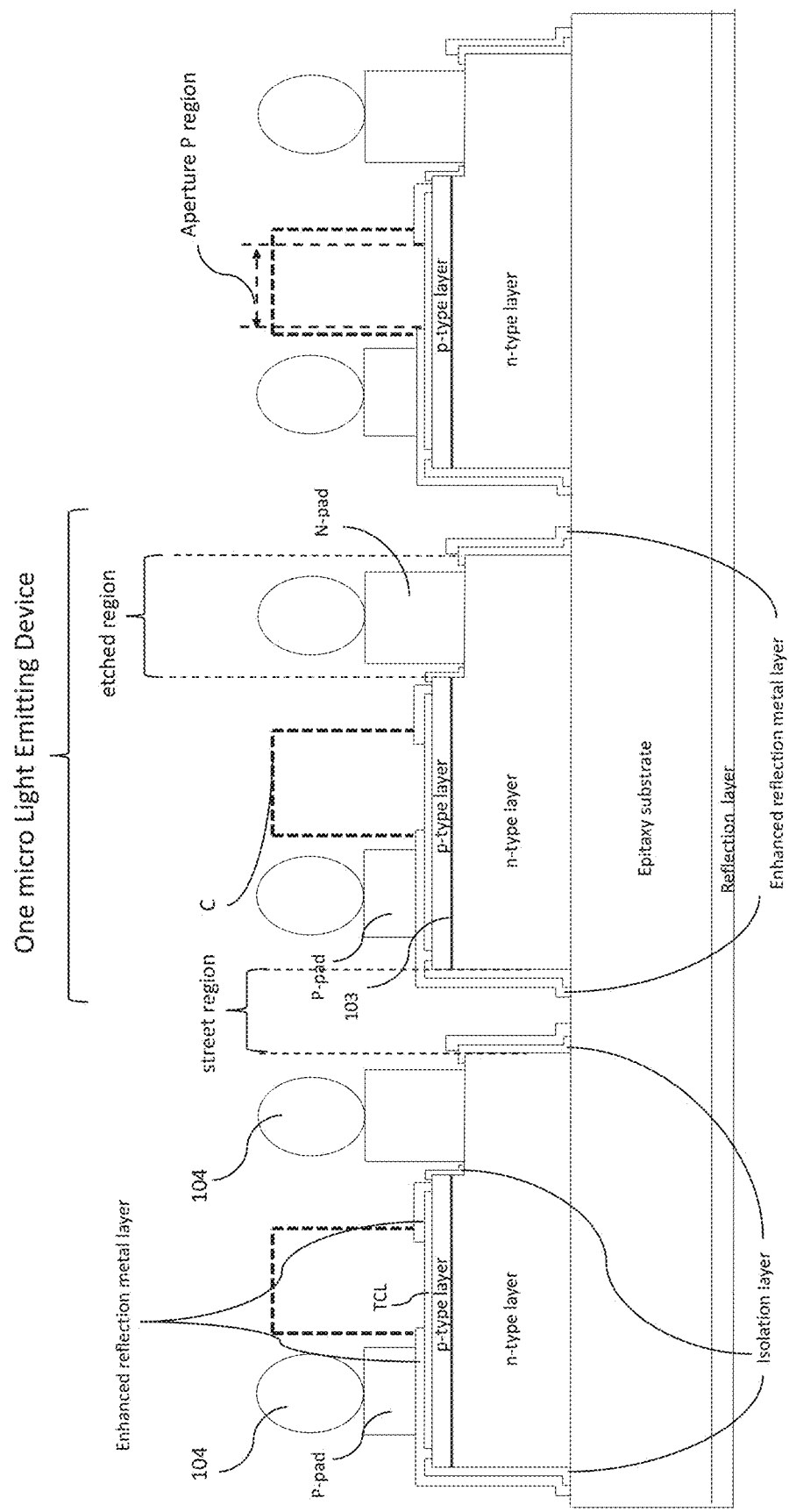
FIG. 47 is another one scheme cross section structure of a horizontal current type of multiple semiconductor structures on an epitaxy substrate.

In another embodiment to provide additional sidewall reflection metal layer in FIG. 45 structure, FIG. 47 shows another one scheme cross section structure of a horizontal current type of multiple micro light emitting device array on an epitaxy substrate. A reflection layer formed underneath of the epitaxy substrate. A direct bandgap light emitting device epitaxy structure consists of an initial growth epi layer (n-type layer), an active layer 103, and a p-type layer. The n-type layer formed on the epitaxy substrate. For the micro light emitting device, a transparent contact layer (TCL) is formed on a portion of p-type layer, and an isolation layer covers on the edge of each micro light emitting device in the street region. A portion of the p-type layer, a portion of the active layer 103 and a portion of the n-type layer in one micro light emitting device region is removed to expose the n-type layer in the etched region. The isolation layer also cover edge of the etched region, a portion of the p-type layer and the expose n-type layer in the edge of the street region. The isolation layer could be also option cover to a portion of the exposed n-type layer (not shown in here). An enhanced reflection metal layer is formed on top of a portion of the TCL, a portion of the p-type layer. The enhanced metal reflection layer also covers the sidewall isolation layer in the street region. An aperture P region on a portion of the top TCL is formed to emit the output light. A light collection module formed around the aperture P region to collect the output light. The micro light emitting device structure also consists a p-pad on a portion of top enhanced reflection metal layer. An n-pad on the exposed n-type layer of the etched region to form an n-type contact. The n-pad could be also option on a portion of top the isolation layer (not shown in here) to increase the n-pad height. A bump 104 formed on the p-pads, and the n-pads to each one micro light emitting device. The isolation layer could be optional selected from polymer such as polyimide, silicone, and epoxy. The isolation layer could be a polymer. Moreover, the isolation layer could be combined by multiple layers such as dielectric material and polymers.

Figure 48:
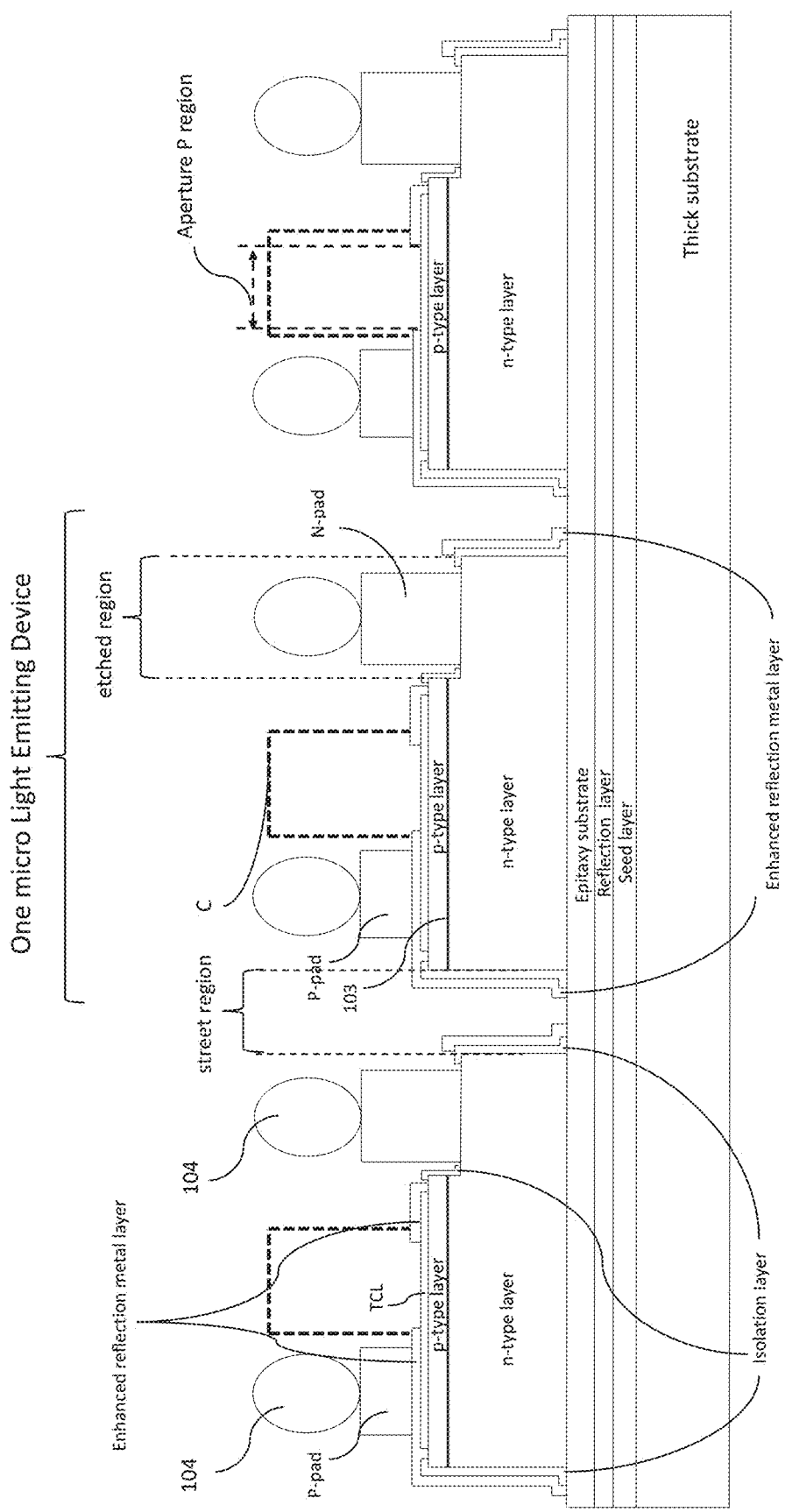
FIG. 48 is another one scheme cross section structure of a horizontal current type of multiple semiconductor structures on an epitaxy substrate and a thick substrate.

In another aspect, the epitaxy substrate of FIG. 47 could be thinner, another thick substrate could be formed underneath of the epitaxy substrate to enhance the thickness of micro light emitting device array module to provide a thick carrier characteristic. FIG. 48 shows another one scheme cross section structure of a horizontal current type of multiple micro light emitting device array on an epitaxy substrate and a thick substrate. A reflection layer and a seed layer formed on top of the thick substrate. The epitaxy substrate formed on the reflection layer.

In FIG. 45, FIG. 46, FIG. 47, and FIG. 48, the reflection layer could be a reflection metal layer selected from Al, Ag, Ni, Ti, Cr, Ni, Cu, Au or mixed these metals to make an alloy layer. The reflection layer could be a multiple dielectric layers such as DBR structures or a resonant cavity structure. In one optional reflection layer structure, please note that the reflection layer could be only specific formed in a region aligning to the aperture P region underneath of the epitaxy substrate. The specific reflection layer region could be larger than that of the aperture P region, but not covered to the entire one micro light emitting device region. The purpose of forming a specific reflection layer region is to prevent the one micro light emitting device light reflect back to the neighbor micro light emitting device.

In FIG. 45, FIG. 46, FIG. 47, and FIG. 48, the TCL could be selected from indium tin oxide (ITO), Gallium-doped ZnO (GZO), Indium-Gallium doped ZnO (IGZO), Al-doped zinc oxide (AZO). The thickness of the TCL could be selected from the optical length match one fourth wavelength to output the optimized optical power. The isolation layer could be deposited by dielectric material such as $SiO_x$, $Si_xN_y$, $Al_2O_3$, $TiO_2$ using plasma enhance chemical vapor deposition, chemical vapor deposition, physical vapor deposition, atomic layer deposition. Please note that the isolation layer could be multiple dielectrics having high/low refractive index such as distributed Bragg reflector (DBR) structure to provide a dielectric reflection layer on the side wall of the micro light emitting device. The isolation layer could be optional selected from polymer such as polyimide, silicone, and epoxy. The isolation layer could be option combined by multiple layer such as dielectric material and polymers.

For high speed modulation, reduction of the capacitor effect is one of a key factor to increase the response time. In one micro light emitting device, the active layer between one p-type layer and one n-type layer is a capacitor effect area. Referring from FIG. 35 to FIG. 48, the TCL could be only formed on a specific region of the p-type layer to reduce the capacitor effect of active emitting layer. A good p-type ohmic contact provide a low resistant contact to allow the current only injection into a specific region. The specific ohmic region on the p-type layer is purposed to confine the current only spreading to the specific region in the micro light emitting device and reduce the active layer capacitor effect. The specific region could be only formed at the aperture P region. The specific region could be larger than that of the aperture P region. In another aspect to further reduce the capacitor effect of active layer, the isolation layer could be formed on the top major p-type layer beside the aperture P region to be insulation p-type contact, the TCL could be formed on the top isolation layer and on the p-type layer of the aperture P region. The specific region could be larger than that of the aperture P region. In addition, the specific region could be formed by the TCL. The enhanced metal reflection layer could be formed on the top p-type layer and cover around the specific region of TCL. The enhanced metal reflection layer could be p-type non-ohmic contact metal layers.

Referring to FIG. 45 to FIG. 48, the light collection module C is the same as the structure of the light collection module C in FIG. 6. The light collection module C could be a micro lens. The light collection module C could be a light channel T. The light channel T is the same as the structure of the light channel T in FIG. 7. The light channel T filled with a transparent high refractive index material is the same as the structure in FIG. 8. The light channel T filled with a transparent high refractive index material to form a dome shape is the same as the structure in FIG. 9.

Referring to FIG. 6, FIG. 11, FIG. 16, FIG. 21, FIG. 26, FIG. 31, FIG. 36, and FIG. 41, the light collection module C could be the micro lens formed by a transparent high refractive index material. The transparent high refractive index material could be selected from sol-gel, transparent polyimide, transparent silicone, transparent PMMA, transparent epoxy, transparent glue, transparent gel. The light collection module C could be the angle-selective filter formed by multiple dialectical layers. Normally, the divergence angle is wider than +/−60° or even wider. The wide divergence angle may emit the light to the neighbor optical waveguide channel to cause a crosstalk error signal. The angle selective filter could be formed by using of the property that the effective optical thickness. An angle selective filter has multiple layers compositing with the high reflective index layer and low refractive index layer. The divergence angle could be reduced to +/−15° or even smaller dependent by the optical design and simulation. The other angle of the incident light could be reflected back to the micro light emitting device and reflect multiple times till the light angle fit the designed divergence angle to escape. Therefore a high compact and directional light can be obtained. The light collection module C could be the DBR structure or a resonant cavity structure formed by high/low refractive index dielectric material such as $TiO_2/SiO_2/TiO_2$ to select optical wavelength and light angle.

For the micro lens, the diameter of the micro lens, and the height of the micro lens could be simulated by optical light tracing program. The micro lens could be formed and patterned by photolithography method. A gray level photo mask could be designed and formed to control the curvature size and the height of the micro lens. The transparent high refractive index photosensitive material (photoresist) could be selected to coat on top of the micro light emitting device wafer. The transparent high refractive index photoresist could be selected from the material such as a glass or a polymer including a polyimide based photoresist, silicone based photoresist, and epoxy based photoresist. The micro lens could be also formed by high viscosity material through different technologies such as photolithography, micro screen printing, micro printing, micro jetting, micro inkjet printing, and micro contacting printing, micro dispensing, nano-imprinting, self-assembly. In some particular embodiment, the micro lens could be formed by lens molding technology. In another aspect, the micro lens could be premade first, and then mounting to the aperture P region. The premade micro lens could be made by lens molding, lithography patterning and interposer. For example, the micro lens could be formed by lens molding as a lens array in or on a glass or silicon substrate. The premade micro lens array could be then aligned and connected to the opening aperture P region of the micro LED.

For the light channel T, referring to FIG. 7, FIG. 8, FIG. 9, FIG. 12, FIG. 13, FIG. 14, FIG. 17, FIG. 18, FIG. 19, FIG. 22, FIG. 23, FIG. 24, FIG. 27, FIG. 28, FIG. 29, FIG. 32, FIG. 33, FIG. 34, FIG. 37, FIG. 38, FIG. 39, FIG. 42, FIG. 43 and FIG. 44, the light channel T could be a cylinder tube, rectangular tube, square tube, forming on top of the TCL, the enhanced reflection metal layer, or the top surface of semiconductor layer. The inner wall shape of the light channel T could be any closed shape any shape such as circle, hexagonal, rectangular, ellipse, square or polygon. The output light from the aperture P of the micro LED will then be confined in the light channel T. The micro light emitting device output light could only be propagated in the light channel T. The light channel could be formed by a channel tube. The inner wall of the light channel T could be formed by a reflection layer. The channel tube could be a metal layer formed by patterning and depositing metal layers such as Cr, Al, Ti, Ag, Ni, Au, Cu, AuSn, Sn, CuSn, CuAgSn, In, SnBi, or their combined metal layers such as Cr/Al, Ti/Al/Ni/Au, Cr/Al/Ni/Cu, Cr/Al/Ni/Cu, Cr/Ag/Ni/Au, Cr/Al/Ni/Au/In, Cr/Al/Ni/Au/CnSn, or any suitable those combination metal layers. The metal layers could be also formed by electro-forming metal layers such as Cu, Ni, Ni—Co, Sn, Ag, Au, AuSn, Sn, CuSn, CuAgSn, In, SnBi, Cu/Ni/Ag, Cu/Ni/Au, Cu/Ni/Ag/Sn, Cu/Ni/Ag/In, Cu/Ni/Au/Sn, Cu/Ni/Au/In or their combined metal layers. The inner wall of the light channel T could be formed as a reflective material by using metal deposition or electroforming process. Please note that an additional layer such as a polymer could be option formed after forming the metal layers.

In another aspect, the light channel T could provide a tube as a connecting hole for optical fiber to plug in. For optical communication system, the optical devices need to provide a suitable numerical aperture (NA) to couple the optical signal into the optical fiber for obtaining good data communication. Normally, the laser beam due to its high collimation light beam has better NA to allow the light couple into the core of the optical fiber. However, the light coupling still need good alignment to achieve. The light channel T of this invention could provide a tube as a hole to allow the optical fiber to plug in. More light after multiple reflection could be couple into the optical fiber. Thus, the light loss will be smaller, and the light coupling efficiency will be better. In addition, the light channel T of this invention could also provide an accuracy optical signal detection in a device array system. The device array system could be a photo detector array, a light emitting device array to recognize more accuracy position of a screen, any operation panel or biotech devices light-linking applications. The light channel T of this invention could also provide a light confinement channel for one single pixel in display system to achieve a no cross-talk light of pure single pixel light emission such as organic light emitting diode (OLED) display or micro LED display. The inner wall coated reflective material could provide the light channel T to attain a powerful application to guide the light and convey the light signal from one point to another point. The light channel T of this invention could be also formed to any suitable position in a light signal communication system to connect the light signal from one point to another one point. The light channel T of this invention could be widely used to transitive a light from a point to another point. The light channel T of this invention could be formed to three dimensions such as x-axis y-axis, and z-axis for any potential application such as three dimensions package of optoelectronic devices. For an example, the light channel T of FIG. 1 to FIG. 4 structures is formed on the z-axis. For another example, the x-axis or y axis light channel T could be formed in the optical interconnection substrate. Furthermore, multiple layers of x-axis light channel or y-axis light channel could be formed first. Then each x-axis light channel or y-axis channel in one layer could be selected to connect to other x-axis light channel or y-axis light channel through a designed z-axis light channel. The multiple light channel of this invention could attain multiple light channels requirement to transitive multiple light signal or increase the light signal capacity.

For the transparent high refractive index material fill into the light channel T, referring to FIG. 8, FIG. 9, FIG. 13, FIG. 14, FIG. 18, FIG. 19, FIG. 23, FIG. 24, FIG. 28, FIG. 29, FIG. 33, FIG. 34, FIG. 38, FIG. 39, FIG. 43 and FIG. 44, the transparent high refractive index material could be selected from sol-gel, transparent polyimide, transparent silicone, transparent PMMA, transparent epoxy, transparent glue, transparent gel, etc.

In this invention, referring from FIG. 5 to FIG. 48, the direct bandgap light emitting device epitaxy structure could be formed by different epitaxial growth structure to reduce the dislocation density for high speed bandwidth response time purpose. The light emitting device could be a vertical cavity surface emitting laser, a laser, a light emitting diode (LED), a resonant cavity light emitting diode (RCLED), a photonic crystal LED, or a photonic crystal vertical cavity surface emitting laser. In one particular of a nitride light emitting device, the light emitting device epitaxy layers could be grown on a lattice match substrate such as GaN substrate or GaN/sapphire. The light emitting device epitaxy layers could be grown on patterning sapphire substrate, patterning silicon substrate. In addition, the light emitting device as an optical signal transitive source, the rise and fall time to achieve target optical power could be very fast to meet the bandwidth requirements by using modified epitaxial structure. The modified epitaxial structure could be selected from reduction of numbers of multiple quantum wells, modified to increase the quantum well thickness, insert electron blacking layers, graded-composition electron blocking layer, double hesterostructure, slight doping in active layer, polarization-matched substrate, increase the thickness of quantum well to reduce Auger recombination, etc. Thus, the purpose of the epitaxial structure modulation is to obtain an enough optical power and good power efficiency at low current density for high speed bandwidth modulation in optical interconnection application or optical signal transmitting application. In another one particular of VCSEL light emitting device, a portion of the p-type layer, and a portion of n-type layer has current confinement region and optical confinement region made by diffusion or ion implantation. Both p-type layer and n-type layer has a DBR structure to provide a high reflectivity properties for laser to be stimulated lasing and emitted in a specific wavelength. In another particular of the light emitting transistors, a semiconductor structure could be formed by a first type semiconductor layer/second type semiconductor layer/another first type semiconductor layer, for example of n-type layer/p-type layer/n-type collector (NPN) or p-type layer/n-type layer/p-type collector (PNP). The first PN junction formed by the first semiconductor layer and the second type semiconductor layer is proposed to be an active layer to emit light or absorb light. The second PN junction formed by the second type and another first type semiconductor layer is a collector of the transistor to control the carrier injection. The second PN junction is not an active layer to emit the light or absorb the light. Higher speed modulation of the light emitting transistor could be obtained by controlling the carrier injection rate through the second PN junction of collector. The light emitting transistor could be also called as an optoelectronic integrated circuit (OEIC) to control the carrier injection speed for light emitting device in one semiconductor structure.

The polymer could be cured by thermal curing, UV curing, or IR curing after photolithography patterning or filling. The polymer could be selected from the hard materials, such as gels, glues, sol-gels, epoxy based photosensitive resister, silicone based photo-sensitive resister, polyimide based photo-sensitive resister, phenyl-silicone; photo-sensitive resister, UV cure able glues, and thermal cure able glues. The polymer could be also selected from the stretch materials, such as gels, glues, epoxy, polyimide, parylene, silicone, methyl-silicone, cohesive gels, silicone gels, PMMA, photosensitive photoresist, UV or thermal cure able glues.

The enhanced reflection metal layers could reflect the light back to the semiconductor region. The light generated from the active layer is irradiated to any angle inside the semiconductor region. In one micro light emitting device structure, the output light could be only emitted from the aperture P region. For obtaining more light output from the aperture P region, the light generated from the active layer of one micro light emitting device could be multiple reflected and then output the light through the aperture P region. Thus, the input power of micro light emitting device could be reduced to save power consumption and reduce the thermal control issues. The enhanced reflection metal layers could be deposited by Ti, Cr, Al, Ag, Ni, Cu, Au, or their combination metal layers such as Ti/Ni/Cu/Ti, Ti/Ag/Ni/Cu/Ti, Ti/Al/Ni/Cu/Ti, Ti/Al/Ni/Au, Ti/Ag/Ni/Au Cr/Al/Ni/Au, Cr/Ag/Ni/Au, or any suitable combination of metal layers.

The seed layer could be selected from Cr, Ti, Cu, Au, Cu, Ni, Ag, or mixed these metals to make an alloy layer. Additional option bonding layer (not shown in here) could be formed to the seed layer. The bonding layer could be selected from the metal bonding layer or metal eutectic bonding layer such as Au—Au, In—Au, AuSn, CuSn, CuSnAg, Sn (tin), In (indium) or mixed these metals to make an alloy layer.

The thick substrate could be formed by using electroforming technology. The thickness of the electroforming metal layers is greater than 1 μm. The electroforming metal layers could be selected from the Cu, Ni—Co, Cu, Au, and their combination metals. The thick substrate could be a carrier substrate. The carrier substrate could be formed to the seed layer by bonding. The bonding could be selected from metal bonding, metal eutectic bonding, anodic bonding, ultrasonic metal bonding and polymer bonding technologies. The carrier substrate could be semiconductor wafer substrate or ceramic substrate such as Si, GaAs, SiC, AlN, and $Al_2O_3$. The carrier substrate could be a metal such as Mo, Cu, CuW, Ni—Co. The carrier substrate could be transparent material such as glass, sapphire, and quartz.

The aperture P could be formed in the middle of the micro light emitting device to output the light. The aperture P could be any shape, such as circle, hexagonal, rectangular, ellipse, square or polygon. The aperture P shape is preferred to be a circle shape. The non-opening area of the micro light emitting device is purposed to prevent the light escape to neighbor micro light emitting device region. Once the light cross talk to the neighbor micro light emitting device, an error signal could be transitive to the neighbor optical waveguide channel. Thus the light from each one micro light emitting device could confine the output light only escape through the opening aperture P and transitive the light to a light collection module and the light collection module guide the light to an optical waveguide channel.

The bump 104 could be a ball bump selected from Au, Cu, Ag, CuSn, Sn, SnAgCu, or any suitable ball metals for bonding. The bump 104 could be a solder/eutectic layer optional formed on top of the p-pad and n-pad region. The eutectic (solder) layers as a connecting layer could be selected from AuSn, CuSn, Sn, CuSn Ag, Indium, SnBi, Indium/gold or any suitable soldering and eutectic metallization. In another aspect, the bump 104 could be replaced to be an anisotropic conductive adhesive material could be forcefully connect the light emitting device to the target substrate. For the anisotropic conductive adhesive material, it has metallic powder covering with nonconductive shield mixing in a polymer. The nonconductive shield could be broken by thermal bonding technology to provide anisotropic conductive function.

It should be noted that, light channel T can be satisfied by dams. Moreover, gap size of the neighboring dams is to control size of aperture P. Please also note that the micro light emitting device in this invention could be a micro light emitting device array. The light channel T as a dams array disposed on the micro light emitting device array.

Figure 49:
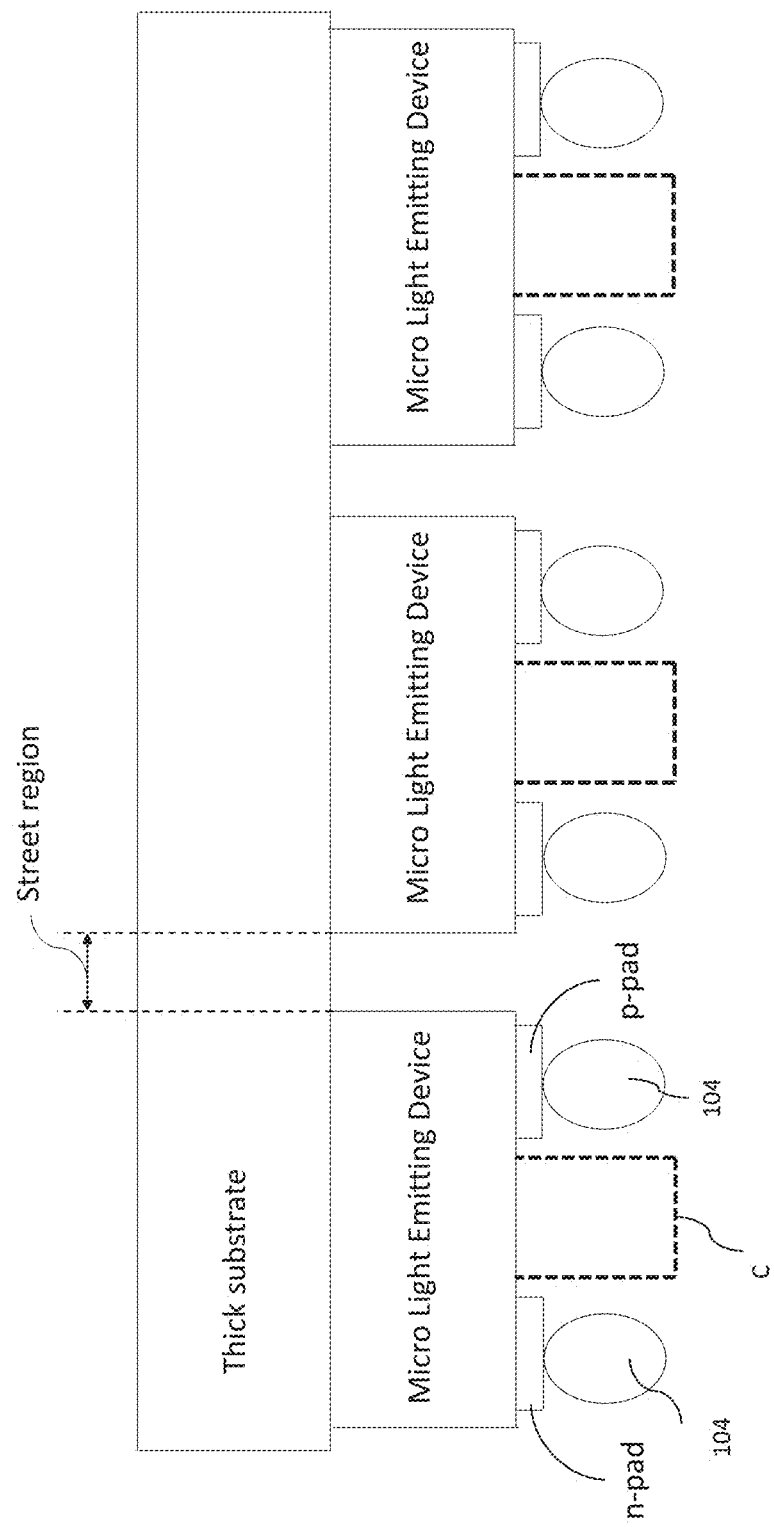
FIG. 49 is a simplified scheme diagram of the micro LED in a semiconductor structure module on a thick substrate.
Figure 49A:
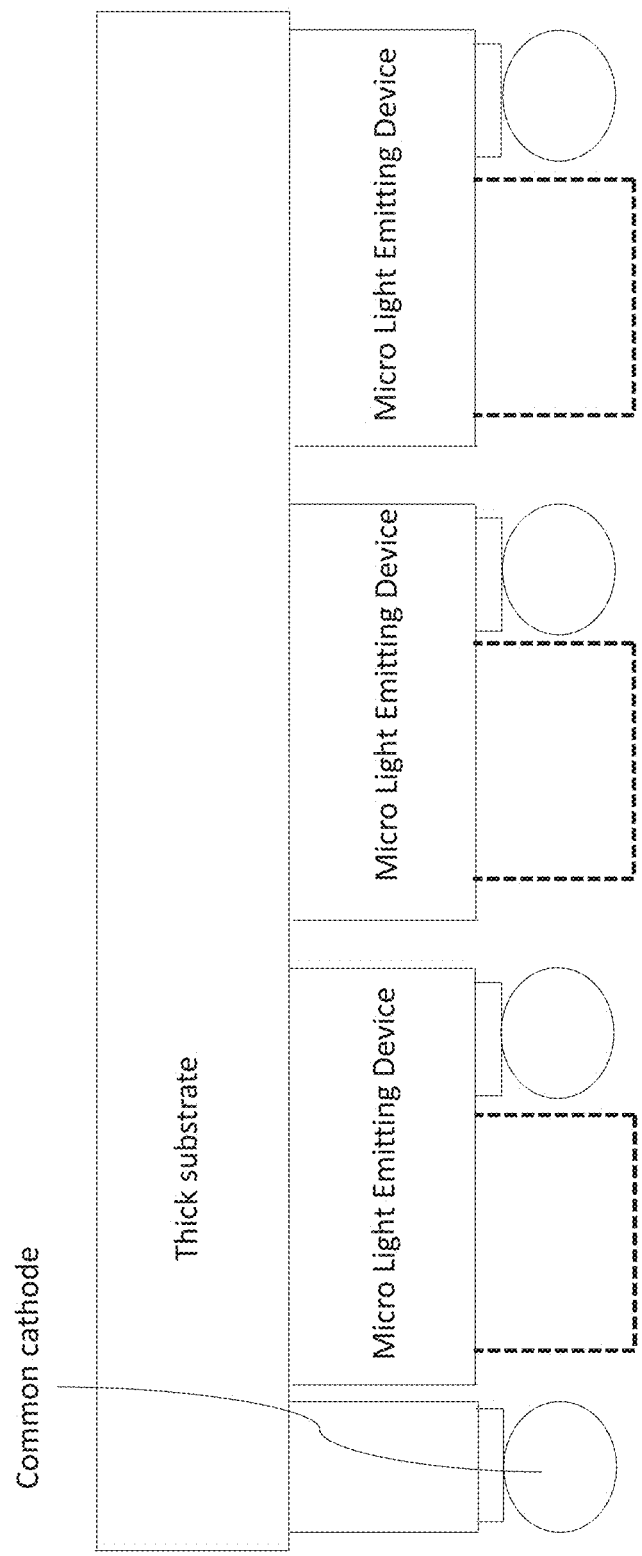
FIG. 49A is another simplified scheme diagram of the common cathode semiconductor structure on a thick substrate.

FIG. 49 illustrates a simplified scheme diagram of the micro light emitting device in a micro light emitting device array module on a thick substrate. The simplified micro light emitting device consists of a light emitting device, a p-pad, an n-pad, a bump 104, and a light collection module. Each one simplified micro light emitting device could be represented to all each one micro light emitting device array embodiments (from FIG. 5 to FIG. 39, and from FIG. 45 to FIG. 48) in above invention. FIG. 49A illustrates another simplified scheme diagram of the common cathode micro light emitting device array on a thick substrate. Thus the FIG. 40 structure, FIG. 41 structure, FIG. 42 structure, FIG. 43 structure and FIG. 44 structure could be simplified to FIG. 49A structure.

Please note that the numbers of the micro light emitting device in a micro light emitting device array module could be n×m micro light emitting device array (n=1, 2, 3 . . . ; m=1, 2, 3 . . . ). FIG. 50A illustrates a side view example of multiple 1×4 micro light emitting device array modules underneath a thick substrate. One 1×4 micro light emitting device array module could be defined in the wafer form and then cut into the 1×4 micro light emitting device module size. The cutting technologies could be selected from laser cut, dicing saw cut, water jet. FIG. 50B illustrates another side view example of multiple 1×4 micro light emitting device array modules underneath a thick substrate. A thick substrate could be formed on one 1×4 micro light emitting device array module, a carrier substrate could be formed on top of each one thick substrate to connect all micro light emitting device array module together in one wafer form. A cutting path could be applied to cut the array-street region in the carrier substrate. The isolation layer or polymer layer in the array-street region could be removed by a slight laser cutting. Based on the 1×4 micro light emitting device array module pitch, the carrier substrate could be then separated by laser cut, dicing saw, or water jet. Thus a 1×4 micro light emitting device array module could be obtained.

After the micro light emitting device array module separation, FIG. 51A shows one embodiment of a backside view of the 1×4 micro light emitting device array module. A light collection module could be located in the middle of each one micro light emitting device unit. The p-pad, and the n-pad could be separately formed on the bottom corners of each one micro light emitting device unit. Please note that a dummy pad is also formed on the top middle site of the each micro light emitting device unit. The dummy pad, the p-pad, and the n-pad could provide a triangulation point underneath of the micro light emitting device unit. For the flip chip bonding, a ball bump could be formed on these pads. Three balls on pads in one micro light emitting device could have the same height level to prevent the tilt effect during micro light emitting device array bonding process. For the 1×4 micro light emitting device array flip chip bonding, eight pads on the bottom, and 4 pads on the top side, which could provide stable bonding process.

In another one embodiment, FIG. 51B shows the dummy pad could be formed on the top site in the street region and optional cover neighbor two micro light emitting device. In one micro light emitting device array module, the pads including p-pads, n-pads, and dummy pads could provide a same high level after ball bump forming for flip chip bonding.

In another one embodiment, FIG. 51C shows the backside view of a common cathode type micro light emitting device array. The numbers of n-pads in FIG. 51B could be reduced to be only one single n-pad. Thus, the numbers of the ball bump could be reduced.

In another one embodiment, FIG. 51D shows another one backside view of a common cathode type micro light emitting device array. For a micro light emitting device, a common cathode n-pad could be formed on a corner of one micro light emitting device, and a p-pad could be formed on a diagonal corner of one micro light emitting device. For the other micro light emitting device, a dummy pad could be formed on a corner of one micro light emitting device, and a p-pad could be formed on a diagonal corner of other micro light emitting device. In one micro light emitting device array module, the pads including p-pads, n-pads, and dummy pads could provide a same high level after ball bump forming for flip chip bonding. Thus, due to the reduction of the numbers of pads, each one micro light emitting device emitting area could be enhanced, and the numbers of the ball bump could also be reduced more.

Figure 52:
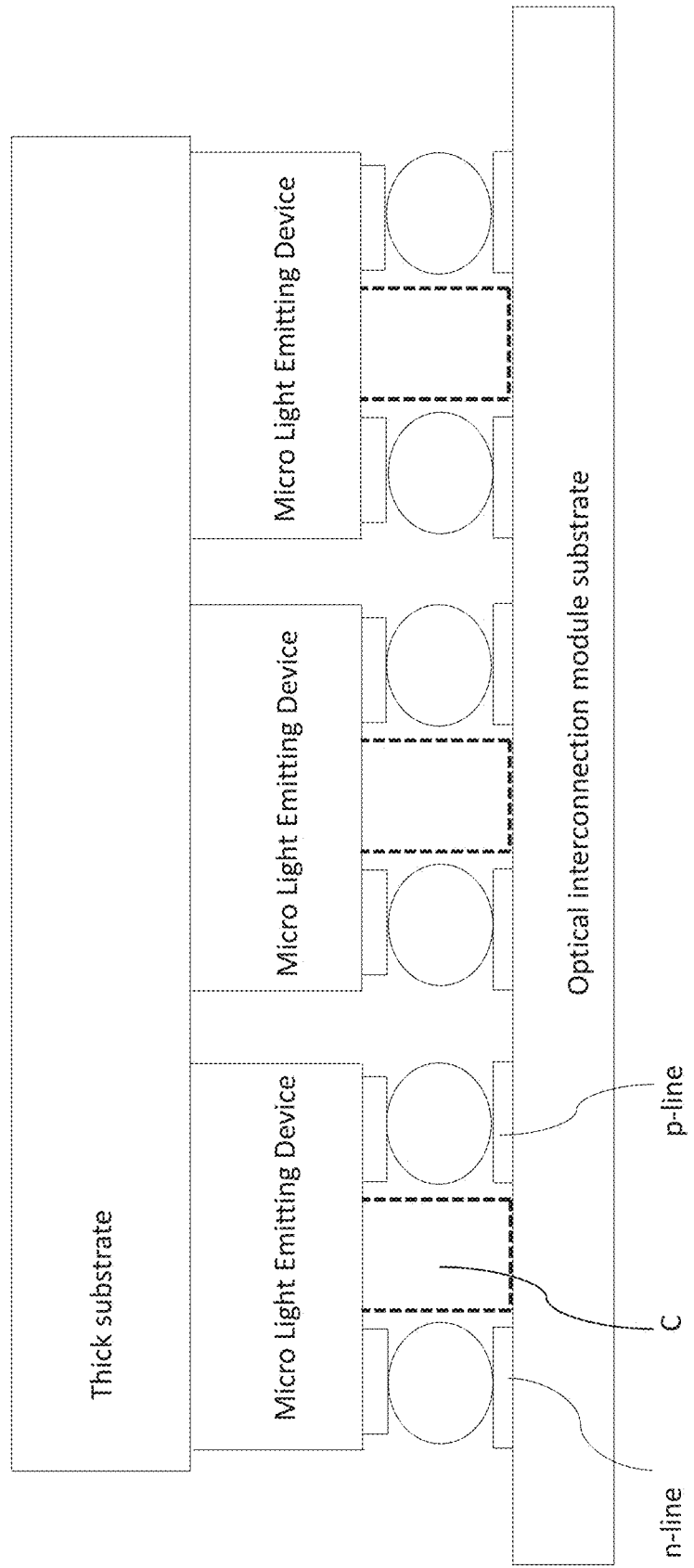
FIG. 52 is the FIG. 49 structure formed on an optical interconnection substrate.
Figure 52A:
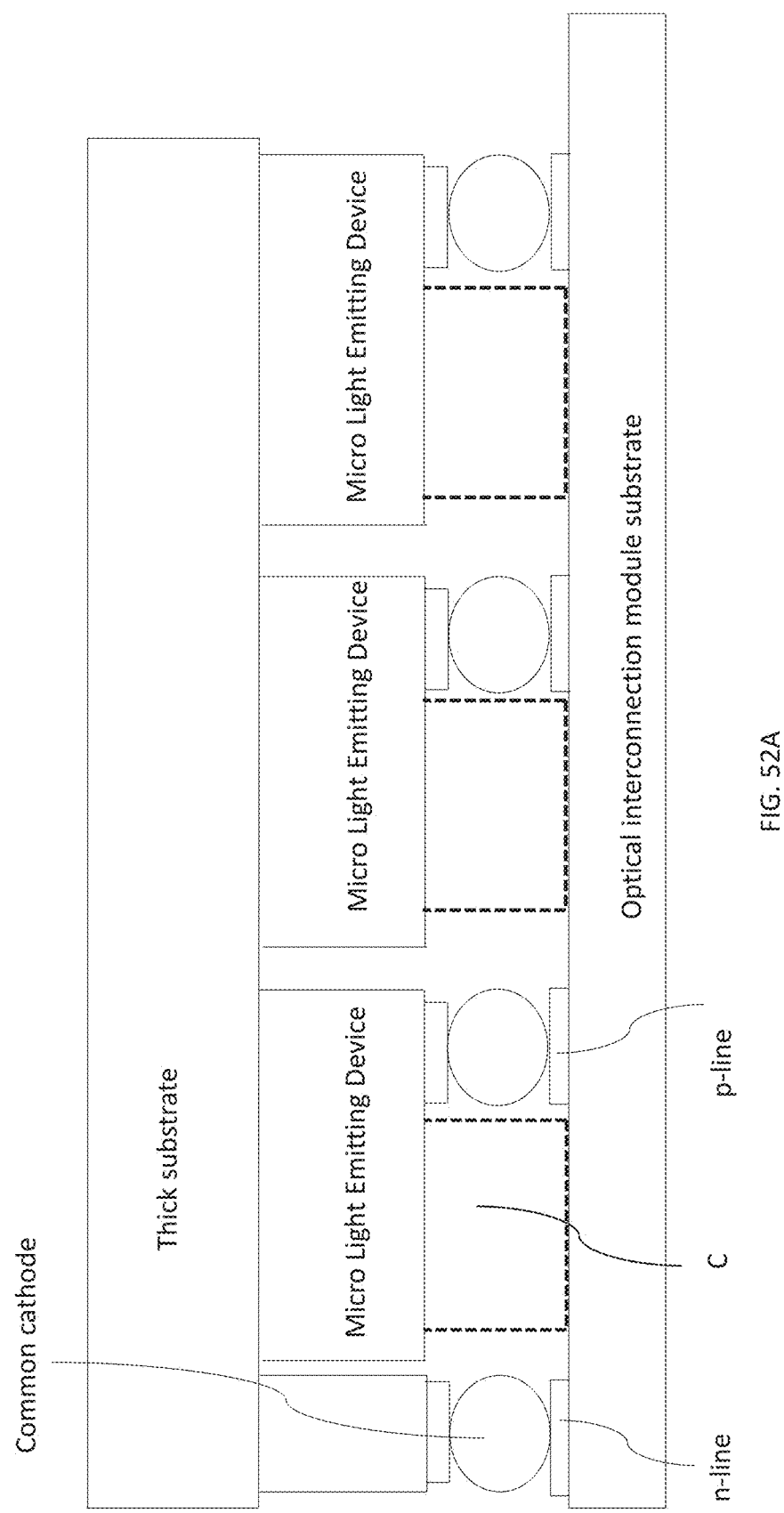
FIG. 52A is the FIG. 49A structure formed on an optical interconnection substrate.

Now referring to FIG. 49, FIG. 52 shows the FIG. 49 structure could be formed on an optical interconnection substrate by a flip chip micro light emitting device array bonding process or any suitable technologies. The micro light emitting device array could be a flip chip aligning bonded to the n-line and the p-line of an optical interconnection substrate respectively. The bonding could be formed by thermal press bonding, microwave bonding, ultrasonic bonding, or an anisotropic conductive bonding. In similar, FIG. 52A shows the FIG. 49A structure could be formed on an optical interconnection substrate. Please note that the effective light collection module area of FIG. 52A could be increased compared to FIG. 52.

A packaging polymer could be filled into the air gap region of the FIG. 52 structure and the FIG. 52A structure to form a reliable package devices. The packaging polymer could be transparent polymer selected from low refractive index material such as polyimide, parylene, epoxy, silicone, PMMA, polydimethylsiloxane, gel, glue, white glue, plastic, ceramic, or adhesion promotor. In another aspect, the packaging polymer could be non-transparent polymer selected from dyeing silicone, dyeing epoxy, dyeing gel, dyeing glue, dyeing photoresist material, or mixing the polymer with particles. The mixed particle could be selected from $SiO_2$, $TiO_2$, carbon, or other oxide metals.

Figure 53:
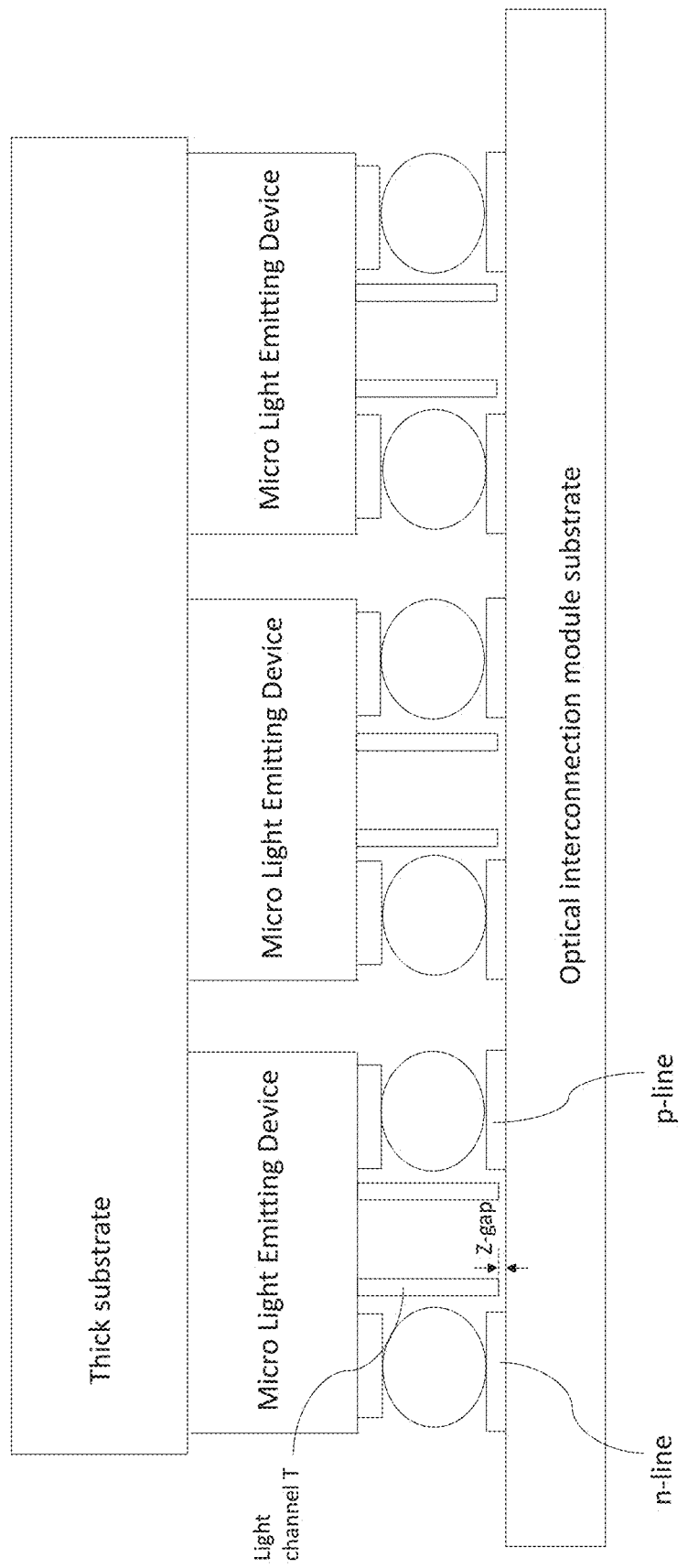
FIG. 53 is the simplified semiconductor structure module of FIG. 52 structure mounting to the optical interconnection substrate.
Figure 53A:
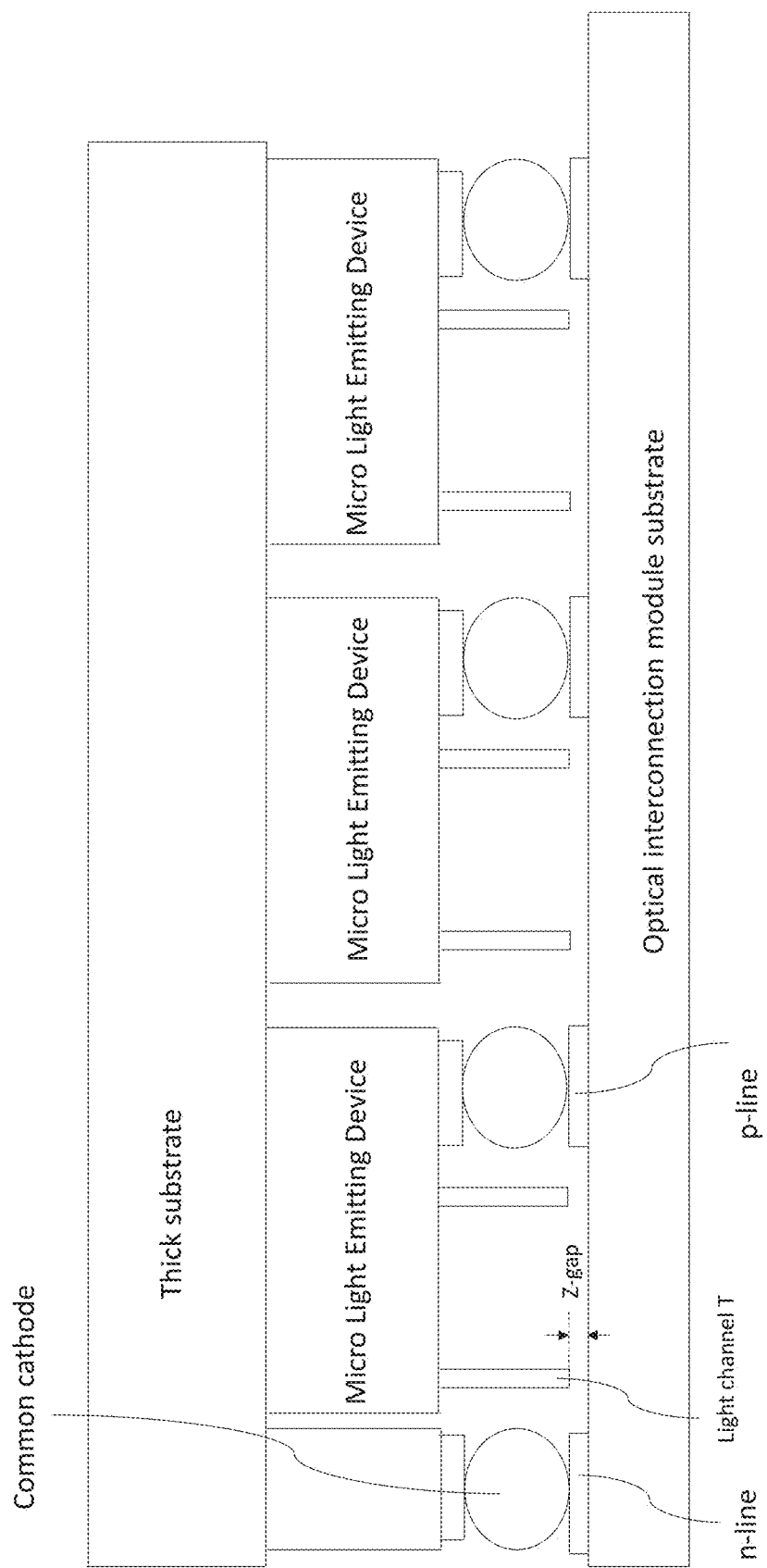
FIG. 53A is the simplified common cathode type semiconductor structure module of FIG. 48 structure mounting to the optical interconnection substrate.

In some particular application of micro light emitting device array module mounting to the optical interconnection substrate, the light collection module C could be a light channel T. FIG. 53 illustrates the simplified micro light emitting device array module of FIG. 52 structure mounting to the optical interconnection substrate. FIG. 53A illustrates the simplified common cathode type micro light emitting device array module of FIG. 52 structure mounting to the optical interconnection substrate. A Z-gap could be formed between the light channel T and the optical interconnection substrate.

In one embodiment, the Z-gap could be greater than 1 micro meter. In another one embodiment, the Z-gap could be almost zero (slight touching) or zero (touching) due to the light channel T touch the optical interconnection substrate.

In another one embodiment, a receiving pad could be initial formed on the optical interconnection substrate. FIG.

54 shows the simplified light channel T of the micro light emitting device array module could be mounted to the optical interconnection substrate. FIG. 54A shows the simplified light channel T of the common cathode type of micro light emitting device array module could be mounted to the optical interconnection substrate. The light channel T in FIG. 54 and in FIG. 54A could be aligned and connect to the receiving pads of the optical interconnection substrate.

Now referring to FIG. 53, FIG. 53A, FIG. 54, and FIG. 54A, the light channel T could be also formed on the optical interconnection substrate. In option, the aperture of the micro light emitting device which has no light channel T. The micro light emitting device could be then aligned and mounted to the light channel T which is formed on the optical interconnection substrate. In another option, the light channel T unit could be both formed on the micro light emitting device, and on the optical interconnection substrate. Thus the light signal could be collected and guided after connecting the two light channel T units together. After connecting one point (for example of the micro light emitting device) to another point (for example of the optical interconnection substrate) by using the light channel T, the light channel T is a closed channel tube. For a packaging purpose, a packaging polymer could be filled into the air gap region of the FIG. 53 structure, FIG. 53A structure, FIG. 54 structure, and FIG. 54A structure to form a reliable package devices. The packaging polymer could be transparent polymer such as polyimide, parylene, epoxy, silicone, PMMA, polydimethylsiloxane, gel, glue, white glue, plastic, ceramic, or adhesion promotor. In another aspect, the packaging polymer could be non-transparent polymer selected from dyeing silicone, dyeing epoxy, dyeing gel, dyeing glue, dyeing photoresist material, or mixing the polymer with particles. The mixed particle could be selected from $SiO_2$, $TiO_2$, carbon, or other oxide metals. The non-transparent polymer filled into the air gap region of these structures could additional providing an absorption barrier to avoid the light from one micro light emitting device cross talk to the neighbor micro light emitting device region. Each one micro light emitting device can only emit the light into the light channel T to transitive the light signal. A pure and high quality light signal for data communication could be further obtained. Thus, a higher speed modulation of the micro light emitting device could be performed.

Figure 54:
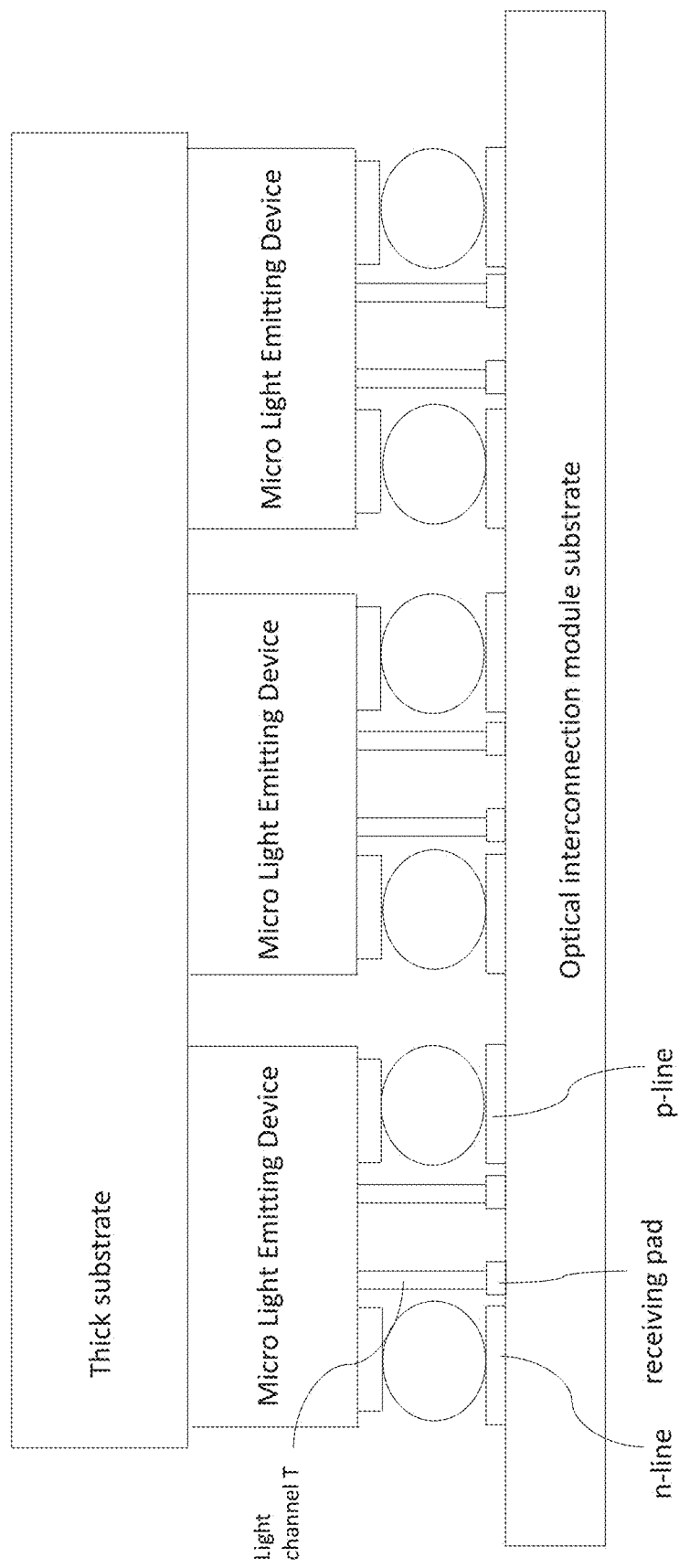
FIG. 54 is the simplified light channel type of the semiconductor structure module could be mounted to the optical interconnection substrate.
Figure 54A:
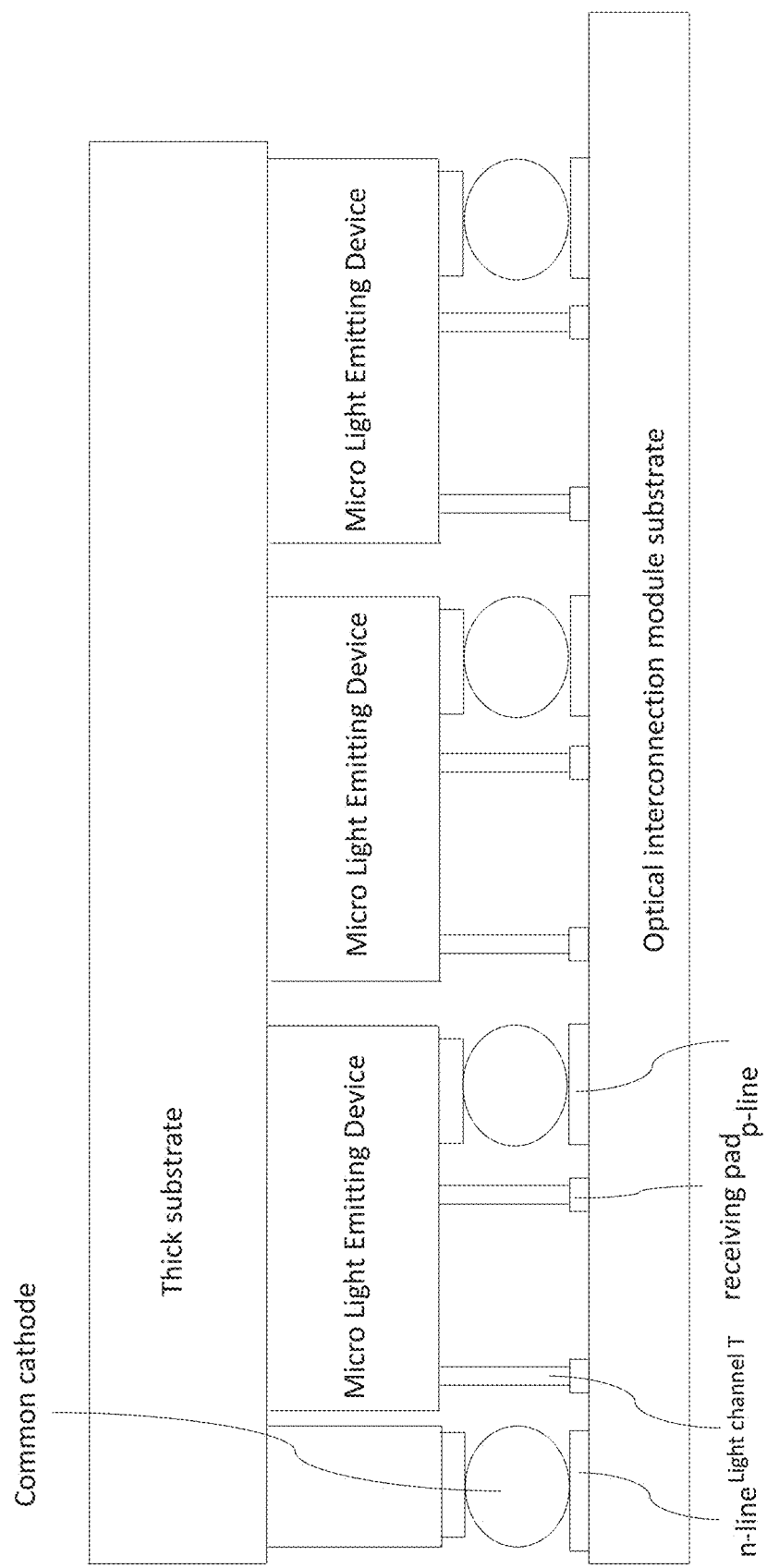
FIG. 54A is the simplified light channel type of the common cathode type of semiconductor structure module could be mounted to the optical interconnection substrate.

Please note that the simplified light channel T of the micro light emitting device array module in FIG. 53 and FIG. 54 could be selected from the following structures, FIG. 7 to FIG. 9 structures, FIG. 12 to FIG. 14 structures, FIG. 17 to FIG. 19 structures. FIG. 22 to FIG. 24 structures, FIG. 27 to FIG. 29 structures, FIG. 32 to FIG. 34 structures, and FIG. 37 to FIG. 39 structures. Please also note that the simplified light channel T of the micro light emitting device array module in FIG. 53A and FIG. 54A could be selected from the FIG. 42 structure, FIG. 43 structure, and FIG. 44 structure.

In one particular embodiments, a package transparent polymer could be filled into the light channel of the FIG. 53 and FIG. 53A structure once the Z-gap exist. The light after the light channel could be a little bit scattering out from the Z-gap. Thus, distance of the Z-gap is designed as smaller as possible.

In another aspect, the light channel T of the micro LED array module could be pre filled with transparent high refractive index material such as FIG. 8 structure, FIG. 9 structure, FIG. 13 structure, FIG. 14 structure, FIG. 18 structure, FIG. 19 structure, FIG. 23 structure, FIG. 24 structure, FIG. 28 structure, FIG. 29 structure, FIG. 33 structure, FIG. 34 structure, FIG. 38 structure, FIG. 39 structure, FIG. 43 structure, and FIG. 44 structure. Thus, the package low refractive index packaging polymer could not be filled into the light channel T. The light after the channel T could be focus to the optical interconnection substrate due to the light is from high refraction index material to the low refraction index material.

In particular embodiments, the light channel T could be sealed with the receiving pads of the optical interconnection substrate. The packaging polymer could not be filled to the light channel T in FIG. 54, and the light channel T in FIG. 54A. The light could be direct propagated to the optical interconnection substrate by the light channel T.

Now, referring to FIG. 52 structure, FIG. 52A structure, FIG. 53 structure, FIG. 53A structure, FIG. 54 structure, and FIG. 54A structure, the micro light emitting device array module could provide a significant excellent thermal conductive path for the micro light emitting device module. The micro light emitting device module could dissipate the heat generated from the active layer through the top semiconductor layers to the top metal layers and the thick substrate to ambient. In addition, the micro light emitting device module could also dissipate the heat through the bottom semiconductor layers, the bottom metal layers, and the pads to the optical interconnection substrate.

Figure 55:
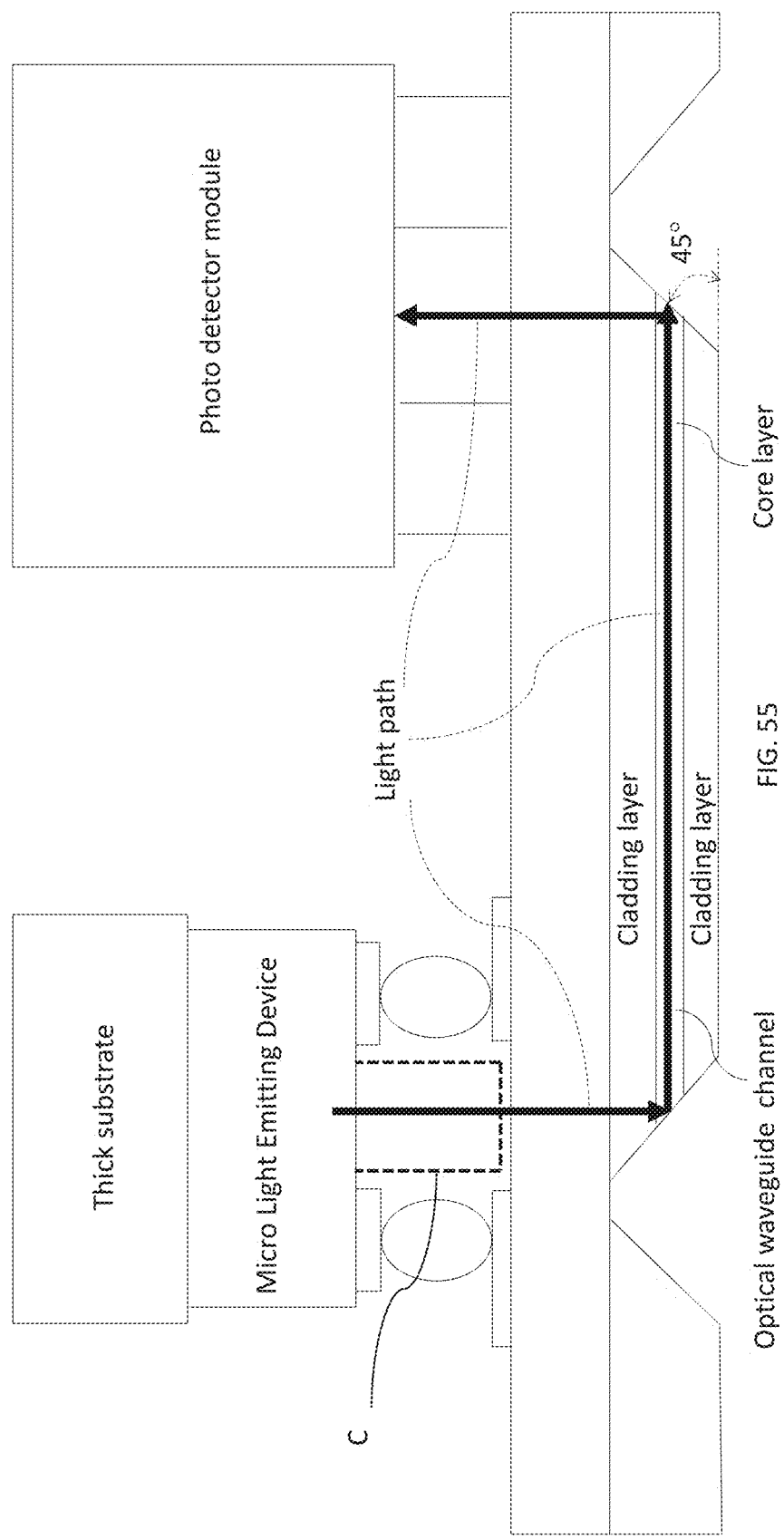
FIG. 55 is an example of an optical interconnection module formed by a micro light emitting device as the transitive device.

FIG. 55 illustrates an example of an optical interconnection module formed by a micro light emitting device as the optical transitive device. Each one micro light emitting device as a light source could emit the optical signal from the collection module and transitive to a 45 degree plane reflector. The optical signal after the light collection module could be reflected by the 45 degree plane reflector and then coupling into the optical waveguide channel. The optical signal could be then output from the waveguide channel and reflected again by another 45 degree plane reflector. The optical signal finally could be received by a photo detector module to finish the optical interconnection working. Please note that FIG. 5 to FIG. 49 structures could be selected to be the micro light emitting device array module for transitive optical signal devices.

In another embodiment of FIG. 55A, FIG. 55A illustrates another additional light collection module could be option formed underneath of the photo detector module. The additional light collection module formed underneath of the photo detector module is purpose to collect the light emitting device optical signal reflected from the second reflection plane of the optical waveguide channel. The additional light collection module of the photo detector module could be another light collection module, or another light channel module.

Figure 55B:
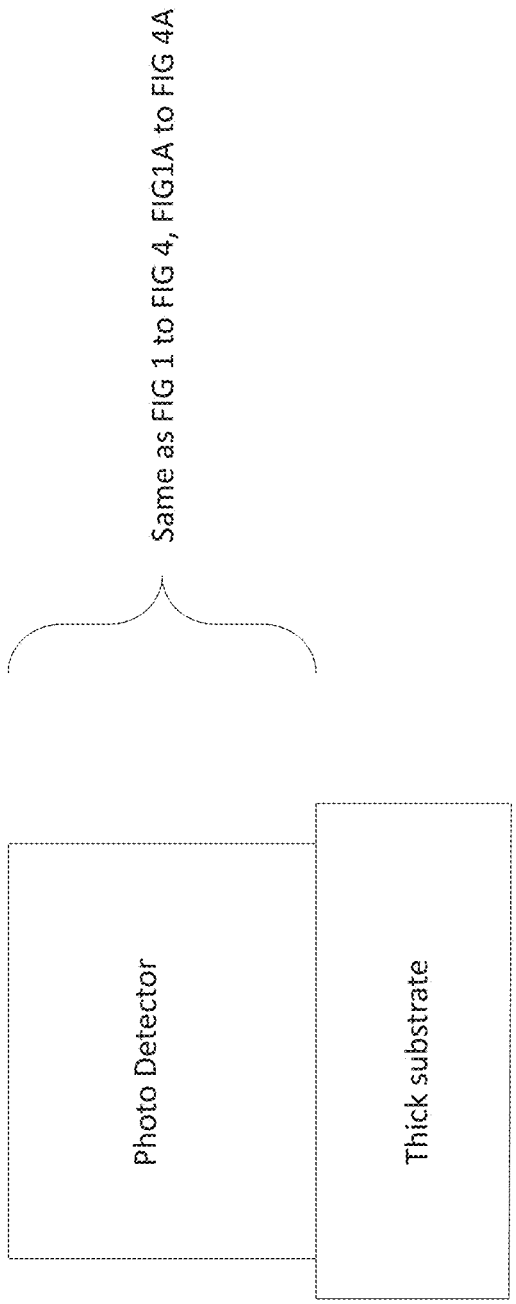
FIG. 55B is a photo detector module consists of a photo detector structure cover on a thick substrate.

FIG. 55B is a photo detector module consists of a photo detector structure cover on a thick substrate. The photo detector structure is as same as FIG. 1, FIG. 1A, FIG. 2, FIG. 2A, FIG. 3, FIG. 3A, FIG. 4, and FIG. 4A structures. The photo detector is also a semiconductor structure having a first type semiconductor layer, and second type semiconductor layer. An active layer located between the first type semiconductor layer and the second type semiconductor layer. The active layer is an optical pumping active layer that could absorb the light and convert the photon energy into electrical signal. The electrical signal could be passed through the first pad of the photo detector and the second pad of the photo detector to a decode IC. Moreover, a first pad disposed on a top surface of the reflector which is covered the first type semiconductor layer; a second pad disposed on the top surface of the reflector which is covered the second type semiconductor layer; and an aperture disposed on the top surface of the first type semiconductor layer and passed through the reflector; and a light collection module around the aperture is covered a top surface of reflector. Wherein, the first type semiconductor layer and the second type semiconductor layer form a PN junction in the active layer; the first pad couples to the first type semiconductor layer; the second pad couples to the second type semiconductor layer; and the light collection module is used to guide light in a direction.

Now referring to FIG. 55, FIG. 55A, and FIG. 55B, the waveguide channel is formed by a core layer and covered by a closed cladding layer. The refractive index of the core layer is larger than that of the cladding layer. A light signal in the core layer could be total internal reflection (TIR) by the cladding layer due to the difference of the refractive index. The core layer could be called a waveguide channel.

Figure 55C:
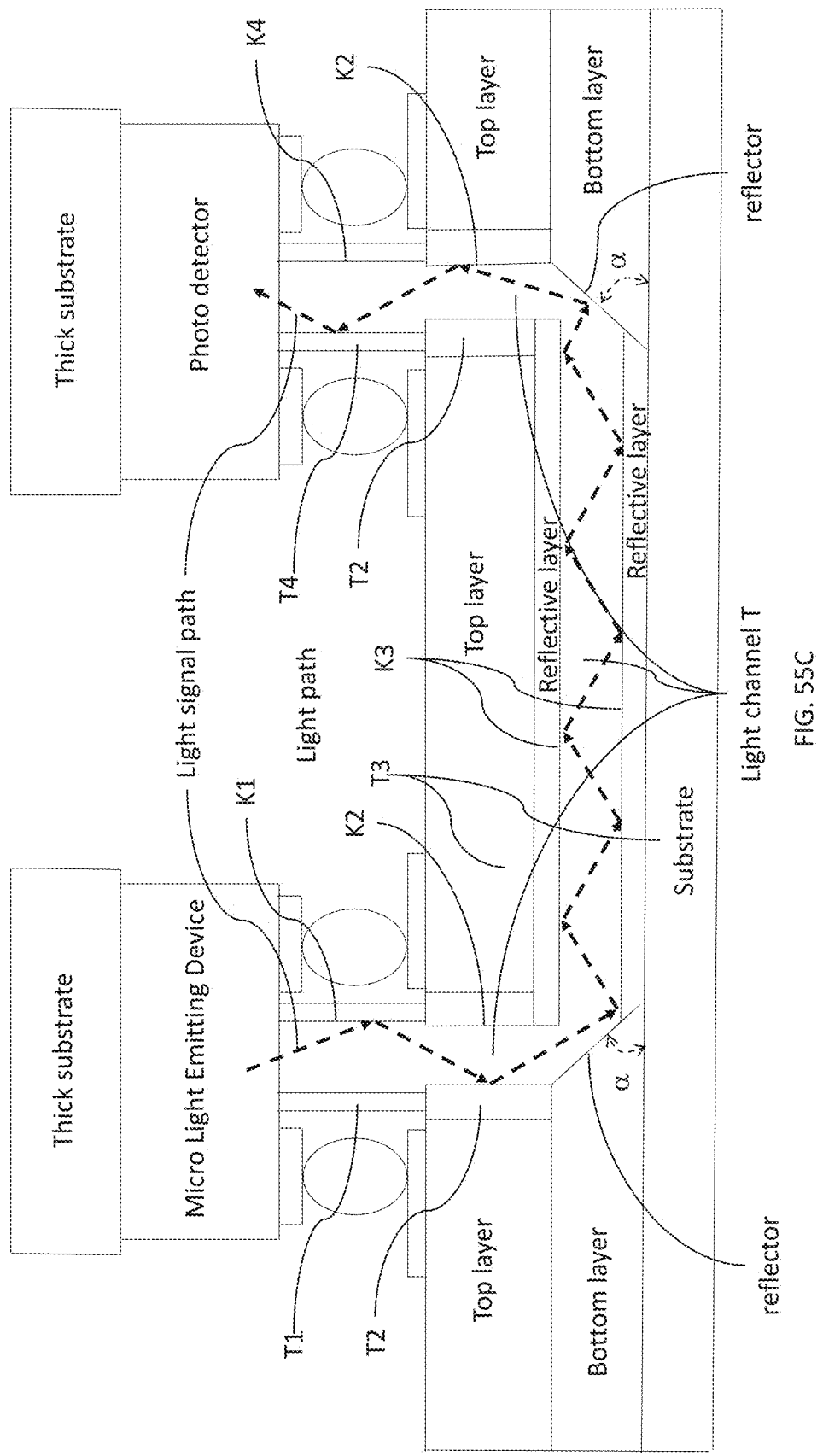
FIG. 55C is another simplified optical signal transitive module by using a light channel T.

In another one embodiment, the waveguide channel could be another light channel T. Now referring to FIG. 53, FIG. 53A, FIG. 54, FIG. 54A, FIG. 55, and FIG. 55A, another one optical communication module could be formed by light channel T. FIG. 55C illustrates another simplified optical signal transitive module by using a light channel T. The light channel T is formed by connecting the light channels including the light channel T1 of the micro light emitting device, the light channel T4 of the photo detector, the light channel T2 of the edge of a top layer, and the light channel T3 which is formed by a reflective layer of a substrate and a reflective layer of a top layer. A bottom layer could be formed on a substrate to provide an angle of a to cover a reflector. A reflective layer could be formed on a portion of a substrate a portion of a top layer. A top layer could be formed on top of the bottom layer. A light signal path from the micro light emitting device to the photo detector could be passed through the closed light channel T completely. A light signal emitted from the micro light emitting device could transmit to the light channel T1, and reflective by an inner wall K1. The light signal could then reflective by the inner wall K2 on the left hand side, and reflective again by the reflector of the bottom layer on left hand side. The light signal could then multiple reflective by the inner wall K3 and reflective again by another reflector layer of the bottom layer on the right hand side. The light signal could reflective by the inner wall K2 on the right hand side and reflective again by the inner wall K4. The light signal after the inner wall K4 could be decoded by a photo detector. The angle α could be greater than 5 degree. The substrate could be a rigid substrate or a flexible substrate. The substrate could be a solid material, a polymer, or a metal layers. The light channel T (T1 to T4) could be formed by deposition metal layers, or electroforming metal layer. The connecting of the light channels could be formed by bonding, sealing. A transparent material could be filled inside the light channel T3. The transparent material could be also selected to fill into all light channels (T1 to T4). Please be noted that the light channel T2 is on the x-axis or y-axis, and the light channel T4 is on the z-axis. By combining the invention concept of the light channel T2 and the light channel T4, a three dimension multiple light channels could be formed to provide multiple light signal transitive or increase the light signal capacity.

Figure 56A:
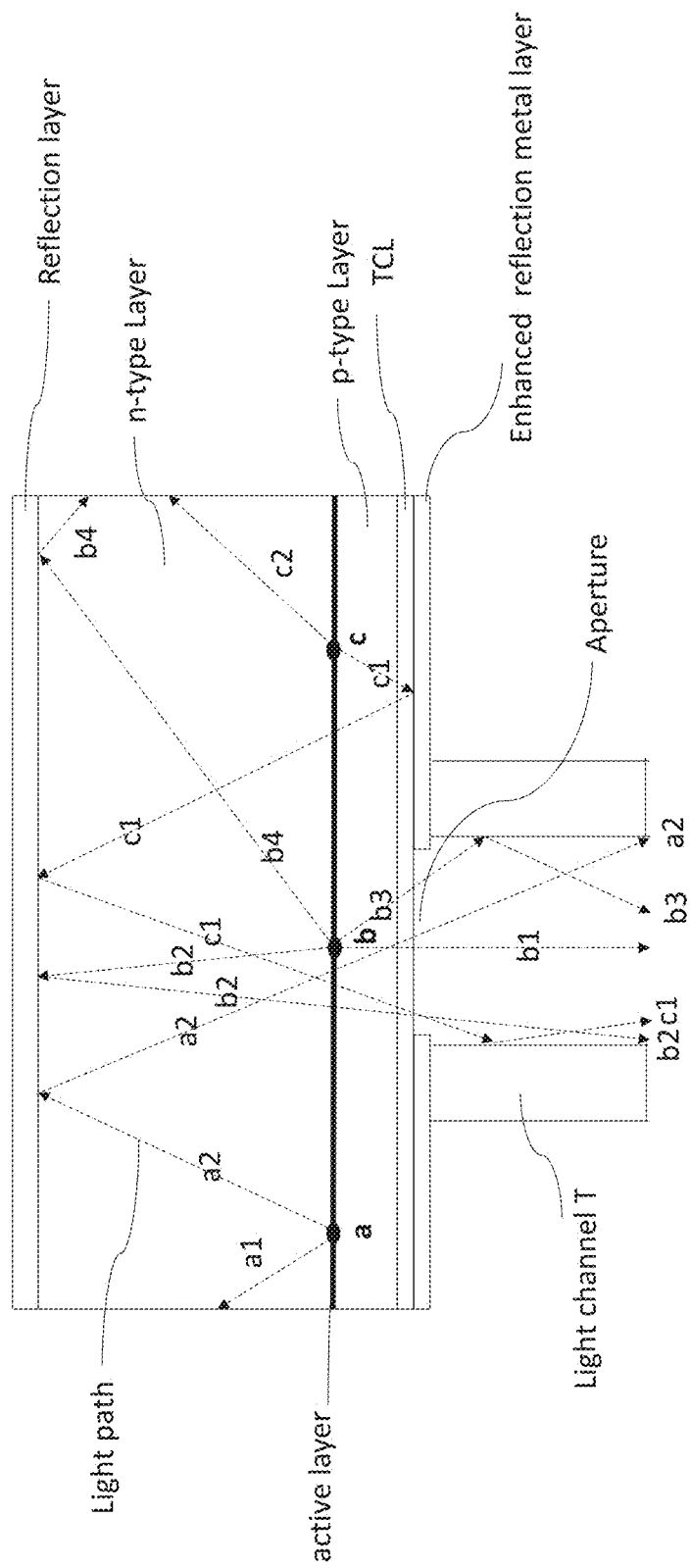
FIG. 56A is an optical scheme diagram of the horizontal current type micro light emitting device structure having a top reflection layer and a bottom enhanced reflection metal layers, and a bottom aperture region.

Now referring to FIG. 7, FIG. 56A illustrates a optical scheme diagram of the horizontal current type micro light emitting device structure having a top reflection layer and a bottom enhanced reflection metal layers, and a bottom aperture P region. The light radiated from the active layer of the micro light emitting device is irradiated to any angle inside the semiconductor region. The output light only could emit out through the aperture P region. For obtaining more light could output the aperture P region, the light generated from the active layer of one micro light emitting device region could be multiple reflected by the top reflection layer and the bottom enhanced reflection metal layers. The multiple reflected light could be collected to be output in the aperture P region. The light could be then confined in the light channel T and could be propagated to the optical interconnection substrate as shown in FIG. 55. For example, irradiation light points a, b, c, at the active layer. The light path of b1, b3 could be direct emitting output through the aperture P to the light channel T. The light paths of a2, b2, and c1 could be one time reflection, or multiple times reflection output through the aperture P to the light channel T. Thus, under the same required output light power condition, the input power of the micro light emitting device could be reduced to save the power consumption, and the thermal control issue of micro light emitting device could be well improved. However, some irradiation light could not be reflected from the edge of the micro light emitting device, for example of the light paths of the a1, b4, and c2. Thus, additional reflection layer forming on the edge of the micro light emitting device could help to collecting more light.

Figure 56B:
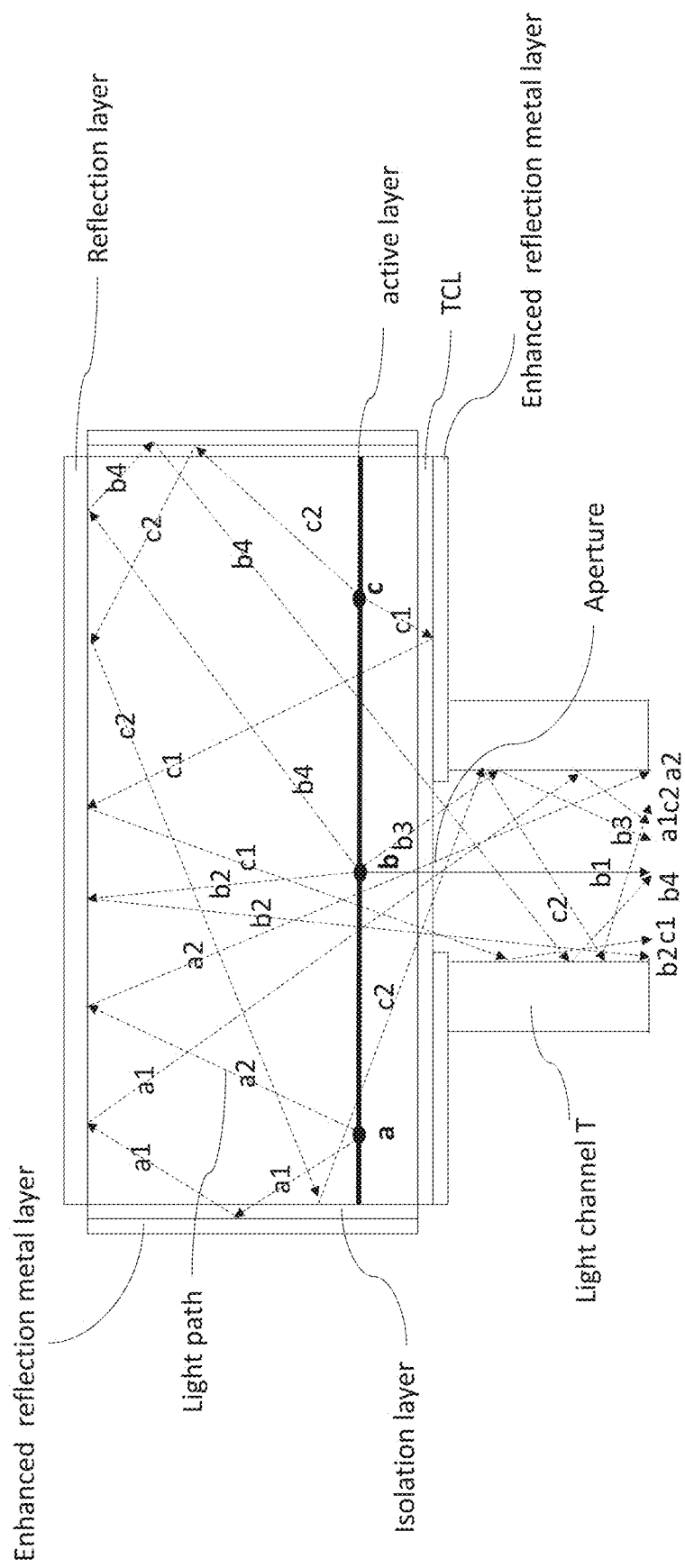
FIG. 56B is an optical scheme diagram of the horizontal current type micro light emitting device structure having a top reflection layer and a bottom enhanced reflection metal layers, a bottom aperture region, and an edge reflection layer.

In another one embodiment, referring to FIG. 12, additional reflection layer could be formed on the edge of the micro light emitting device. FIG. 56B illustrates a optical scheme diagram of the horizontal current type micro light emitting device structure having a top reflection layer and a bottom enhanced reflection metal layers, a bottom aperture P region, and an edge reflection layer. The edge side reflection layer could be such as the enhanced reflection metal layer coated on the isolation layer, or the isolation layer formed by DBR structure. The edge side reflection layers, the top metal reflection layer, and the bottom enhanced reflection metal layer could cover almost completely onto all sides of one single micro light emitting device. The light generated from the active layer of the micro light emitting device is irradiated to any angle inside the semiconductor region. The output light only emit out through the aperture P region. For obtaining more light output the aperture P region, the light generated from the active layer of one micro light emitting device region could be multiple reflected by the top reflection layer, the bottom enhanced reflection metal layers, and the all edge side reflection layers. The multiple reflected light could be collected to be output in the aperture P region. The light could be then confined in the light channel T and could be propagated to the optical interconnection substrate as shown in FIG. 55. For example of the light points of a, b, c, at the active layer of FIG. 56A. The light paths of a1, b4, and c2 could not be collected to the aperture P. FIG. 56B shows the light path of a1, b4, and c2 could be then reflected by the edge coating reflection layer. More light such as a1, b4, and c2 light path could be collected to the light channel T. Thus, under the same required output light power condition, the input power of the micro light emitting device in FIG. 56B structure could be more reduced compared to the input power of the micro light emitting device in FIG. 56A structure. FIG. 56B structure could to save more power consumption, and the thermal control issue of micro light emitting device could be more improved.

Figure 57A:
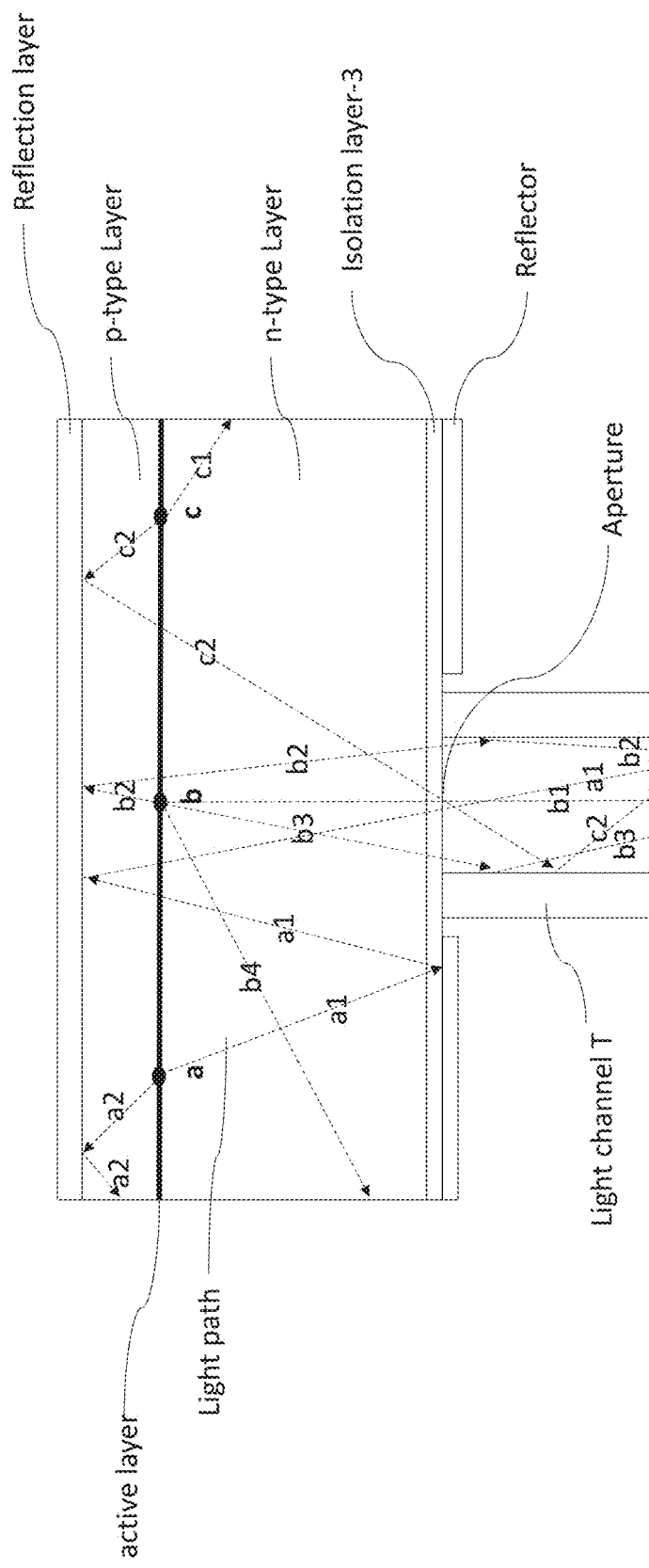
FIG. 57A is an optical scheme diagram of the vertical current type micro light emitting device structure having a top reflection layer and a bottom enhanced reflection metal layers, and a bottom aperture region.
Figure 57B:
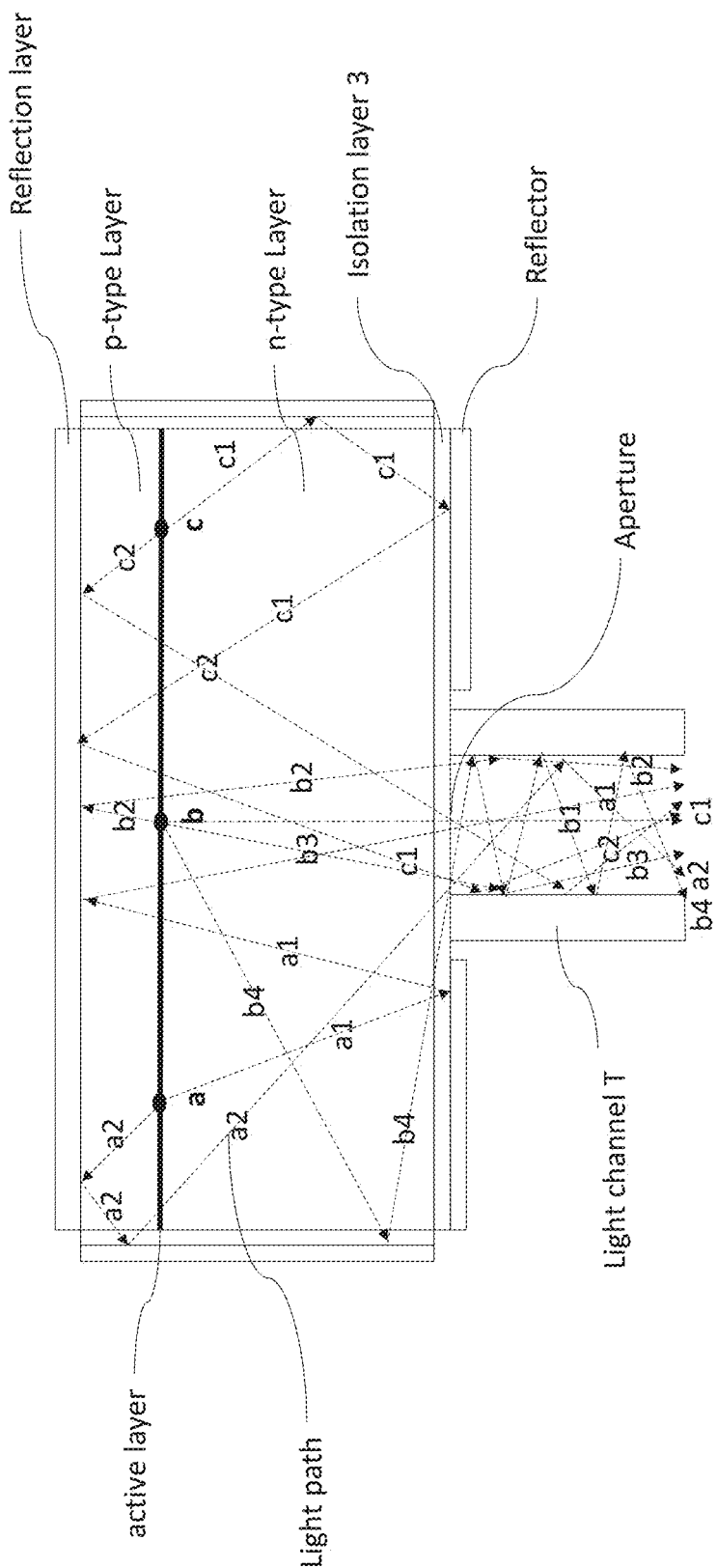
FIG. 57B is an optical scheme diagram of the vertical current type micro LED structure having a top reflection layer, a bottom enhanced reflection metal layers, a bottom aperture region, and an edge reflection layer.

Now referring to FIG. 17 and FIG. 22, FIG. 57A illustrates a optical scheme diagram of the vertical current type micro light emitting device structure having a top reflection layer and a bottom enhanced reflection metal layers, and a bottom aperture P region. Now referring to FIG. 27 and FIG. 32, FIG. 57B illustrates an optical scheme diagram of the vertical current type micro light emitting device structure having a top reflection layer, a bottom enhanced reflection metal layers, a bottom aperture P region, and an edge reflection layer. The edge reflection layer could be such as the enhanced reflection metal layer coated on the isolation layer, or the isolation layer formed by DBR structure or a resonant cavity structure. The edge side reflection layers, the top metal reflection layer, and the bottom enhanced reflection metal layer could cover almost completely onto all sides of one single micro light emitting device. The light generated from the active layer of the micro light emitting device is irradiated to any angle inside the semiconductor region. The output light only emit out through the aperture P region. For obtaining more light output to the aperture P region, the light generated from the active layer of one micro light emitting device region could be multiple reflected by the top reflection layer, the bottom enhanced reflection metal layers, and the edge sides reflection layers. The multiple reflected light could be collected to output in the aperture P region. The light will be then confined to the light channel T and could be propagated to the optical interconnection substrate. For example, FIG. 53A has the light points of a, b, c at active layer. The light paths of a2, b4, and c1 could not be collected to the aperture P. FIG. 53B shows the light paths of a2, b4, and c1 could be then reflected by the edge coating reflection layer. More light such as a2, b4, and c1 light paths could be collected to the light channel T. Thus, under the same required output light power condition, the input power of the micro light emitting device in FIG. 57B structure could be more reduced compared to the input power of the micro light emitting device in FIG. 57A structure. FIG. 57B structure could save more power consumption, and the thermal control issue of micro light emitting device could be more improved.

Now referring to FIG. 56A, FIG. 56B, FIG. 57A, and FIG. 57B, the optical signal transitive device of one micro light emitting device structure could consist a top reflection layer and a bottom reflection layer, an aperture P and a light channel T on the p-type layer (as shown in FIG. 56A) or on the n-type layer (as shown in FIG. 57A). The optical signal transitive device of one micro light emitting device structure could also consist a top reflection layer, a bottom reflection layer, and an edge reflection layer, an aperture P and a light channel T on the p-type layer (as shown in FIG. 56B) or on the n-type layer (as shown in FIG. 57B).

Figure 58:
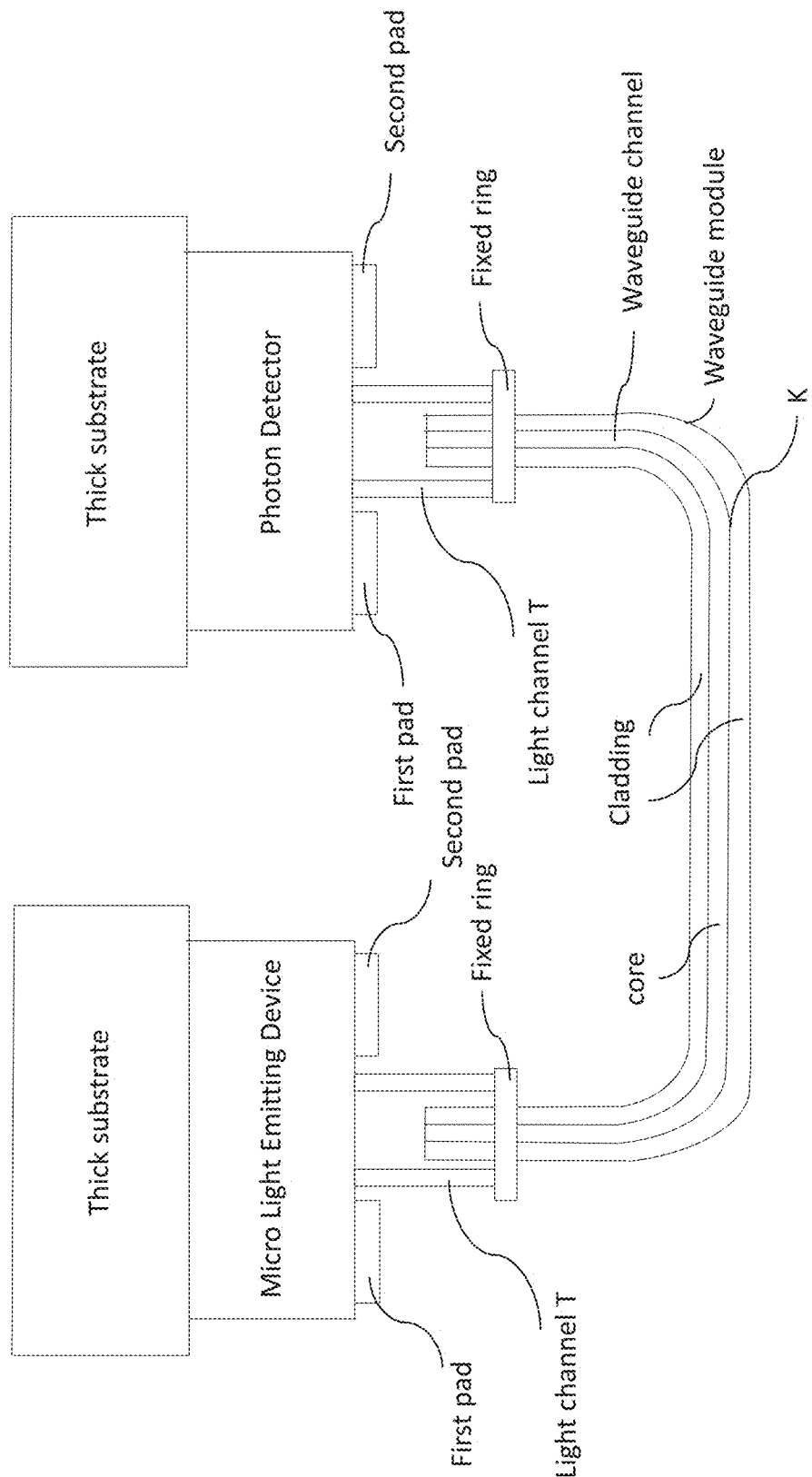
FIG. 58 is a micro light emitting device and a photo detector could be formed to a light signal transitive module.

In another one embedment, referring to FIG. 55A, and FIG. 55B structures, FIG. 58 is a micro light emitting device and a photo detector could be formed to a light signal transitive module. A two end points of waveguide module consists a cladding layer which is covered on a core layer. The refractive index of the core layer is larger than that of the cladding layer. A light signal in the core layer could be total internal reflection (TIR) by the cladding layer due to the difference of the refractive index. The core layer could be called a waveguide channel. One end point of the waveguide module could be formed inside the light channel T of the micro light emitting device. Another one end point of the waveguide module could be formed inside the light channel T of the photo detector. A fixed ring could be pre-made on the two points spacing from the each end points. Thus, each end point of waveguide module could be plugged into a light channel T and auto stop by the fixed ring. The fixed ring could be fixed to the light channel T by an adhesive material. In another aspect, the two end points of waveguide module could be first plugged into the light channel T. Additional adhesive material could be formed around the light channel T to fix the waveguide module. The plug in of the waveguide module inside the light channel T could simplify the connection of the waveguide module to the light source (the micro light emitting device) and simplify the connection of the waveguide module to the photo detector. The consideration of the alignment of light beam alignment, and the light beam collimation factor (such as NA) could be ignored. The waveguide module could be selected from an optical fiber. The waveguide module could be also selected from an optical interconnection substrate having a waveguide channel. The waveguide module could be also selected from or any channel having a waveguide TIR structure to guide an electromagnetic wave or optical wave. In another aspect, referring to FIG. 55C, the waveguide module could be replaced by another light channel T. Thus, the cladding layer of the waveguide module is satisfied to a light channel has a reflective material coated on an inner wall K. The core layer of the waveguide module is satisfied to an air gap or a transparent material. The micro light emitting device could be a LED, VCSEL, light emitting transistor, OEIC, or RCLED. The photo detector could be Si based semiconductor, III-V compound semiconductor, or any suitable compound semiconductor.

Figure 59:
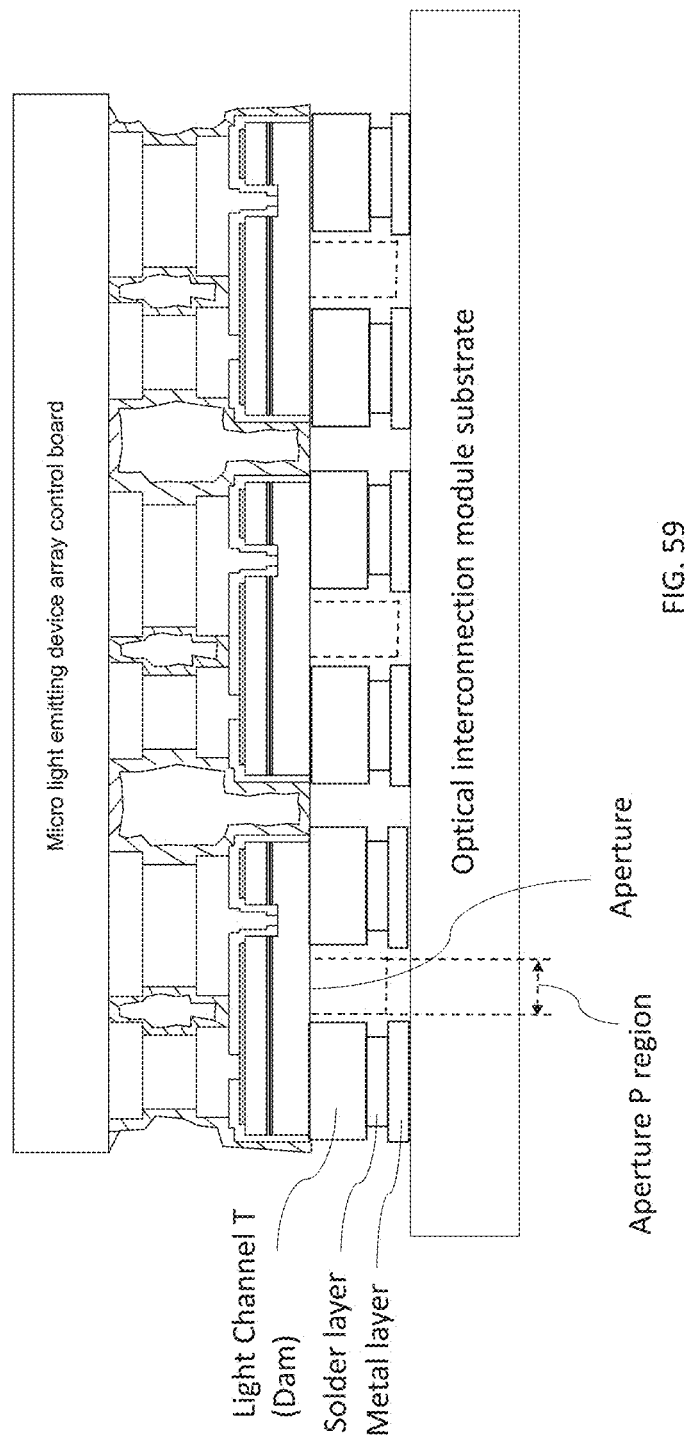
FIG. 59 is the micro light emitting device could be formed on a backplane having a driver controller.

In another one embodiment, the micro light emitting device array could be formed on a backplane having integrated circuit control function. FIG. 59 illustrates the micro light emitting device could be formed on a backplane having a driver controller. The light emitted from the n-type layer of the micro light emitting device could be designed to be an aperture P on the n-type layer. A dam as a light channel T to connect the micro light emitting device to the metal layers of the optical interconnection module substrate. The aperture P could be formed on the first type semiconductor layer. The light channel T could be formed around the aperture P and focus the light and guide the light to optical interconnection module for optical signal communication purpose. Please note that the inner wall of the dam could be selected to form as a reflective material to reflect the light.

Thus the disclosure describes the method, and structure for fabricating semiconductor light emitting array units as the sub-pixel light engine. The semiconductor light emitting array unit could be separated by a polymer. While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

While the present invention has been described by way of examples and in terms of preferred embodiments, it is to be understood that the present invention is not limited thereto. To the contrary, it is intended to cover various modifications. Therefore, the scope of the appended claims should be accorded the broadest interpretation so as to encompass all such modifications.

What is claimed is:

1. An optical semiconductor structure comprising:
 a first type semiconductor layer;
 a second type semiconductor layer;
 an active layer interposed between a first surface of the first type semiconductor layer and a first surface of the second type semiconductor layer;
 a first reflector formed on a second surface of the first type semiconductor layer, wherein the first reflector having an aperture located on the second surface of the first type semiconductor layer;
 a second reflector formed on a second surface of the second type semiconductor layer;

a light channel tube having light reflecting inner sidewalls aligned and connected to the aperture, protruding out from a surface of the first reflector;

an optically transparent material placed in the light channel tube, wherein the optically transparent material having a high refractive index;

the light channel tube having outer sidewalls; and a packaging material covering and contacting the outer sidewalls of the light channel tube and the surface of the first reflector, wherein the packaging material is different from the optically transparent material having the high refractive index, or an air gap region, wherein the outer sidewalls of the light channel tube and the surface of the first reflector are exposed to the air gap region.

2. The optical semiconductor structure according to claim 1, further comprising a third reflector covering sidewalls of the first type semiconductor layer, the active layer and the second type semiconductor layer.

3. The optical semiconductor structure according to claim 1, wherein a thermal conductivity substrate is coupled to the second type semiconductor layer.

4. The optical semiconductor structure according to claim 1, further comprising:
a first pad electrically connected to the first type semiconductor layer;
a second pad electrically connected to the second type semiconductor layer;
a first bump disposed on the first pad; and
a second bump disposed on the second pad.

5. The optical semiconductor structure according to claim 1, wherein the optical semiconductor structure is a vertical cavity surface emitting laser structure; both a portion of the first type semiconductor layer and a portion of the second type semiconductor layer have a current confinement region and an optical confinement region; and a distributed Bragg reflector (DBR) structure in the first type semiconductor layer and the second type semiconductor layer provides a reflectivity properties to emit a laser.

6. The optical semiconductor structure according to claim 1, wherein the inner light reflecting sidewalls of the light channel tube coated with a reflecting metal selected from at least one of Cr, Al, Ti, Ag, Ni, Au, Cu, Sn, In and a combination thereof.

7. The optical semiconductor structure according to claim 1, wherein the optically transparent light channel guide guiding the light entering the aperture opening to the opposite side of the aperture opening.

8. The optical semiconductor structure according to claim 1, wherein the optically transparent light channel guide comprised of transparent high refractive index material selected from at least one of transparent sol-gel, transparent polyimide, transparent silicone, transparent PMMA, transparent epoxy, transparent glue, transparent gel and a combination thereof.

9. The optical semiconductor structure according to claim 1, wherein the light channel tube comprising one or more connecting light channel tubes guiding the emitting light to the desired direction.

10. The optical semiconductor structure according to claim 1, wherein the packaging material is a low refractive index material selected from at least one of polyimide, parylene, epoxy, silicone, PMMA, polydimethylsiloxane, gel, glue, white glue, plastic, ceramic, adhesion promotor, dyeing silicone, dyeing epoxy, dyeing gel, dyeing glue, dyeing photoresist material, mixing the polymer with particles and a combination thereof.

11. An optical semiconductor light signal processing structure comprising:
a first type semiconductor layer;
a second type semiconductor layer;
an active layer interposed between a first surface of the first type semiconductor layer and a first surface of the second type semiconductor layer;
a first reflector formed on a second surface of the first type semiconductor layer,
wherein the first reflector having an aperture located on the second surface of the first type semiconductor layer;
a second reflector formed on a second surface of the second type semiconductor layer;
a first light channel tube having light reflecting inner sidewalls aligned and connected to the aperture, protruding out from a surface of the first reflector;
a second light channel tube having a light reflecting inner sidewalls, wherein a light signal path inside the first light channel tube are is connected to a light signal path inside the second light channel tube;
the first and second light channel tube having outer sidewalls;
an optically transparent light channel guide containing a transparent material inside the first and second light channel tube; and
a packaging material covering and contacting the outer sidewalls of the first and second light channel tube and the surface of the first reflector, wherein the packaging material is different from the transparent material having the high refractive index, or an air gap region, wherein the outer sidewalls of the first and second light channel tube and the surface of the first reflector are exposed to the air gap region.

12. The optical semiconductor light signal processing structure according to claim 11, wherein the emitting light from the active layer entering the aperture opening side of the first light channel tube and guided to the opposite side of the aperture opening of the first light channel tube connecting to one or more light channel tubes guiding the emitting light to a desired direction.

13. The optical semiconductor light signal processing structure according to claim 11, wherein the inner light reflecting sidewalls of the light channel tube is a reflecting metal layer and selected from at least one of Cr, Al, Ti, Ag, Ni, Au, Cu, Sn, In and a combination thereof.

14. The optical semiconductor light signal processing structure according to claim 11, wherein an optical transparent light channel guide comprised of transparent high refractive index material inside the light channel tube and the transparent high refractive index material is selected from at least one of transparent sol-gel, transparent polyimide, transparent silicone, transparent PMMA, transparent epoxy, transparent glue, transparent gel and a combination thereof.

15. The optical semiconductor light signal processing structure according to claim 11, wherein a third reflector covering the sidewalls of the first type semiconductor layer, the active layer and the second type semiconductor layer.

16. The optical semiconductor light signal processing structure according to claim 11, wherein a thermal conductivity substrate coupled to the second type semiconductor layer.

17. The optical semiconductor light signal processing structure according to claim 11, further comprising:
a first pad electrically connected to the first type semiconductor layer;

a second pad electrically connected to the second type semiconductor layer;

a first bump disposed on the first pad; and a second bump disposed on the second pad.

18. The optical semiconductor light signal processing structure according to claim 11, wherein the optical semiconductor light signal processing structure is a vertical cavity surface emitting laser structure; a portion of the first type semiconductor layer and a portion of the second type semiconductor layer have a current confinement region and an optical confinement region; and a distributed Bragg reflector (DBR) structure in the first type semiconductor layer and the second type semiconductor layer provides a reflectivity properties to emit a laser.

19. The optical semiconductor light signal processing structure according to claim 11, wherein the light signal is delivered from a transmitting device to a receiving device by the light channel tubes.

20. The optical semiconductor light signal processing structure according to claim 11, wherein the packaging material is a low refractive index material selected from at least one of polyimide, parylene, epoxy, silicone, PMMA, polydimethylsiloxane, gel, glue, white glue, plastic, ceramic, adhesion promotor, dyeing silicone, dyeing epoxy, dyeing gel, dyeing glue, dyeing photoresist material, mixing the polymer with particles and a combination thereof.

* * * * *